(12) United States Patent
Ito et al.

(10) Patent No.: US 6,459,259 B1
(45) Date of Patent: *Oct. 1, 2002

(54) TESTER FOR SEMICONDUCTOR DEVICES AND TEST TRAY USED FOR THE SAME

(75) Inventors: Akihiko Ito, Hanyu (JP); Yoshihito Kobayashi, Gyoda (JP); Yoshiyuki Masuo, Gyoda (JP); Tsuyoshi Yamashita, Gunma (JP)

(73) Assignee: Advantest Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/254,084

(22) PCT Filed: Jul. 2, 1998

(86) PCT No.: PCT/JP98/02979
§ 371 (c)(1),
(2), (4) Date: Feb. 26, 1999

(87) PCT Pub. No.: WO99/01776
PCT Pub. Date: Jan. 14, 1999

(30) Foreign Application Priority Data

Jul. 2, 1997 (JP) .............................. 9-176762

(51) Int. Cl.[7] .............................................. B65G 43/00
(52) U.S. Cl. .................................................. 324/158.1
(58) Field of Search .......................... 324/158.1, 760, 324/765, 763; 209/573, 539; 198/341.01

(56) References Cited

U.S. PATENT DOCUMENTS 5,313,156 A   5/1994  Klug et al. ................. 324/158
5,772,387 A   6/1998  Nakamura et al. .......... 414/416
6,104,183 A * 8/2000  Kobayashi et al. ...... 324/158.1

FOREIGN PATENT DOCUMENTS

| DE | 19523969 | 1/1996 |
|----|----------|--------|
| EP | 0166409  | 5/1991 |
| JP | 6-27192  | 2/1994 |
| JP | 7-218581 | 8/1995 |
| JP | 9-152466 | 6/1997 |

* cited by examiner

Primary Examiner—N. Le
Assistant Examiner—James Kerveros
(74) Attorney, Agent, or Firm—Morrison & Foerster LLP

(57) ABSTRACT

An IC tester which is capable of reducing the time required before completion of testing on all of ICs to be tested is provided. The depth (length in the Y-axis direction) of the constant temperature chamber 4 and the exit chamber 5 is expanded by a dimension corresponding approximately to one transverse width (length of the minor edge) of the rectangular test tray 3, and two generally parallel test tray transport paths or alternatively a widened test tray transport path broad enough to transport two test trays simultaneously with the two test trays juxtaposed in a direction transverse to the widened test tray transport path are provided in the section of test tray transport path extending from the soak chamber 41 in the constant temperature chamber 4 through the testing section 42 in the constant temperature chamber 4 to the exit chamber 5 so that two test trays may be simultaneously transported along the two test tray transport paths or the widened test tray transport path.

86 Claims, 14 Drawing Sheets

3

| 1 1 1 1 1 1 1 1 1 1 1 1 1 1 1 |
| 1 1 1 1 2 1 1 1 1 1 1 2 1 1 |
| 1 1 1 1 1 1 1 1 1 3 1 1 1 1 |
| 1 1 1 1 1 1 1 1 1 1 1 1 1 1 |

| 1 1 1 1 1 1 1 1 1 1 1 1 1 1 |
| 1 1 1 1 2 1 1 1 1 1 1 2 1 1 |
| 1 1 1 1 1 1 1 1 1 3 1 1 1 1 |
| 1 1 1 1 1 1 1 1 1 1 1 1 1 1 |

3

| 1 1 1 1 1 1 1 1 1 1 1 1 1 1 |
| 1 1 1 1 2 1 1 1 1 1 1 2 1 1 |
| 1 1 1 1 1 1 1 1 3 1 1 1 1 1 |
| 1 1 1 1 1 1 1 1 1 1 1 1 1 1 |

FIG. 3(b)

TESTER FOR SEMICONDUCTOR DEVICES AND TEST TRAY USED FOR THE SAME

TECHNICAL FIELD

The present invention relates to a semiconductor device testing apparatus suitable for testing semiconductor integrated circuit elements which are typical of semiconductor devices, and more particularly to a semiconductor device testing apparatus of the type in which semiconductor devices are transported to a testing section or test section where they are tested for their electrical characteristics, followed by being carried out of the test section and then being sorted out into conforming articles and non-conforming articles on the basis of the test results, and to a test tray for use in the IC tester in which the tray is moved in a circulating manner along a predetermined path of transport

BACKGROUND ART

Many semiconductor device testing apparatuses (commonly called IC tester) for measuring the electrical characteristics of semiconductor devices to be tested (commonly called DUT (device under test)) by applying a signal of a predetermined test pattern to the devices have a semiconductor transporting and handling (processing) apparatus (commonly called handler) integrally incorporated therein for transporting semiconductor devices to a testing section where they are brought into electrical contact with device sockets on the tester head of the testing apparatus (a component of the testing apparatus for supplying and receiving various electrical signals for testing purposes), followed by carrying the tested semiconductor devices out of the testing section and sorting them out into conforming and non-conforming articles on the basis of the test results. The semiconductor device testing apparatus having integrated therein the handler of the type described above is herein termed simply "IC tester". In the following disclosure the present invention will be described by taking semiconductor integrated circuit elements (which will be referred to as IC hereinafter) which are typical of semiconductor devices by example for the convenience of explanation.

First, the general construction of one example of the prior art semiconductor device testing apparatus (which will be referred to as IC tester hereinafter) will be described with reference to FIG. 11.

FIG. 11 is a plan view illustrating the general construction of the IC tester with a plurality of test trays 3 within a soak chamber 41 and an exit chamber 5 shown in a perspective view. In addition to a constant temperature chamber 4 including the soak chamber 41 and a testing section 42, and the exit chamber 5 (also known as heat-removal/cold-removal chamber), the illustrated IC tester comprises a storage section 11 for storing universal trays (also known as customer trays) 1 loaded with ICs to be tested and universal trays 1 loaded with ICs already tested and sorted, a loader section 7 where ICs being tested are transferred from the universal trays (customer trays) 1 and reloaded onto a test tray 3, and an unloader section 8 where the tested ICs which have been carried on the test tray 3 out through the exit chamber 5 subsequently to undergoing a test in the testing section 42 of the constant temperature chamber 4 are transferred from the test tray 3 to the universal tray 1 to be reloaded on the latter. The unloader section 8 is generally configured to sort tested ICs based on the data of the test results and load them on the corresponding universal trays.

The soak chamber 41 of the constant temperature chamber 4 is designed for imposing temperature stresses of either a predetermined high or low temperature on ICs under test loaded on a test tray 3 in the loader section 7 while the testing section 42 is designed for executing electrical tests of the ICs under the predetermined temperature stress imposed in the soak chamber 41. In order to maintain the ICs loaded with temperature stresses of either a predetermined high or low temperature at that temperature during the test, the soak chamber 41 and testing section 42 are both contained in the constant temperature chamber 4 capable of maintaining the interior atmosphere at a predetermined temperature.

The illustrated IC tester is configured such that the soak chamber 41 and testing section 42 of the constant temperature chamber 4 and the exit chamber 5 are arranged in the order named from left to right as viewed in the drawing (referred to as X-axis direction herein) while the loader section 7 and unloader section 8 are located in front of the constant temperature chamber 4 and the exit chamber 5 (downward in the upward-downward direction as viewed in the drawing (referred to as Y-axis direction herein) which is perpendicular to the X-axis direction). As is apparent from FIG. 11, the loader section 7 is located in front of the soak chamber 41 of the constant temperature chamber 4 while the unloader section 8 is located in front of the testing section 42 and the exit chamber 5.

The test tray 3 is moved in a circulating manner from and back to the loader section 7 sequentially through the soak chamber 41 and the testing section 42 in the constant temperature chamber 4, the exit chamber 5, and the unloader section 8. In this path of circulating travel, there are disposed a predetermined number of test trays 3 which are successively moved in the directions as indicated by thick cross-hatched arrows in FIG. 11 by a test tray transport, not shown.

A test tray 3, loaded with ICs being tested in the loader section 7, is conveyed from the loader section to the constant temperature chamber 4, and then delivered to the soak chamber 41 through an inlet port formed in the front wall of the constant temperature chamber 4. The soak chamber 41 is equipped with a vertical transport mechanism which is configured to support a plurality of (say, 5) test trays 3 in the form of a stack with predetermined spacings between successive trays. In the illustrated example, a test tray newly received from the loader section 7 is supported at the top of the stack while the lowermost test tray is delivered to the testing section 42 which on the left-hand side (upstream side) in the X-axis direction, adjoins and communicates with the lower portion of the soak chamber 41. It is thus to be appreciated that test trays 3 are delivered out in the direction perpendicular to that in which they have been introduced.

ICs being tested are loaded with either a predetermined high or low temperature stress as the associated test tray 3 is moved sequentially from the top to the bottom of the stack by vertically (which is referred to as Z-axis direction) downward movement of the vertical transport mechanism and during a waiting period until the testing section 42 is emptied. In the testing section 42 there is located a tester head, not shown. The test tray 3 which has been carried one by one out of the constant temperature chamber 4 is placed onto the tester head where a predetermined number of ICs out of the ICs under test loaded on the test tray are brought into electrical contact with device sockets (not shown) mounted on the tester head. Upon completion of the test on all of the ICs placed on one test tray through the tester head, the test tray 3 is conveyed to the right side (downstream) in the X-axis direction to the exit chamber 5 where the tested ICs are relieved of heat or cold.

Like the soak chamber 41 as described above, the exit chamber 5 is also equipped with a vertical transport mechanism adapted to support a plurality of (say, five) test trays 3 stacked one on another with predetermined spacings therebetween. In the illustrated example, a test tray newly received from the testing section 42 is supported at the bottom of the stack while the uppermost test tray is discharged to the unloader section 8. The tested ICs are relieved of heat or cold to be restored to the outside temperature (room temperature) as the associated test tray 3 is moved sequentially from the bottom to the top of the stack by vertically upward movement of the vertical transport mechanism.

Since the IC test is typically conducted on ICs having a desired temperature stress in a wide range of temperatures from −55° C. to +125° C. imposed thereon in the soak chamber 41, the exit chamber 5 cools the ICs with forced air down to the room temperature if the ICs have had a high temperature of, say, about 120° C. applied thereto in the soak chamber 41. If ICs have had a low temperature of, say, about −30° C. applied thereto in the soak chamber 41, the exit chamber 5 heats them with heated air or a heater up to a temperature at which no condensation occurs. In addition, since a test tray 3 on which ICs to be tested are loaded is exposed to such wide range of temperatures, there is usually used the test tray 3 formed of a material capable of withstanding a high temperature such as 125° C. and a low temperature such as −55° C. However, the are many cases when the IC test is conducted on ICs having the normal temperature or room temperature, and in such cases the test tray 3 need not be formed of a material cable of withstanding such high/low temperatures.

After the heat removal or cold removal process, the test tray 3 is conveyed in the direction (facing on the front of the exit chamber 5) perpendicular to that in which it has been introduced from the testing section 42 prior to being discharged from the exit chamber 5 to the unloader section 8.

The unloader section 8 is configured to sort the tested ICs carried on the test tray 3 by categories based on the data of the test results and transfer them onto the corresponding universal trays. In this example, the unloader section 8 provides for stopping the test tray 3 at two positions A and B. The ICs on the test trays 3 stopped at the first position A and the second position B are sorted out based on the data of the test results and transferred onto and stored in the universal trays of the corresponding categories at rest at the universal tray set positions (stop positions) 12, four universal trays 1a, 1b, 1c and 1d in the example illustrated.

The test tray 3 emptied in the unloader section 8 is delivered back to the loader section 7 where it is again loaded with ICs being tested from the universal tray 1 to repeat the same steps of operation.

FIG. 12 shows the construction of one example of the test tray 3. The test tray 3 comprises a rectangular frame 30 having a plurality of equally spaced apart parallel cleats 31 between the opposed side frame members 30a and 30b of the frame, each of the cleats 31 having a plurality of equally spaced apart mounting lugs 36 protruding therefrom on both sides thereof and each of the side frame members 30a, 30b opposing the adjacent cleats having similar mounting lugs 36 protruding therefrom. The mounting lugs 36 protruding from the opposed sides of each of the cleats 31 are arranged such that each of the mounting lugs 36 protruding from one side of the cleat 31 is positioned intermediate two adjacent mounting lugs 36 protruding from the opposite side of the cleat. Similarly, each of the mounting lugs 36 protruding from each of the side frame members 30a and 30b is positioned intermediate two adjacent mounting lugs 36 protruding from the opposed cleat. Formed between each pair of opposed cleats 31 and between each of the side frame members 30a and 30b and the opposed cleats are spaces for accommodating a multiplicity of IC carriers 34 in juxtaposition. More specifically, each IC carrier 34 is accommodated in one of an array of rectangular carrier compartments 37 defined in each of said spaces, each compartment 37 including two staggered, obliquely opposed mounting lugs 36 located at the diagonally opposed corners of the compartment. In the illustrated example wherein each cleat 31 has sixteen mounting lugs 36 on either side thereof, there are sixteen carrier compartments 37 formed in each of said spaces, in which sixteen IC carriers 34 are mounted. Since there are four of the spaces, 16×4, that is, 64 IC carriers in total can be mounted in one test tray 3. Each IC carrier 34 is affixed to two mounting lugs 36 by fasteners 35.

Each of IC carriers 34 is of identical shape and size in its outer contour and has an IC pocket 38 in the center for accommodating an IC device therein. The shape of the IC pocket 38 of each IC carrier 34 is determined depending on that of the IC device to be accommodated therein. In the illustrated example the IC pocket 38 is in the shape of a generally square recess. The outer dimensions of the IC carrier 34 are sized so as to be loosely fitted in the space defined between the opposed mounting lugs 36 in the carrier compartment 37. The IC carrier 34 has flanges at its opposed ends adapted to rest on the corresponding mounting lugs 36, these flanges being formed therethrough with mounting holes 39 for receiving fasteners 35 therethrough and holes 40 for passing locating pins therethrough.

Since the test tray 3 is exposed to a wide range of temperatures from −55° C. to +125° C. in the constant temperature chamber 4, it is required that the test tray 3 be constructed of a material capable of withstanding a high temperature of, say, about 120° C. and a low temperature of, say, about −30° C. In this example, the rectangular frame 30, the cleats 31 and the mounting lugs 36 are constructed of aluminum alloy while the IC carrier 34 is made of insulating synthetic resin.

In this example, as shown in FIG. 11, the IC transport for transferring ICs from the universal tray 1 to the test tray 3 in the loader section 7 may be in the form of X-Y-axis direction transport 71 comprising a pair of opposed parallel rails 71A, 71B mounted over the loader section 7 at the ends thereof opposed in the X-axis direction and extending in the Y-axis direction, a movable arm 71C spanning and mounted at opposite ends on the pair of rails 71A, 71B for movement in the Y-axis direction, and a movable head, not shown (which is known in the art concerned as pick-and-place head) mounted on the movable arm 71C for movement therealong longitudinally of the arm, that is, in the X-axis direction. With this construction, the movable head is reciprocally movable in the Y-axis direction between the test tray 3 and the universal tray 1 as well as in the X-axis direction along the movable arm 71C.

The movable head has an IC pick-up pad (IC grasping member) vertically movably mounted on its bottom surface. The movement of the movable head in the X-Y-axis directions and the downward movement of the pick-up pad bring the pick-up pad into abutment with the ICs placed on the universal tray 1 at rest at the universal tray set position 12 to attract and grasp them by vacuum suction, for instance for transfer from the universal tray 1 to the test tray 3. The movable head may be provided with a plurality of, say, eight pick-up pads so that eight ICs at a time may be transported from the universal tray 1 to the test tray 3.

It is to be noted here that a position corrector 2 for correcting the orientation or position of an IC called "preciser" is located between the universal tray set position 12 and the stop position for the test tray 3. The IC position corrector or preciser 2 includes relatively deep recesses into which ICs as being attracted against the pick-up pads are released to fall down prior to being transferred to the test tray 3. The recesses are each bounded by vertical tapered side walls which prescribe for the depth to which the ICs drop into the recesses by virtue of the tapering. Once eight ICs have been positioned relative to each other by the position corrector 2, those accurately positioned ICs are again attracted against the pick-up pads and transferred to the test tray 3. The universal tray 1 is provided with recesses for holding ICs which are oversized as compared to the size of ICs, resulting in wide variations in positions of ICs stored in the universal tray 1. Consequently, if the ICs as such were grasped by the pick-up pads and transferred directly to the test tray 3, there might be some of them which could not be successfully deposited into the IC storage recesses in the test tray 3. This is the reason for requiring the position corrector 2, as described above which acts to array ICs as accurately as the array of the IC storage recesses in the test tray 3.

The unloader section 8 is equipped with an X-Y transport 81 which is identical in construction to the X-Y transport 71 provided for the loader section 7. The X-Y transport 81 is mounted spanning the first position A and the second position B and performs to transship the tested ICs from the test tray 3 delivered out to the unloader section 8 onto the corresponding universal tray 1. The X-Y transport 81 comprises a pair of spaced parallel rails 81A, 81B mounted over the unloader section 8 at the ends thereof opposed in the X-axis direction and extending in the Y-axis direction, a movable arm 8IC spanning and mounted at opposite ends on the pair of rails 81A, 81B for movement in the Y-axis direction, and a movable head, not shown mounted on the movable arm 7IC for movement therealong longitudinally of the arm, that is, in the X-axis direction.

The sorting operation in the unloader section 8 will now be described. In the IC tester shown in FIG. 11, the operation of sorting and transshipping tested ICs is performed with respect to only universal trays arranged adjacent to each of the first and second positions A and B. Specifically, arranged at the first position A are universal trays 1a and 1b. It is assumed that classification categories 1 and 2 are assigned to the universal trays 1a and 1b, respectively. While the test tray 3 is stopped at the first position A, only the tested ICs belonging to the categories 1 and 2 are picked up from the test tray and transferred onto the corresponding universal trays 1a and 1b, respectively. Once the test tray 3 stopping at the first position A has been depleted of the ICs belonging to the categories 1 and 2, the test tray is moved to the second position B.

Arranged at and in opposing relation to the second position B are universal trays 1c and 1d. Assuming that classification categories 3 and 4 are allotted to these universal trays 1c and 1d, respectively, the tested ICs belonging to the categories 3 and 4 are picked up from the test tray 3 held at the second position B, and transferred onto the corresponding universal trays 1c and 1d, respectively. While the sorting is being carried out at the second position B, the next test tray 3 is delivered from the exit chamber 5 to the unloader section 8 and is stopped at the first position A in preparation for the sorting operation.

The distance for the X-Y transport 81 required to travel for the sorting operation can be reduced by the arrangement described above in which the X-Y transport 81 is shared by the two unloader sections (represented by the first and second positions A and B) and in which the sorting operations are limited to the universal trays 1a, 1b and universal trays 1c, 1d closest to the test tray stop positions A and B, respectively. It is thus to be understood that this construction permits the overall processing time required for the sorting to be shortened, despite the fact that the single X-Y transport 81 is used for the sorting operation.

It should be noted here that the number of universal trays 1 that can be installed at the universal tray set positions 12 in the unloader section 8 is limited to four by the space available in this example. Hence, the number of categories into which ICs can be sorted in real time operation is limited to four categories 1 to 4 as noted above. While four categories would generally be sufficient to cover three categories for subclassifying "conforming articles" into high, medium and low response speed elements in addition to one category allotted to "non-conforming article," in some instances there may be some among the tested ICs which do not belong to any of these categories. Should there be found any tested ICs which should be classified into a category other than the four categories, a universal tray 1 assigned to the additional category should be taken from the IC storage section 11 and be transported into the unloader section 8 to store the ICs of the additional category. In doing that, it would be needed to transport any one of the universal trays positioned in the unloader section 8 to the IC storage section 11 for storage therein.

If the replacement of the universal trays is effected in the course of the sorting operation, the latter operation would have to be interrupted during the replacement. For this reason, in this example a buffer section 6 is disposed between the stop positions A and B for the test tray 3 and the locations of the universal trays 1a–1d. The buffer section 6 is configured to temporarily keep tested ICs belonging to a category of rare occurrence.

The buffer section 6 may have a capacity of accommodating, say about twenty to thirty ICs and be equipped with a memory portion for storing the category of ICs placed in IC pockets of the buffer section 6. The locations and category of the individual ICs temporarily kept in the buffer section 6 are thus stored in the memory portion. Between the sorting operations or upon the buffer section 6 being filled with ICs, a universal tray for the category to which the ICs kept in the buffer section belong is carried from the IC storage section 11 to the unloader section 8 to receive the ICs. It should be noted that ICs temporarily kept in the buffer section 6 may be scattered over a plurality of categories. In that case, it would be required to transport as many universal trays as the number of categories at a time from the IC storage section 11 to the unloader section 8.

The IC carrier 34 holds an IC in place with its leads or pins PN exposed downwardly as shown in FIG. 13. The tester head 100 is provided with an IC socket having contacts 101 extending upwardly from the top surface thereof The exposed pins PN of the IC are urged against the contacts 101 of the IC socket to establish electrical connection between the IC and the socket. To this end, a pusher 103 for pushing and holding an IC down is mounted above the tester head and is configured to push the IC accommodated in an IC carrier 34 from above to bring the pins PN into contact with the tester head.

The number of ICs which may be tested at a time with the tester head depends on the number of IC sockets mounted on the tester head. By way of example, where sixty-four ICs are carried in an array of 4 lines×16 rows on a test tray 3 as shown in FIG. 14, 4×4, that is, 16 IC sockets are arranged and mounted on the tester head such that the ICs (shown as cross-hatched) in every fourth row in each of the lines may be tested all at once. More specifically, in the first test run the examination is conducted on sixteen ICs located in the first, fifth, ninth and thirteenth rows in each line, the second test run is effected on another sixteen ICs located in the second, sixth, tenth and fourteenth rows in each line by shifting the test tray 3 by a distance corresponding to one row of ICs, and the third and fourth test runs are carried out in the similar manner until all of the ICs are tested. The test results are stored in a memory with the addresses determined by the identification number affixed to the test tray 3 and the IC numbers assigned to the ICs contained in the test tray, for example. It is to be appreciated that where thirty-two IC sockets may be mounted on the tester head, only two test runs are required to examine all sixty-four ICs arranged in an array of 4 lines×16 rows.

The IC storage section 11 comprises two, in this example, IC-to-be-tested storage racks (not shown) for accommodating universal trays 1 loaded with ICs being tested and seven, in this example, tested-IC storage racks (not shown) for accommodating universal trays 1 loaded with tested ICs sorted out by categories on the basis of the test results. The IC-to-be-tested storage rack and tested-IC storage rack are configured to accommodate universal trays in the form of a stack. The universal trays 1 with ICs under test carried thereon stored in the form of a stack in the IC-to-be-tested storage rack are transported successively from the top of the stack to the loader section 7 where the ICs being tested are transferred from the universal trays 1 onto test trays 3 on standby in the loader section 7.

Each of the IC-to-be-tested storage rack and tested-IC storage rack one of which is shown in FIG. 15 comprises a tray supporting frame 51 open at the top and having an opening at the bottom, and an elevator 52 disposed below the tray supporting frame 51 so as to be vertically movable through the bottom opening thereof. In the tray supporting frame 51 there are stored and supported a plurality of universal trays 1 stacked one on another which are vertically moved by the elevator 52 acting through the bottom opening of the tray supporting frame 51.

A tray transport, although not shown in FIG. 11, is disposed above the IC-to-be-tested storage racks and the tested-IC storage racks for movement over the entire extent of those storage racks in the direction of arrangement of the racks (in the X-axis direction). The tray transport is provided on its bottom with grasp means for grasping a universal tray 1. The tray transport is moved to a position over the IC-to-be-tested storage rack whereupon the elevator 52 is actuated to lift the universal trays 1 stacked in the IC-to-be-tested storage rack, so that the uppermost universal tray 1 may be engaged and grasped by the grasp means of the tray transport. Once the uppermost universal tray 1 loaded with ICs being tested has been transferred to the tray transport, the elevator 52 is lowered to its original position. The tray transport is then horizontally moved to and stopped at a position underlying the universal tray set position 12 in the loader section 7 where the tray transport has its grasp means release the universal tray 1 to allow it to drop into an immediately underlying tray receiver (not shown). The tray transport having the universal tray 1 unloaded therefrom is moved out of the loader section 7. Then, the elevator (not shown) is moved upward from below the tray receiver having the universal tray 1 placed thereon to lift up the universal tray 1 loaded with ICs to be tested so that the universal tray 1 is held at the universal tray set position 12.

In the unloader section 8 as well, four empty universal trays are positioned and held at the respective universal tray set positions 12 by the tray transport described above, the tray receivers and associated elevators. Once one universal tray 1 has been fully filled, the universal tray is lowered from the set position 12 by the elevator, and is subsequently stored in the tray storage position assigned to that particular tray by the tray transport.

The length of the testing time (also called measuring time) required for the IC tester to test ICs significantly varies depending upon the type of the IC and the contents of the test. Generally, one test takes about a few seconds to several tens of minutes as measured after an IC carried into the testing section 42 as loaded on a test tray has been brought into contact with an IC socket.

In testing ICs in the testing section 42, a relatively long time required per test necessitates a corresponding long waiting time until an IC carried into the soak chamber 41 as loaded on a test tray comes up for testing in the testing section 42, meaning that the test tray transporting mechanism need not be so fast in operation. In addition, the number of test trays to be stacked in the soak chamber 41 can be reduced.

This, however, requires a very long time to go through the test on all of the ICs, leading to a poor utilization ratio of the expensive IC tester and hence the serious disadvantage that the testing cost per an IC is greatly an increased.

In order to alleviate this disadvantage, it is required to increase the number of ICs which can be simultaneously tested (or measured) in the testing section 42 (which is called simultaneous measurement throughput in number of ICs). However, there is a limit to the number of IC sockets which can be mounted on a tester head, which in turn imposes a limit on the increase in simultaneous measurement throughput in number of ICs.

In addition, an increase in simultaneous measurement throughput in number of ICs for simultaneous measurement would require an increase in the number of ICs which can be handled by the transporting and handling mechanism including the X-Y transports 71 and 81 for the loader section 7 and the unloader section 8, respectively. While the throughput in number of ICs depends on the performance or throughput capacity of this transporting and handling mechanism, in the case that the testing time is relatively long, there would be no particular problem if the throughput in number of ICs was not increased so much.

In contrast, in the case that the testing time in the testing section 42 is relatively short, failure to transport test trays to the testing section 42 at high speed would involve a longer lost time in the testing operation in the testing section 42, resulting in undesirably prolonging the working time of the IC tester. Accordingly, fast operation is required of the test tray transporting mechanism. Further, it is preferable that the number of test trays which can be stacked in the soak chamber 41 be larger.

However, although it would not take much cost to make the speed of operation of the test tray transporting mechanism of only limited extent, it would require substantial cost to increase the operation speed to nearly the maximal limit, providing the disadvantage of rendering the initial cost of the entire IC tester very expensive. On top of that, in order to transport test trays at high speed, it is required to increase the throughput in number of ICs of the transporting and handling mechanism including the X-Y transports 71 and 81. Not only is it costly to increase the throughput in number of ICs, but also there is naturally a limit to increasing the throughput in number of ICs. It should also be noted that when the testing time in the testing section 42 is relatively short, increasing the simultaneous measurement throughput in number of ICs would not lead to a significant enhancement of efficiency.

DISCLOSURE OF THE INVENTION

A first object of the present invention is to provide an IC tester which is capable of reducing the time required to complete testing on all of the ICs to thereby enhance the utilization ratio.

A second object of the present invention is to provide an IC tester which is capable of transporting test trays from the soak chamber through the testing section to the exit chamber and which provides an enhanced simultaneous measurement throughput in number of ICs.

A third object of the present invention is to provide an IC tester which provides an increased throughput in number of ICs through the loader and unloader sections to thereby shorten the time required to complete testing on all of the ICs to be tested.

A fourth object of the present invention is to provide a test tray for use in an IC tester which provides for transporting test trays from the soak chamber through the testing section to the exit chamber in an efficient manner.

In order to accomplish the foregoing objects, according to a first aspect of the present invention, in a semiconductor device testing apparatus of the type in which semiconductor devices, loaded on a test tray, are transported to a testing section where the semiconductor devices while loaded on the test tray are tested and after completion of the testing, are carried out of the testing section, followed by being sorted out on the basis of the test results, a semiconductor device testing apparatus is provided in which a plurality of transport paths are provided for transporting test trays loaded with semiconductor devices to said testing section.

In a specific embodiment, in addition to said transport paths for transporting test trays loaded with semiconductor devices to said testing section, two transport paths are provided for transporting test trays loaded with tested semiconductor devices out of said testing section after completion of the testing in said testing section.

By way of example, when the semiconductor device testing apparatus includes a temperature stress applying means for applying a temperature stress of a predetermined temperature to semiconductor devices; said testing section; a heat removing/cold removing means for removing heat or cold from semiconductor devices having undergone a test in said testing section; a loader section for transferring and reloading semiconductor devices onto a test tray; and an unloader section for receiving and sorting tested semiconductor devices transported from said testing section on the basis of the test results, and when said temperature stress applying means and said testing section are located in the back portion of said semiconductor device testing apparatus while said loader section and said unloader section are located in front of said temperature stress applying means and said testing section, said heat removing/cold removing means being located in front of said testing section and underneath said unloader section, two transport paths are provided in the section of test tray transport path extending from said temperature stress applying means to said testing section.

When said temperature stress applying means, said testing section, and said heat removing/cold removing means are located in the back portion of said semiconductor device testing apparatus while said loader section and said unloader section are located in front of said temperature stress applying means, said testing section, and said heat removing/cold removing means, two transport paths are provided in the section of test tray transport path extending from said temperature stress applying means via said testing section to heat removing/cold removing means.

Said temperature stress applying means is provided with a vertical transport mechanism configured to support a plurality of test trays in the form of a stack with predetermined spacings between successive trays, and each stage of said vertical transport mechanism for supporting test trays has a space for accommodating a plurality of test trays. A plurality of test trays introduced successively from said loader section are placed on either the uppermost or the lowermost test tray supporting stage of said vertical transport mechanism successively from the back side toward the front side of said stage with successive trays either arranged at predetermined small spacings between adjacent trays or in abutment with each other.

Said heat removing/cold removing means is provided with a vertical transport mechanism configured to support a plurality of test trays in the form of a stack with predetermined spacings between successive trays, and each stage of said vertical transport mechanism for supporting test trays has a space for accommodating a plurality of test trays such that a plurality of test trays introduced from said testing section is placed as such on either the uppermost or the lowermost test tray supporting stage of said vertical transport mechanism.

According to a second aspect of the present invention, in a semiconductor device testing apparatus of the type including a loader section for transferring and reloading semiconductor devices onto a test tray, and an unloader section for receiving and sorting tested semiconductor devices on the basis of the test results, and in which semiconductor devices, loaded on a test tray, are transported from said loader section to a testing section where the semiconductor devices while loaded on the test tray are tested and after completion of the testing, said tested semiconductor devices loaded on said test tray are transported from said testing section to said unloader section, followed by being sorted out on the basis of the test results, a semiconductor device testing apparatus is provided in which a plurality of transport paths are provided in the section of test tray transport path extending from said unloader section to said loader section.

According to a third aspect of the present invention, in a semiconductor device testing apparatus of the type in which semiconductor devices, loaded on a test tray, are transported to a testing section where the semiconductor devices while loaded on the test tray are tested and after completion of the testing, are carried out of the testing section, followed by being sorted out on the basis of the test results, a semiconductor device testing apparatus is provided in which a test tray transport path for transporting test trays loaded with semiconductor devices to said testing section is a widened path broad enough to transport a plurality of test trays simultaneously with said plurality of test trays juxtaposed in a direction transverse to said test tray transport path.

In a specific embodiment, in addition to said transport path for transporting test trays loaded with semiconductor devices to said testing section, a transport path for transporting test trays loaded with tested semiconductor devices out of said testing section after completion of the testing is a widened path broad enough to transport a plurality of test trays simultaneously with said plurality of test trays juxtaposed in a direction transverse to said test tray transport path.

For example, when the semiconductor device testing apparatus includes a temperature stress applying means for applying a temperature stress of a predetermined temperature to semiconductor devices; said testing section; a heat removing/cold removing means for removing heat or cold from semiconductor devices having undergone a test in said testing section; a loader section for transferring and reloading semiconductor devices onto a test tray; and an unloader section for receiving and sorting tested semiconductor devices transported from said testing section on the basis of the test results, and when said temperature stress applying means and said testing section are located in the back portion of said semiconductor device testing apparatus while said loader section and said unloader section are located in front of said temperature stress applying means and said testing section, said heat removing/cold removing means being located in front of said testing section and underneath said unloader section, said widened path broad enough to transport a plurality of test trays simultaneously with said plurality of test trays juxtaposed in a direction transverse to said test tray transport path is provided in the section of test tray transport path extending from said temperature stress applying means to said testing section.

When said temperature stress applying means, said testing section, and said heat removing/cold removing means are located in the back portion of said semiconductor device testing apparatus while said loader section and said unloader section are located in front of said temperature stress applying means, said testing section, and said heat removing/cold removing means, said widened path broad enough to transport a plurality of test trays simultaneously with said plurality of test trays juxtaposed in a direction transverse to said test tray transport path is provided in the section of test tray transport path extending from said temperature stress applying means via said testing section to heat removing/cold removing means.

Said plurality of test trays juxtaposed in a direction transverse to said test tray transport path are in engagement with each other.

Said temperature stress applying means is provided with a vertical transport mechanism configured to support a plurality of test trays in the form of a stack with predetermined spacings between successive trays, and each stage of said vertical transport mechanism for supporting test trays has a space for accommodating a plurality of two test trays. A plurality of test trays introduced successively from said loader section are placed on either the uppermost or the lowermost test tray supporting stage of said vertical transport mechanism successively from the back side toward the front side of said stage with successive trays integrally engaged with each other.

Said heat removing/cold removing means is provided with a vertical transport mechanism configured to support a plurality of test trays in the form of a stack with predetermined spacings between successive trays, and each stage of said vertical transport mechanism for supporting test trays has a space for accommodating a plurality of test trays. A plurality of test trays in juxtaposition in a direction transverse to said test tray transport path introduced from said loader section are placed as such on either the uppermost or the lowermost test tray supporting stage of said vertical transport mechanism.

According to a fourth aspect of the present invention, in a semiconductor device testing apparatus of the type including a loader section for transferring and reloading semiconductor devices onto a test tray, and an unloader section for receiving and sorting tested semiconductor devices on the basis of the test results, and in which semiconductor devices, loaded on a test tray, are transported from said loader section to a testing section where the semiconductor devices while loaded on the test tray are tested and after completion of the testing, said tested semiconductor devices loaded on said test tray are transported from said testing section to said unloader section, followed by being sorted out on the basis of the test results, a semiconductor device testing apparatus is provided in which a widened path broad enough to transport a plurality of test trays simultaneously with said plurality of test trays juxtaposed in a direction transverse to said test tray transport path is provided in the section of test tray transport path extending from said unloader section to said loader section.

Said plurality of test trays juxtaposed in a direction transverse to said test tray transport path are in engagement with each other.

According to a fifth aspect of the present invention, in a semiconductor device testing apparatus of the type in which semiconductor devices, loaded on a test tray, are transported to a testing section where the semiconductor devices while loaded on the test tray are tested and after completion of the testing, are carried out of the testing section, followed by being sorted out on the basis of the test results, a semiconductor device testing apparatus is provided in which said test tray is generally of a rectangular shape and in which a test tray transport path for transporting test trays loaded with semiconductor devices to said testing section is a widened path broad enough to transport said rectangular test tray with the major edge of said test tray in front in the direction of travel of the test tray.

In a specific embodiment, in addition to said transport path for transporting rectangular test trays loaded with semiconductor devices to said testing section, a transport path for transporting a rectangular test tray loaded with tested semiconductor devices out of said testing section after completion of the testing in said testing section is a widened path broad enough to transport the rectangular test tray with the major edge of said test tray in front in the direction of travel of the test tray.

For example, when the semiconductor device testing apparatus includes a temperature stress applying means for applying a temperature stress of a predetermined temperature to semiconductor devices; said testing section; a heat removing/cold removing means for removing heat or cold from semiconductor devices having undergone a test in said testing section; a loader section for transferring and reloading semiconductor devices onto a test tray; and an unloader section for receiving and sorting tested semiconductor devices transported from said testing section on the basis of the test results, and when said temperature stress applying means and said testing section are located in the back portion of said semiconductor device testing apparatus while said loader section and said unloader section are located in front of said temperature stress applying means and said testing section, said heat removing/cold removing means being located in front of said testing section and underneath said unloader section, said widened path broad enough to transport the rectangular test tray with the major edge of said test tray in front in the direction of travel of the test tray is provided in the section of test tray transport path extending from said temperature stress applying means to said testing section.

When said temperature stress applying means, said testing section, and said heat removing/cold removing means are located in the back portion of said semiconductor device testing apparatus while said loader section and said unloader section are located in front of said temperature stress applying means, said testing section, and said heat removing/cold removing means, said widened path broad enough to transport the rectangular test tray with the major edge of said test tray in front in the direction of travel of the test tray is provided in the section of test tray transport path extending from said temperature stress applying means via said testing section to heat removing/cold removing means.

In this case, two or a plurality of rectangular test trays are transported at a time serially with the major edge of each of said test trays in front in the direction of travel of the test tray along said test tray transport path.

Said temperature stress applying means is provided with a vertical transport mechanism configured to support a plurality of test trays in the form of a stack with predetermined spacings between successive trays, and each stage of said vertical transport mechanism for supporting test trays has a space for accommodating a plurality of test trays in a row with the major edge of each of said test trays in front in the direction of travel of the test tray as said test trays are introduced from said loader section. A plurality of test trays introduced successively from said loader section are placed, except the last introduced test tray, onto either the uppermost or the lowermost test tray supporting stage of said vertical transport mechanism, followed by being delivered successively in a direction perpendicular to the direction of introduction while said last introduced test tray is retained as it has been introduced from said loader section, whereby said plurality of test trays except said last introduced test tray are delivered through the outlet of said temperature stress applying means with predetermined small spacings between adjacent trays or in abutment with each other, and placed on either the uppermost or the lowermost test tray supporting stage of said vertical transport mechanism in juxtaposition in a row.

Said heat removing/cold removing means is provided with a vertical transport mechanism configured to support a plurality of test trays in the form of a stack with predetermined spacings between successive trays, and each stage of said vertical transport mechanism for supporting test trays has a space for accommodating a plurality of test trays with the major edge of each of said test trays in front in the direction of travel of the test tray. A plurality of test trays serially introduced from said loader section are placed as such on either the uppermost or the lowermost test tray supporting stage of said vertical transport mechanism.

According to a sixth aspect of the present invention, in a semiconductor device testing apparatus of the type including a loader section for transferring and reloading semiconductor devices onto a test tray, and an unloader section for receiving and sorting tested semiconductor devices on the basis of the test results, and in which semiconductor devices, loaded on a test tray, are transported from said loader section to a testing section where the semiconductor devices while loaded on the test tray are tested and after completion of the testing, said tested semiconductor devices loaded on said test tray are transported from said testing section to said unloader section, followed by being sorted out on the basis of the test results, a semiconductor device testing apparatus is provided in which a widened path broad enough to transport a rectangular test tray with the major edge of said test tray in front in the direction of travel of the test tray is provided in the section of test tray transport path extending from said unloader section to said loader section.

In this case as well, two or a plurality of rectangular test trays are transported at a time serially with the major edge of each of said test trays in front in the direction of travel of the test tray along said test tray transport path.

According to a seventh aspect of the present invention, in a semiconductor device testing apparatus of the type in which semiconductor devices, loaded on a test tray, are transported to a testing section where the semiconductor devices while loaded on the test tray are tested and after completion of the testing, are carried out of the testing section, followed by being sorted out on the basis of the test results, a semiconductor device testing apparatus is provided in which a vertical transport mechanism configured to support a plurality of test trays in the form of a stack with predetermined spacings between successive trays is provided in a constant temperature chamber containing a temperature stress applying means for applying a temperature stress of a predetermined temperature to semiconductor devices and said testing section, each stage of said vertical transport mechanism for supporting test trays having a space for accommodating a plurality of test trays so that a plurality of test trays may be simultaneously transported to said testing section.

Said semiconductor device testing apparatus further includes a loader section for transferring and reloading semiconductor devices onto a test tray and an unloader section for receiving and sorting tested semiconductor devices on the basis of the test results, and each of said loader section and unloader section is provided with a vertical transport mechanism configured to support a plurality of test trays in the form of a stack with predetermined spacings between successive trays, each stage of said vertical transport mechanism for supporting test trays having a space for accommodating one test tray.

In an alternative embodiment, said semiconductor device testing apparatus further includes a loader section for transferring and reloading semiconductor devices onto a test tray and an unloader section for receiving and sorting tested semiconductor devices on the basis of the test results, and each of said loader section and unloader section is provided with a vertical transport mechanism configured to support a plurality of test trays in the form of a stack with predetermined spacings between successive trays, each stage of said vertical transport mechanism for supporting test trays having a space for accommodating a plurality of test trays.

In a specific embodiment, a tester head is mounted on the top of said constant temperature chamber, and when a plurality of test trays placed on each test tray supporting stage are raised up to the uppermost test tray supporting stage by said vertical transport mechanism in said constant temperature chamber, a predetermined number of semiconductor devices out of the semiconductor devices loaded on said plurality of test trays on the uppermost test tray supporting stage are electrically connectable with a device socket mounted on said tester head, with said device socket facing downwardly.

Each of said stages for supporting test tray of said vertical transport mechanism in said constant temperature chamber has a space for accommodating a plurality of test trays in a row as said test tray trays are introduced from said loader section. Said plurality of test trays introduced successively from said loader section are placed, except the last introduced test tray, onto either the uppermost or the lowermost test tray supporting stage of said vertical transport mechanism, followed by being delivered successively in a direction perpendicular to the direction of introduction while said last introduced test tray is retained as it has been introduced from said loader section.

According to an eighth aspect of the present invention, test trays useful with said semiconductor device testing apparatus provided in the aforesaid third and fourth aspects of the invention are provided, each of sad test trays comprising a rectangular frame having one of two opposite edges formed with recess means and the other of the opposite edges formed with protrusion means, said test trays being integrally joinable with each other by said protrusion means of one of said test trays being engaged with said recess means of an other one of and test trays.

According to a ninth aspect of the present invention, test trays useful with said semiconductor device testing apparatus provided in the aforesaid third and fourth aspects of the invention are provided, each of said test trays comprising a rectangular frame having one of two opposite edges provided with pivotable engagement protrusion means and the other of the opposite edges provided with recess means, said test trays being integrally joinable with each other by said engagement protrusion means of one of said test trays being engaged with said recess means of an other one of said test trays.

According to a tenth aspect of the present invention, a semiconductor device testing apparatus is provided in which a plate-like member is used, said plate-like member having a pair of openings formed in juxtaposition at a predetermined spacing therebetween for accommodating two test trays, one fitted in each of said openings, so that the two test trays in unison with said plate-like member may be transported along said test tray transport path.

BRIEF DESCRIPTION OF THE DRAWINGS

FIGS. 3(a) and 3(b) are representations illustrating the functional advantages of the semiconductor device testing apparatus of the second embodiment shown in FIG. 2;

BEST MODES FOR CARRYING OUT THE INVENTION

Figure 1:
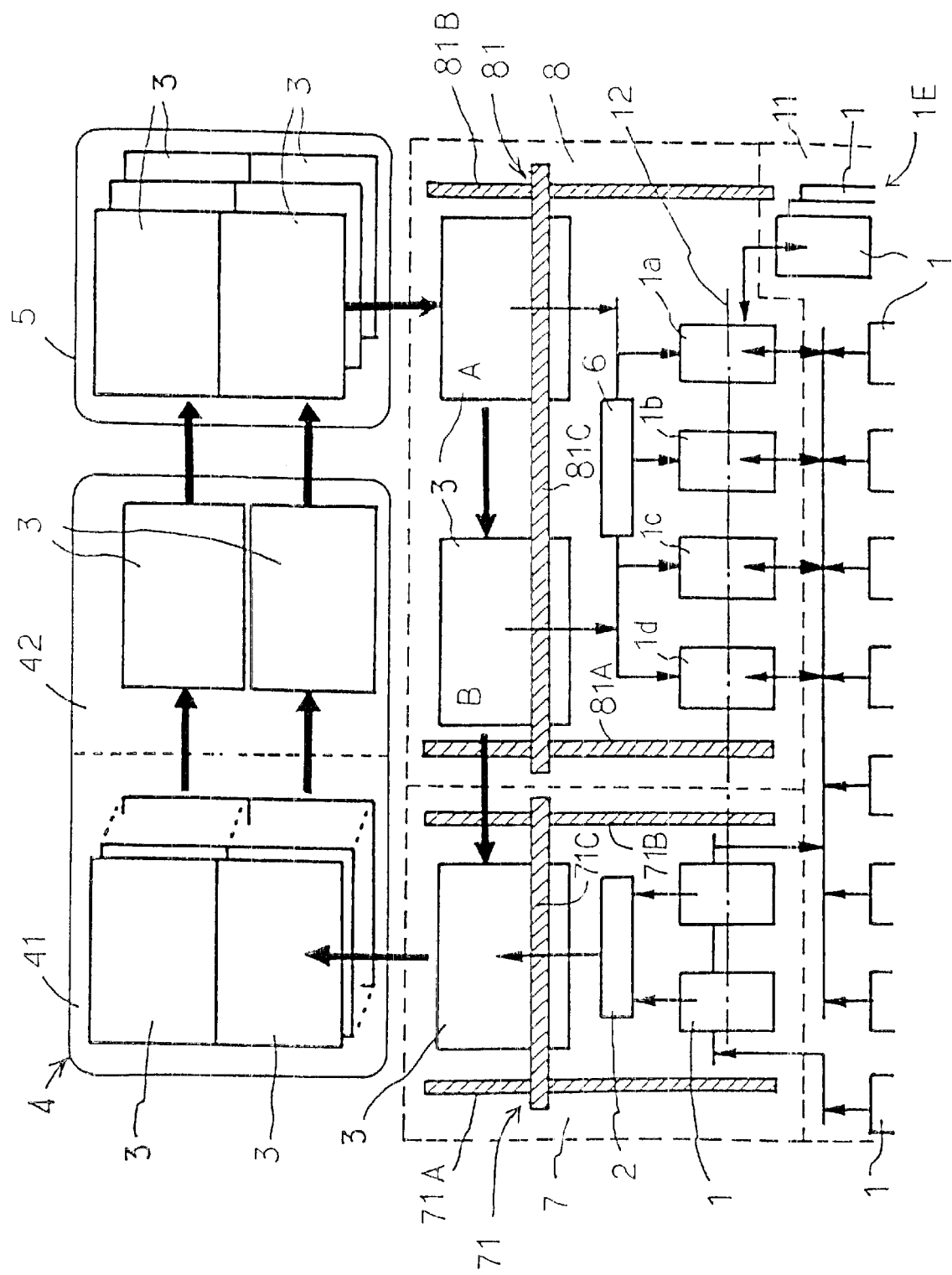
FIG. 1 is a plan view illustrating the general construction of a first embodiment of the semiconductor device testing apparatus according to the present invention.

FIG. 1 shows the general construction of the semiconductor device testing apparatus of a first embodiment according to the present invention. Since as in the foregoing description of the prior art example the present invention in the first embodiment as well as in the other embodiments is described with reference to ICs which are typical of semiconductor devices, the semiconductor device testing apparatus will be simply referred to as IC tester hereinafter. Further, the elements shown in FIG. 1 corresponding to those of FIG. 11 are designated by the same reference numerals and will not be discussed again in details, unless required.

Figure 11:
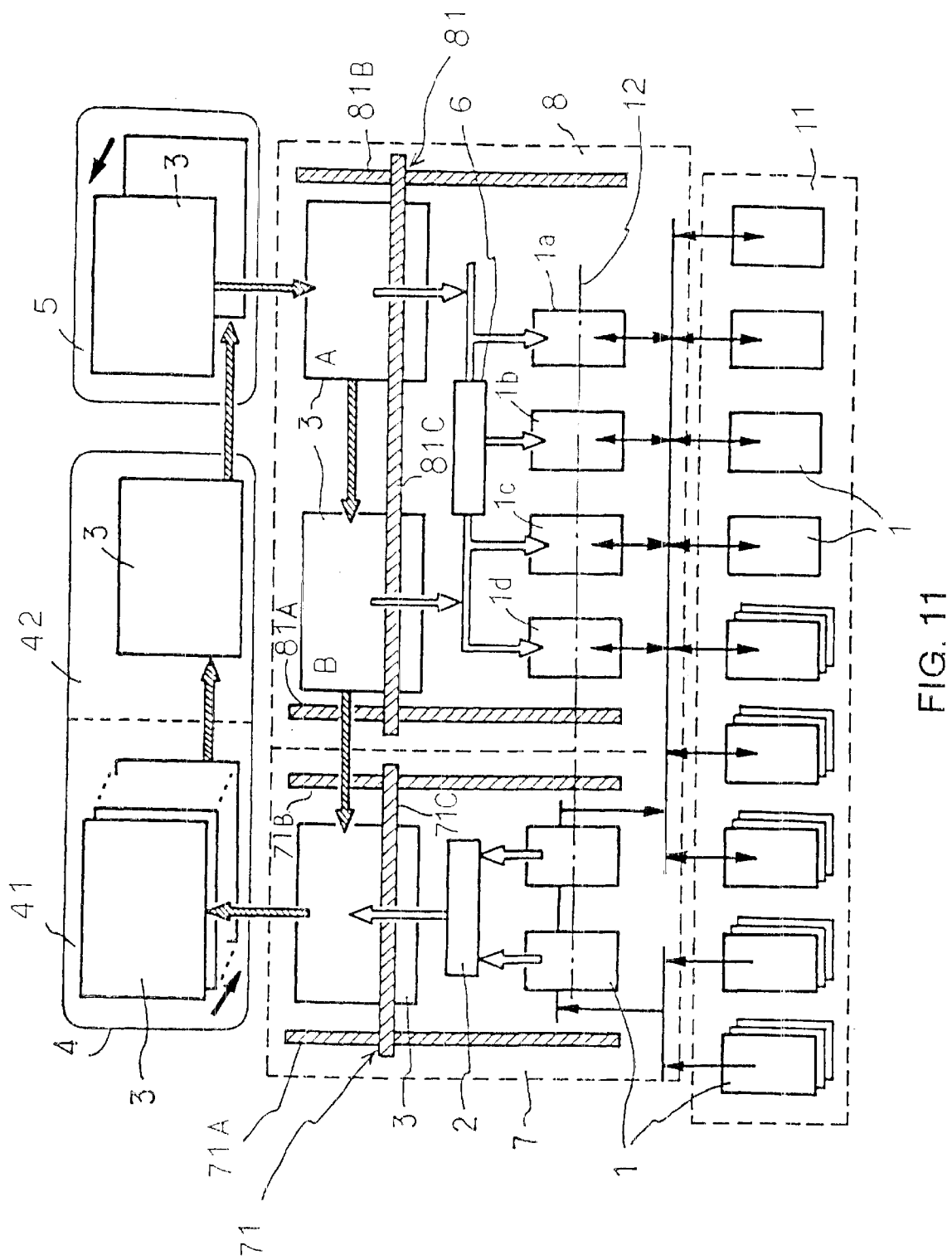
FIG. 11 is a plan view illustrating the general construction of one example of the conventional semiconductor device testing apparatus.

Like the IC tester shown in FIG. 11, the IC tester of the present invention as illustrated in FIG. 1 is configured such that a constant temperature chamber 4 including a soak chamber 41 and a testing section 42, and an exit chamber 5 are arranged in the left to right direction as viewed in the drawing (referred to as X-axis direction herein) in the rear portion of the IC tester while in front of the constant temperature chamber 4 and the exit chamber 5 there are located a loader section 7 and an unloader section 8. The loader section 7 is adapted for transferring and reloading ICs under test onto test trays 3 capable of withstanding high/low temperatures while the unloader section 8 is adapted for transferring and reloading tested ICs which have been carried on the test tray 3 out through the exit chamber 5 subsequently to being tested in the testing section 42 of the constant temperature chamber 4 from the test tray 3 to the universal tray. Further, in the forefront of the IC tester there is located a storage section 11 for storing universal trays 1 loaded with ICs to be tested and universal trays 1 loaded with ICs already tested and sorted.

More specifically, the soak chamber 41, the testing section 42, and the exit chamber 5 are arranged in the order named from left to right in the X-axis direction in the drawing, and the loader section 7 and the unloader section 8 are located in front of the soak chamber 41 of the constant temperature chamber 4 and in front of the exit chamber 5, respectively. Accordingly, as in the conventional IC tester, the test tray 3 is delivered into the constant temperature chamber 4 in the direction (upward-downward direction as viewed in the drawimg which is referred to as Y-axis direction herein) which is perpendicular to the direction (X-axis direction) in which it has been conveyed from the unloader section 8 to the loader section 7. From the constant temperature chamber 4, the test tray 3 is again delivered out in the direction which is perpendicular to the direction which it has been introduced from the loader section 7. Likewise, from the exit chamber 5, the test tray 3 is delivered out in the direction which is perpendicular to the direction in which it has been introduced from the constant temperature chamber 4. From the unloader section 8, the test tray 3 is again discharged in the direction which is perpendicular to the direction in which it has been introduced from the exit chamber 5. In other words, when the test tray 3 is transported from the unloader section 8 to the loader section 7, one of the minor edges of the tray takes the lead in the movement; during the transport from the loader section 7 to the constant temperature chamber 4 the test tray 3 is advanced with one of its major edges in the front; in transit from the constant temperature chamber 4 to the exit chamber 5 the test tray 3 is moved with the other of its minor edges; and then the test tray 3 is transported from the exit chamber 5 to the unloader section 8 with the other of its major edges in the front.

The soak chamber 41 of the constant temperature chamber 4 is designed for applying temperature stresses of either a predetermined high or low temperature on ICs under test loaded on a test tray 3 in the loader section 7 while the testing section 42 of the constant temperature chamber 4 is designed for executing electrical tests on the ICs under the predetermined temperature stress imposed in the soak chamber 41. In order to maintain the ICs loaded with temperature stresses of either a predetermined high or low temperature in that temperature during the test, the soak chamber 41 and testing section 42 are both contained in the constant temperature chamber 4 capable of maintaining the interior atmosphere at a predetermined temperature.

The exit chamber 5 is designed for relieving tested ICs of heat or cold to restore them to the outside temperature (room temperature). That is, the exit chamber 5 cools the ICs with forced air down to the room temperature if the ICs under test were loaded with a high temperature stress on the order of 120° C., for example in the soak chamber 41. If the ICs under test had a low temperature on the order of −30° C. applied thereto in the soak chamber 41, the exit chamber 5 heats them with heated air or a heater back to a temperature at which no condensation occurs.

The unloader section 8 is configured to sort tested ICs placed on a test tray by categories on the basis of the data of the test results and load them on the corresponding universal trays. In this example, the unloader section 8 is configured to provide for stopping test trays 3 at two positions A and B The ICs on the test trays 3 stopped at the first position A and the second position B are sorted out based on the data of the test results and transferred onto and stored in the universal trays of the corresponding categories at rest at the universal tray set positions 2, four universal trays 1*a*, 1*b*, 1*c* and 1*d* in the example illustrated.

Figure 12:
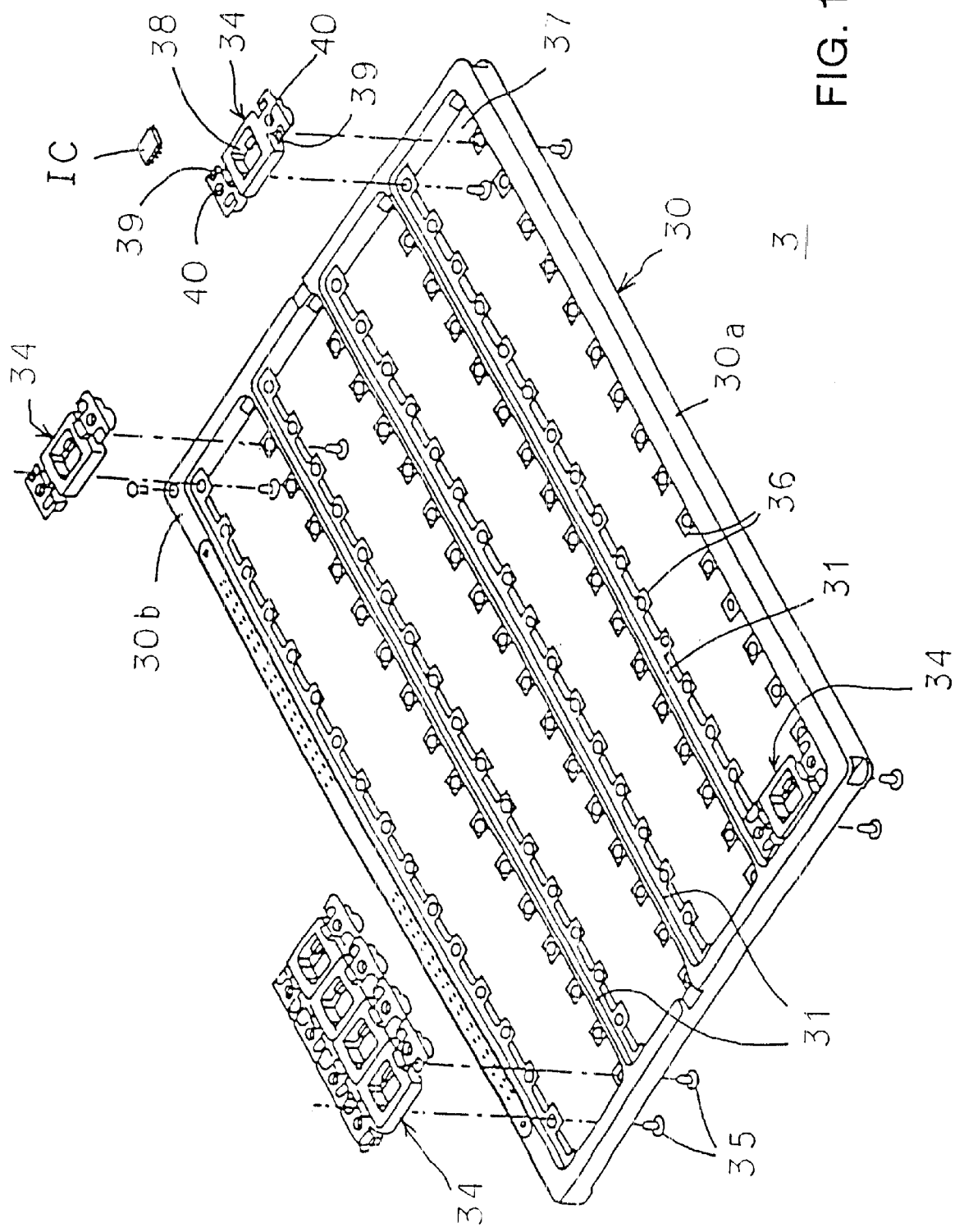
FIG. 12 is an exploded perspective view illustrating the construction of an example of the test tray for use with the semiconductor device testing apparatus.
Figure 13:
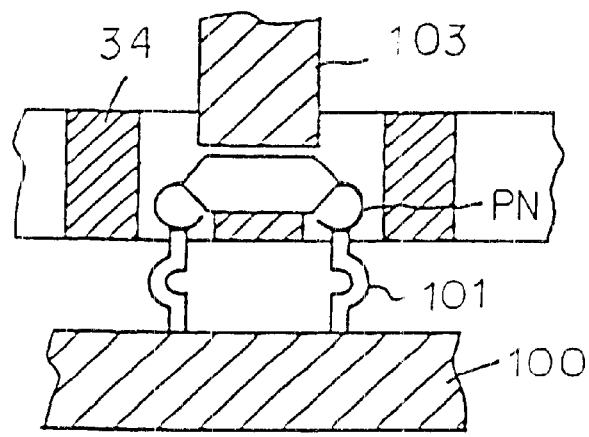
FIG. 13 is an enlarged cross-sectional view illustrating the manner in which the IC under test stored in the test tray shown in FIG. 11 is in electrical connection with the tester head.

The test tray 3 may be of the same size and construction as that used with the conventional IC tester already described with reference to FIG. 11. That is, the test tray 3 has the construction as shown in FIG. 12. The test tray 3 is moved in a circulating manner from and back to the loader section 7 sequentially through the soak chamber 41 and the testing section 42 in the constant temperature chamber 4, the exit chamber 5, and the unloader section 8. In this path of circulating travel, there are disposed a predetermined number of test trays 3 which are successively moved in the directions as indicated by thick cross-hatched arrows in FIG. 1 by a test tray transport.

In this first embodiment of the invention, as will be appreciated from FIG. 1, the depth (length in the Y-axis direction) of the constant temperature chamber 4 and the exit chamber 5 is expanded as compared to the prior art IC tester by a dimension corresponding approximately to one transverse width (length of the minor edge) of the rectangular test tray 3, and there are provided two generally parallel paths of transport for test trays 3 extending successively through the soak chamber 41 and the testing section 42 in the constant temperature chamber 4 and then through the exit chamber 5 so that two test trays 3 as shown may be simultaneously transported along the two paths of transport. In this case, the total width (length in the Y-axis direction) of the two paths of transport is approximately equal to the sum of transverse widths of two test trays, so that provision of two paths of transport increases the depth (length in the Y-axis direction) of the IC tester only by a dimension corresponding approximately to the length of the minor edge of the test tray 3.

The operation of the IC tester constructed as described just above will now be explained.

A test tray 3 having ICs under test loaded thereon from a universal tray 1 in the loader section 7 is conveyed with one of its major edges in the front from the loader section 7 to the constant temperature chamber 4 and is introduced into the soak chamber 41 through an inlet formed in the front side of the constant temperature chamber 4. The soak chamber 41 is equipped therein with a vertical mechanism adapted to support a plurality of (say, five) test trays 3 staked one on another with predetermined spacings therebetween.

In this embodiment, each stage of the vertical transport mechanism for supporting a test tray thereon has a depth (corresponding to the dimension of the outlet of the soak chamber 41) approximately equal to the sum of transverse widths of two test trays and an inlet sized to be approximately equal to one length of the major edge of the test tray (corresponding to the dimension of the inlet of the soak chamber 41 as measured in the X-axis direction). The first test tray 3 received from the loader section 7 is placed on the uppermost stage of the vertical transport mechanism in the back half section (the upper half section as viewed in the Y-axis direction) of the stage and supported by supporting members associated with that stage.

The vertical transport mechanism is stopped in operation until two test trays are transported onto the uppermost stage. Once the second test tray 3 has been transported from the loader section 7 onto the uppermost stage of the vertical transport mechanism and accommodated in the front half section (the lower half section as viewed in the Y-axis direction) of the stage either at a predetermined spacing from or in abutment with the first test tray, the vertical transport mechanism is actuated to move the test trays on the successive stages downwardly by one stage in the vertical direction (which is referred to Z-axis direction). Alternatively, the arrangement may be such that after the first test tray has been placed into the back half section on the uppermost stage of the vertical transport mechanism, the operation of the vertical transport mechanism is stopped until the lapse of a predetermined period of time during which the downward movement of the test trays on the successive stages is ceased.

The vertical transport mechanism is configured to support two test trays on each stage and is operative to move the two test trays on each stage down successively to the next lower stage.

While two test trays on the uppermost stage are moved down through the successive stages to the lowermost stage, and during a waiting time until the testing section 42 is vacated (available for next testing), the ICs to be tested on the two test trays are loaded with a temperature stress of either a predetermined high or low temperature.

Once the two test trays have been moved down to the lowermost stage, they are almost simultaneously delivered out along the respective paths of transport through the outlet of the soak chamber 41 into the testing section 42 which on the left-hand side in the X-axis direction, adjoins and communicates with the lower portion of the soak chamber 41. It thus will be appreciated that the two test trays are delivered out of the soak chamber 41 in a direction perpendicular to the direction of introduction thereinto. The path along which the first test tray is transported form the soak chamber 41 through the testing section 42 to the exit chamber 5 is referred to as the first path of transport while the path along which the second test tray is transported form the soak chamber 41 through the testing section 42 to the exit chamber 5 is referred to as the second path of transport.

The testing section 42 is equipped with a single tester head (not shown) disposed at the corresponding position below the two paths of transport for test trays. Two test trays almost simultaneously delivered out of the soak chamber 41 are transported along the first and second separate paths of transport to the testing section 42 and are halted at predetermined positions overlying the corresponding device sockets (not shown) mounted on the tester head. Subsequently, a predetermined number of ICs under test out of those loaded on the test trays are brought into electrical contact with the corresponding device sockets mounted on the tester head while the ICs are placed on the test trays.

Upon completion of testing on all of the ICs on the two test trays through the tester heads, those two test trays are transported along the respective paths of transport from the testing section 42 to the exit chamber 5 where the tested ICs are relieved of heat or cold.

It is to be noted that instead of providing a single tester head, there may be two tester heads, one for each of the two test tray transport paths which have mounted thereon device sockets adapted to contact with the ICs on the two test trays corresponding to the two tester heads. It should also be noted that while two test trays are transported from the soak chamber 41 to the testing section 42, and then from the testing section 42 to the exit chamber 5, two test trays need not necessarily be simultaneously transported.

Like the soak chamber 41, the exit chamber 5 is also equipped with a vertical transport mechanism adapted to support a plurality of (say, five) test trays 3 stacked one on another with predetermined spacings therebetween.

In this embodiment, each stage of the vertical transport mechanism for supporting a test tray thereon in the exit chamber 5 has an inlet sized to be approximately equal to the sum of transverse widths of two test trays and approximately equal to one length of the major edge of the test tray (corresponding to the dimension of the inlet of the exit chamber 5 as measured in the Y-axis direction) and a depth approximately equal to one length of the major edge of the test tray (corresponding to the dimension of the outlet of the exit chamber 5 as measured in the X-axis direction). The first test tray 3 introduced along the first path of transport from the testing section 42 is placed on the lowermost stage of the vertical transport mechanism in the back half section of that stage while the second test tray 3 introduced along the second path of transport from the testing section 42 is placed on the lowermost stage of the vertical transport mechanism in the front half section of that stage, and the two test trays are supported by supporting members associated with that stage.

The vertical transport mechanism is at rest in operation until two test trays are transported onto the lowermost stage. Once two test trays have been transported from the testing section 42 onto the lowermost stage of the vertical transport mechanism, the vertical transport mechanism is actuated to move the test trays on the successive stages upwardly by one stage in the vertical direction. While two test trays on the lowermost stage are moved up to the uppermost stage by the upward movement of the successive stages by actuation of the vertical transport mechanism, the tested ICs are relieved of either heat or cold to be restored to the outside temperature (room temperature).

As already noted, since the IC test is conducted on ICs having a desired temperature stress in a wide range of temperatures such as from −55° C. to +125° C. imposed thereon in the soak chamber 41, the exit chamber 5 cools the ICs with forced air down to the room temperature if the ICs have had a high temperature of, say, about 120° C. applied thereto in the soak chamber 41. If ICs have had a low temperature of, say, about −30° C. applied thereto in the soak chamber 41, the exit chamber 5 heats them with heated air or a heater up to a temperature at which no condensation occurs.

After the heat removal or cold removal process, the second test tray 3 placed on the front half section of the uppermost stage of the vertical transport mechanism is conveyed from the exit chamber 5 to the position A at the unloader section 8 through the outlet of the exit chamber extending in the direction (facing on the front of the exit chamber 5) perpendicular to that in which it has been introduced from the testing section 42 into the exit chamber 5. Disposed closest to the first position A are universal trays 1a and 1b. Assuming that classification categories 1 and 2 are allotted to these universal trays 1a and 1b, respectively, while the test tray 3 is stopped at the first position A, only the tested ICs belonging to the categories 1 and 2 are picked up from the test tray 3 held at the first position A, and transferred onto the corresponding universal trays 1a and 1b, respectively. Once the test tray 3 at rest at the first position A has been depleted of the ICs belonging to the categories 1 and 2, the test tray is moved to the second position B.

Arranged closest to the second position B are universal trays 1c and 1d. Assuming that classification categories 3 and 4 are allotted to these universal trays 1c and 1d, respectively, the tested ICs belonging to the categories 3 and 4 are picked up from the test tray 3 held at the second position B and transferred onto the corresponding universal trays 1c and 1d, respectively.

Next, the first test tray 3 placed on the back half section of the uppermost stage of the vertical transport mechanism is conveyed from the exit chamber 5 through the outlet thereof to the position A at the unloader section 8 and is halted at that position. The conveyance of the first test tray to the unloader section 8 takes place either concurrently with or after the conveyance of the second test tray from the position A to the position of the unloader section 8.

It will be appreciated that the distance for the X-Y transport 81 required to travel for the sorting operation can be reduced by the arrangement described above in which the X-Y transport 81 is shared by the two unloader sections (represented by the first and second positions A and B) and in which the sorting operations are limited to the universal trays 1a, 1b and universal trays 1c, 1d closest to the test tray stop positions A and B, respectively. Consequently, this construction permits the overall processing time required for the sorting to be shortened, despite the fact that the single X-Y transport 81 is used for the sorting operation.

In this embodiment as well, it is noted that the number of universal trays 1 that can be installed at the universal tray set positions 12 in the unloader section 8 is limited to four by the space available. Hence, the number of categories into which ICs can be sorted in real time operation is limited to four categories 1 to 4 as noted above. While four categories would generally be sufficient to cover three categories for subclassifying "conforming articles" into high, medium and low response speed elements in addition to one category allotted to "non-conforming article," in some instances there may be some among the tested ICs which do not belong to any of these categories. Should there be found any tested ICs which should be classified into a category other than the four categories, a universal tray 1 assigned to the additional category should be taken from the empty tray storage rack 1E (the lower right corner area in FIG. 1) of the IC storage section 11 and be transported into the unloader section 8 to store the ICs of the additional category. When this is to be done, it is also needed to transport any one of the universal trays positioned in the unloader section 8 to the IC storage section 11 for storage therein.

If the replacement of the universal trays is effected in the course of the sorting operation, the latter operation would have to be interrupted during the replacement. For this reason, this embodiment also disposes a buffer section 6 between the stop positions A and B for the test tray 3 and the locations of the universal trays 1a–1d for temporarily keeping the tested ICs belonging to a category of rare occurrence.

The buffer section 6 may have a capacity of accommodating, say about twenty to thirty ICs and be equipped with a memory portion for storing the category and locations of ICs placed in the individual IC pockets of the buffer section 6. With this arrangement, between the sorting operations or upon the buffer section 6 being filled with ICs, a universal tray for the category to which the ICs kept in the buffer section belong is carried from the IC storage section 11 to the universal tray set position 12 at the unloader section 8 to store the ICs in that universal tray. It should be noted that ICs temporarily kept in the buffer section 6 may be scattered over a plurality of categories. In that case, it would be required to transport as many universal trays as the number of categories at a time from the IC storage section 11 to the unloader section 8.

The test tray 3 emptied in the unloader section 8 is delivered back to the loader section 7 where it is again loaded with ICs being tested from the universal tray 1 to repeat the same steps of operation.

The IC transport 71 for transferring ICs from the universal tray 1 to the test tray 3 in the loader section 7 may be of the same construction as that used with the conventional IC tester already described, and may comprise a pair of opposed parallel rails 71A, 71B mounted over the loader section 7 at the ends thereof opposed in the X-axis direction and extending in the Y-axis direction, a movable arm 71C spanning and mounted at opposite ends on the pair of rails 71A, 71B for movement in the Y-axis direction, and a movable head, not shown (which is known in the art concerned as pick-and-place head) carried on the movable arm 71C for movement therealong longitudinally of the arm, that is, in the X-axis direction.

The movable head has an IC pick-up pad (IC grasping member) vertically movably mounted on its bottom surface. The movement of the movable head in the X-Y-axis directions and the downward movement of the pick-up pad bring the pick-up pad into abutment with the ICs placed on the universal tray 1 at rest at the universal tray set position 12 to attract and grasp them by vacuum suction, for instance for transfer from the universal tray 1 to the test tray 3. The movable head may be provided with a plurality of, say, eight pick-up pads so that eight ICs at a time may be transported from the universal tray 1 to the test tray 3.

Further, a position corrector 2 for correcting the orientation or position of an IC called "preciser" is located between the universal tray set position 12 and the stop position for the test tray 3. The operation of this IC position corrector 2 has already been described hereinabove, and further description is omitted.

The unloader section 8 is also equipped with an X-Y transport 81 which is identical in construction to the X-Y transport 71 provided for the loader section 7. The X-Y transport 81 is mounted spanning the first position A and the second position B and performs to transship the tested ICs from the test tray 3 delivered out to the positions A and B in the unloader section 8 onto the corresponding universal tray 1.

The X-Y transport 81 comprises a pair of spaced parallel rails 81A, 81B mounted over the unloader section 8 at the ends thereof opposed in the X-axis direction and extending in the Y-axis direction, a movable arm 8IC spanning and mounted at opposite ends on the pair of rails 81A, 81B for movement in the Y-axis direction, and a movable head, not shown (which is known in the art concerned as pick-and-place head) carried on the movable arm 7IC for movement therealong longitudinally of the arm, that is, in the X-axis direction.

As in the illustrated prior art IC tester, a tray transport, although not shown in FIG. 1, is disposed above the IC-to-be-tested storage racks and the tested-IC storage racks for movement over the entire extent of those storage racks in the direction of arrangement of the racks (in the X-axis direction). There have already been described hereinabove the various operations of this tray transport including the operation of holding a universal tray 1 loaded with ICs under test at the universal tray set position in the loader section 7, the operation of holding four empty universal trays 1a–1d at the respective universal tray set positions 12 in the unloader section 8, the operation of storing a fully filled universal tray in the corresponding tray storage position, and the operation of, in the event that there may be found any tested IC which does not belong to any of the categories allotted to the designated universal trays held at the set positions 12, transporting to the set position in the unloader section 8 a universal tray for storing such IC of an other category. Therefore, such description in not repeated here.

With the construction described just above, while there is only one path of transport for the test tray running from the exit chamber 5 through the unloader section 8 to the soak chamber 41 as in the illustrated prior art IC tester, two such paths are provided from the soak chamber 41 through the testing section 42 to the exit chamber 5. It is thus to be appreciated that this permits ICs under test placed on two test trays to be simultaneously tested in the testing section 42 in spite of the use of the conventionally used test tray as such, resulting in doubling the simultaneous measurement throughput in number of ICs. Consequently, in the case that a relatively long time is required per test in the testing section 42, the doubled simultaneous measurement throughput in number reduces the time required to complete the testing on all of the ICs to nearly half, producing the advantage of greatly saving the testing cost per IC.

It is noted here that the provision of two paths of test tray transport running from the soak chamber 41 through the testing section 42 to the exit chamber 5 as in the embodiment described above necessitates one independent drive means for each of the transport paths. However, in the case of relatively long time required per test in the testing section 42, the test tray transport mechanism need not be so fast in operation, permitting the use of relatively inexpensive test tray transport mechanisms so that the increase in the cost involved in providing two test tray transport mechanisms may be only marginal. It will thus be appreciated that the merit of reducing the testing cost per IC is much greater.

In addition, in the construction according to the first embodiment described above, the overall size of the IC tester need be enlarged only in depth by only about one length of the minor edge of the test tray. Consequently, the advantages are obtained that the depth dimension of the entire IC tester may be made considerably smaller and that the apparatus may be manufactured less expensively, as compared to the construction which would result if in the prior are IC tester shown in FIG. 11 two of the constructions comprising the soak chamber 41, the testing section 42 and the exit chamber 5 were provided in order to establish two paths of test tray transport extending from the soak chamber 41 through the testing section 42 to the exit chamber 5.

As is well known in the art, the number of ICs which can be simultaneously tested in the testing section 42 depends on the number of IC sockets which can be mounted on a tester head. Tester heads are constructed separately from the IC tester proper (which is called main frame in the art concerned) and are mounted in the testing section of the handler. It should be noted in this regard that the IC tester is usually configured to permit withdrawal of tester heads rearwardly of the handler, in consideration of the considerable weight of the tester head as well as the fact that tester heads are exchanged in accordance with the type of ICs to be tested, the contents of the test, the size of test trays used, and others.

As will be appreciated, enlarging the size of a tester head in an attempt to increase the number of IC sockets which can be mounted on the tester head would require an enlarged space available for mounting the large-sized tester head, resulting in oversizing the handler, which would ultimately lead to a considerable enlargement of the IC tester as a whole, taking into account also the space needed to facilitate the withdrawal of the tester head rearwardly of the handler. In addition, the increased weight of the tester head will also cause the problem of a single operator being unable to carry out the operation of exchanging the tester heads. In view of this, it is preferable that the size of the tester head be as small as possible, and its size is generally specified depending on the size of test trays used.

Figure 14:
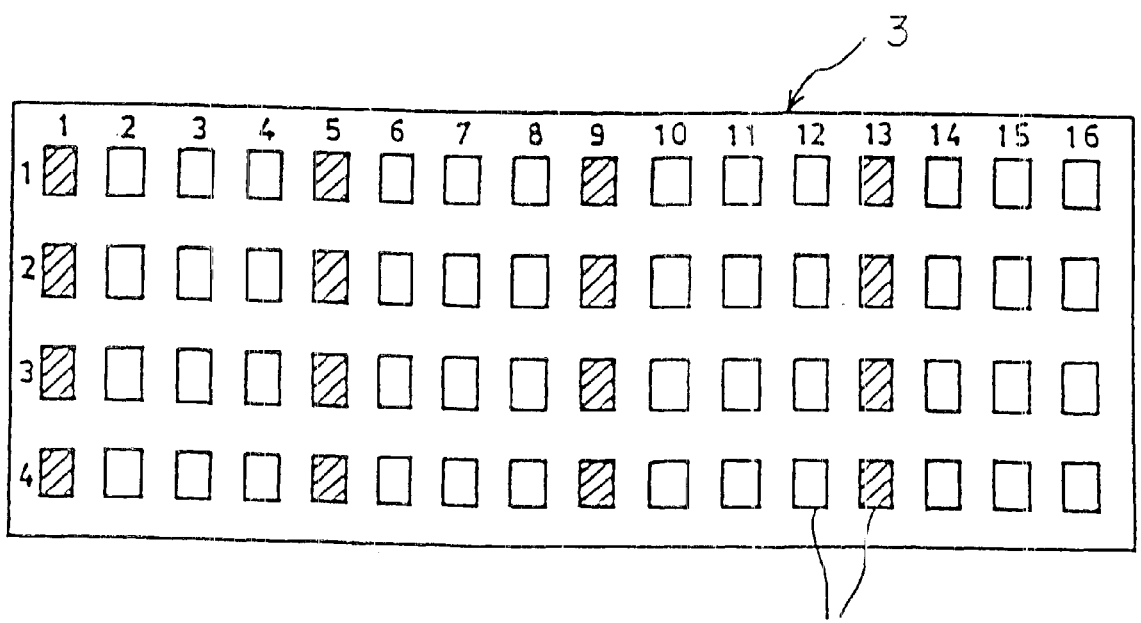
FIG. 14 is a plan view illustrating the order in which the ICs stored in a test tray are subjected to testing.
Figure 15:
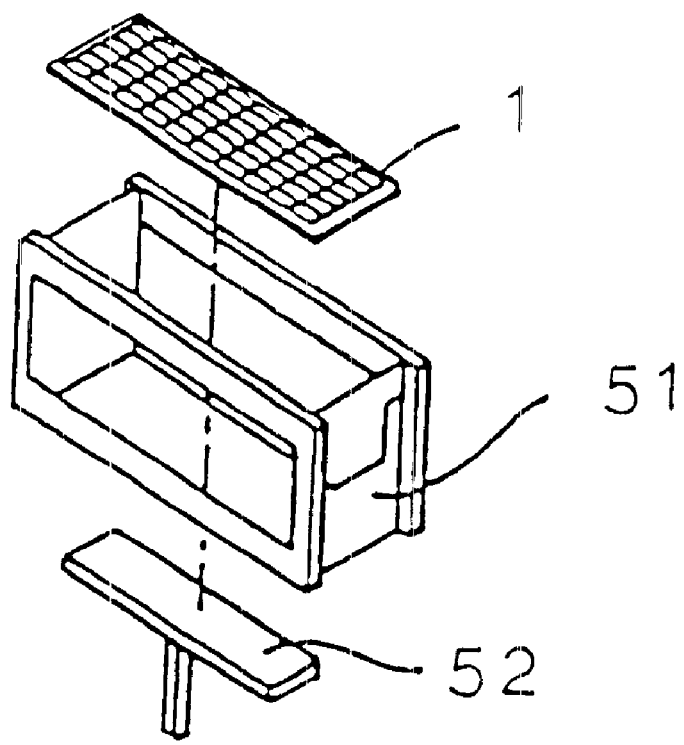
FIG. 15 is a perspective view illustrating the construction of an IC storage rack for use with the semiconductor device testing apparatus shown in FIG. 11.

In this regard, mounted on the top of the tester head is a performance board on which IC sockets are mounted. Since the size of fixture (which is called Hi-fix in the art concerned) for mounting the tester head in the testing section 42 of the constant temperature chamber 4 is determined depending on the size of the tester head, there is a limit to the number of IC sockets which can be mounted on the performance board which is electrically connected through this performance board with the measuring circuit (including drivers, comparators and others) contained in the interior of the tester head. For instance, when the test tray 3 as shown in FIG. 12 is sized to accommodate sixty-four ICs, it is possible to mount up to thirty-two IC sockets on the performance board. Accordingly, in the case that the loading capacity of the test tray is sixty-four pieces, it is a practice to test the ICs in two lots, each lot comprising thirty-two (half the total number) ICs for simultaneous testing, since the number of ICs which can be tested simultaneously (simultaneous measurement through put in number) is thirty-two at maximum. It is thus impossible to simultaneously test all of sixty-four ICs on the test tray 3 in the testing section 42. It is noted that in some instance sixteen IC sockets may be mounted on the tester head as noted with reference to FIG. 14.

If the number of ICs which can be loaded on a test tray is increased by enlarging the test tray by increasing the Y-axis and/or X-axis dimensions, it would be possible to correspondingly increase the size of the tester head whereby the number of IC sockets may be mounted on the tester head (performance board) could be augmented, leading to an increase in the number of ICs which can be simultaneously tested in the testing section 42. Eventually, the IC testing time required in the testing section 42 could be reduced.

However, simply enlarging the external size of the test tray 3 is not preferable since it would exert various effects on the various parts of the entire IC tester.

The reasons for this are as follows: As shown in FIGS. 1 and 11, the constant temperature chamber 4 contains the soak chamber 41 and the testing section 42 adjoining the former on the right side thereof as viewed in the X-axis direction, and adjoining testing section 42 on the right side thereof in the X-axis direction is the exit chamber 5. Further, the loader section 7 and unloader section 8 are disposed in front of the constant temperature chamber 4 and the exit chamber 5, respectively an adjoin them in the Y-axis direction. These soak chamber 41, testing section 42, loader section 7 and unloader section 8 are all indispensable components for the IC tester, and none of them can be eliminated.

Assuming here that the loading capacity of the test tray was doubled by simply doubling the external size of the test tray 3 in the Y-axis dimension while retaining the external size in the X-axis dimension as such, the surface area of the test tray 3 would be increased by two, necessitating the region required of the soak chamber 41 and testing section 42 in the constant temperature chamber 4 to be doubled. With regard to the loader section 7 and unloader section 8 as well, about two-fold region would likewise be required for at least the path of transport for the test tray. Consequently, if the external size of the test tray 3 in the Y-axis dimension was doubled with an attendant two-fold increase in the surface area of the test tray 3, the Y-axis (forward-rearward direction) dimension of the IC tester summing up the constant temperature chamber 4 (or the exit chamber 5) and the loader section 7 (or the unloader section 8) would be increased by about two, since 2+2=4 in the prior art example.

However, in the case that two paths of test tray transport extending from the soak chamber 41 through the testing section 42 to the exit chamber 5 are provided as in the first embodiment described above, the regions required of the soak chamber 41, the testing section 42 and the exit chamber 5, respectively are doubled, but since the regions required of the loader section 7 and unloader section 8 remain the same in size (one-fold) as in the illustrated prior art IC tester, the Y-axis (forward-rearward direction) dimension of the IC tester summing up the constant temperature chamber 4 (or the exit chamber 5) and the loader section 7 (or the unloader section 8) will be increased by only one and a half as 2+1=3.

As discussed above, in contrast to the case where the surface area or loading capacity of the test tray is doubled, the first embodiment according to the present invention provides the advantage that the region required of the IC tester need only have the Y-axis (forward-rearward direction) dimension of the IC tester summing up the constant temperature chamber 4 (or the exit chamber 5) and the loader section 7 (or the unloader section 8) solely increased by about one and a half in spite of the fact that the number of ICs which can be simultaneously tested in the testing section 42 has been doubled. Namely, because of the presence of the storage section 11 for storing universal trays, the increase in the surface area of the IC tester (handler) in terms of the Y-axis direction is less than a factor of 1.5, so that the size of the IC tester as a whole is not so large.

Further, as noted above, the test tray 3 comprises a rectangular frame 30 and a multiplicity of IC carriers 34 for ICs, supported by the frame 30, and all of these parts are made of the aforementioned material capable of withstanding test measurements under a wide range of temperatures from −55° C. to +125° C. An aggregate of sixty-four IC carriers 34 has a considerably heavy weight. The frame 30 supporting IC carriers is also of a considerably heavy weight since it need be of construction sturdy enough to support such considerably heavy IC carriers 34. Consequently, the sum of the weight of sixty-four IC carriers 34 on the test tray and the weight of the frame 30 is so significant. On top of that, doubling the external size of the test tray 3 in the Y-axis dimension would also increase the weight thereof by about two.

In this regard, when test trays are initially loaded in the handler or replaced, a single operator usually carries a plurality of test trays stacked one on another, but an increase in the weight of the test tray as mentioned above would make it difficult for a single operator to handle such test trays.

In addition, since the frame 30 and cleats 31 of the test tray 3 are constructed of aluminum alloy and exposed to a wide range of temperatures ranging over 180° C. from −55° C. to +125° C., the external size of the test tray is highly influenced by thermal expansion/contraction. Doubling the external size of the test tray 3 in the Y-axis dimension would naturally result in increasing the thermal expansion/contraction by a factor of two. Such increased thermal expansion/contraction of the test tray 3 is very likely to reduce the accuracy of electrical contact between ICs placed on the test tray and the IC socket mounted on the performance board of the tester head.

However, the first embodiment according to the present invention described above permits the use of the conventional test tray as such, because two of the paths of test tray transport are provided only for that portion of the path extending from the soak chamber 41 through the testing section 42 to the exit chamber 5 whereas the path of test tray transport extending from the exit chamber 5 through the unloader section 8 to the soak chamber 41 remains single as in the illustrated prior art IC tester. Accordingly, the first embodiment is not distinguished at all from the prior art IC tester with respect to the weight and thermal expansion/contraction of the test tray.

It should be noted here that in the case that the time required per test in the testing section 42 is short, there is little need for enhancing the simultaneous measurement throughput in number of ICs as is the case with the first embodiment, but that it is of more importance to further increase the number of ICs that can be handled per unit time by the transporting and handling mechanism including the X-Y transports 71 and 81 for the loader section 7 and the unloader section 8, respectively (reduce the time required for handling ICs). However, increasing the number of ICs handled per unit time involves a fairly high cost, and it is difficult to increase the number of ICs handled beyond a certain limit.

Figure 2:
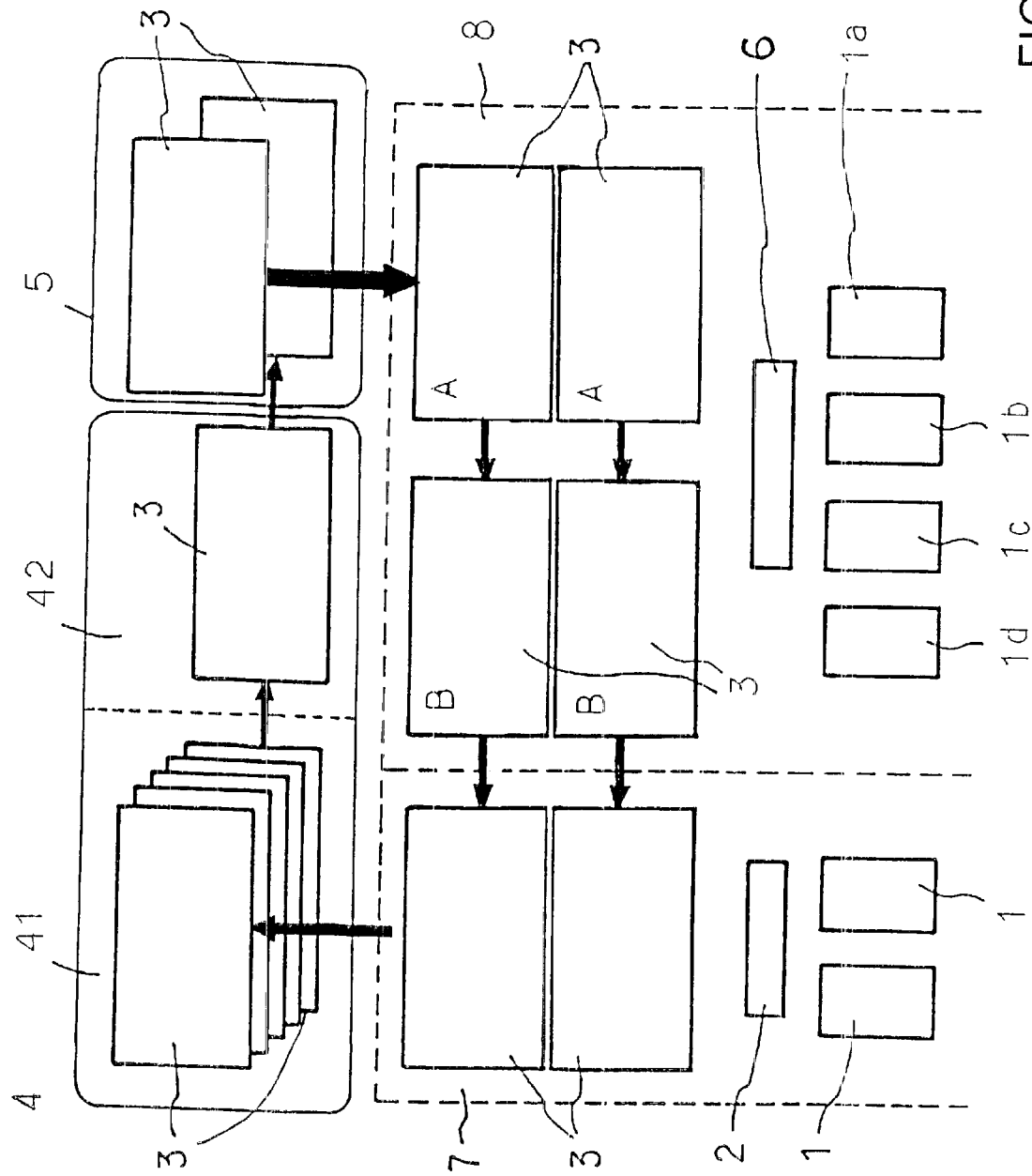
FIG. 2 is a plan view illustrating the general construction of a second embodiment of the semiconductor device testing apparatus according to the present invention.

In view of this, it is preferable that the configuration according to the second embodiment of the present invention as illustrated in FIG. 2 be employed in the case of relatively short time required per test in the testing section 42. As will be appreciated from FIG. 2, in the second embodiment, although the path of test tray transport is single for that portion of the path extending from the soak chamber 41 through the testing section 42 to the exit chamber 5 as in the illustrated prior art IC tester, the depth (length in the Y-axis direction) of the loader section 7 and the unloader section 8 is expanded by a dimension corresponding approximately to one transverse width (length of the minor edge) of the rectangular test tray 3, and two generally parallel paths of transport for test trays 3 are provided for the section of the transport path extending from the unloader section 8 to the loader section 7 so that two test trays 3 as shown may be simultaneously transported along these two paths of transport.

Accordingly, in this second embodiment as well, the total width (length in the Y-axis direction) of the two paths of transport is approximately equal to the sum of transverse widths of two test trays, so that provision of two paths of transport increases the depth (length in the Y-axis direction) of the IC tester only by a dimension corresponding approximately to the length of the minor edge of the test tray 3.

In order to further increase the number of ICs that can be handled by the transporting and handling mechanism including the X-Y transports 71 and 81 for the loader section 7 and the unloader section 8, respectively, it would be ideal, to use a transporting and handling mechanism, for example capable of placing sixty-four ICs to be tested from a universal tray into all of the sixty-four IC carriers 34 of a test tray 3 in one operation in the loader section 7 and picking up (grasping) all of sixty-four tested ICs from the test tray 3 in one operation in the unloader section 8. However, such transporting and handling mechanism is not currently in practical use.

However, although it is impossible to grasp all of sixty-four ICs to be tested or already tested (corresponding in number to the loading capacity of one test tray) at a time, it is possible to have the transporting and handling mechanism including the X-Y transports 71 and 81 grasp more than eight, say ten, or twelve ICs to be tested or already tested all at a time. To this end, it is required that there be as many ICs to be tested or already tested as possible present in the loader section 7 and the unloader section 8, respectively. The reason is that if the number of ICs to be tested or already tested present in the loader section 7 and the unloader section 8, respectively is greater as compared to the number of ICs that can be handled by the X-Y transports 71 and 81 (the number of pick-up pads of the movable head (pick-and-place head)), there would be less probability that some of the pick-up pads of the movable heads of these X-Y transports might be moved in an empty state (grasping no ICs), ensuring more efficient transportation of ICs, even if the number of ICs that can be simultaneously handled by the X-Y transports 71 and 81.

This is the reason that in the second embodiment illustrated in FIG. 2, two generally parallel paths of transport for test trays are provided for the section of the tray transport path extending from the unloader section 8 to the loader section 7 and that the unloader section 8 provides for halting four test trays in all, two test trays at each of the first and second positions A and B while the loader section 7 provides for halting two test trays therein.

This arrangement increases the number of tested ICs present in the unloader section 8 by a factor of two as compared to the prior art IC tester to thereby permit the transporting and handling mechanism including the X-Y transport 81 to transfer tested ICs efficiently. In addition, as there are two test trays standing at rest in the loader section 7, the transporting and handling mechanism including the X-Y transport is capable of transferring ICs under test from two universal trays loaded with ICs under test and held at the universal tray set position 12 in the loader section 7 onto the two test trays in an efficient manner. Consequently, this arrangement produces the advantage of reducing the testing time of the IC tester as a whole.

The advantages of the second embodiment described above will now be explained on the basis of specific numeral values concerning the unloader section 8 with reference to FIG. 3.

FIG. 3 illustrates the categories of sixty-four tested ICs placed on a test tray 3 at a standstill in the unloader section 8. Specifically, FIG. 3(a) illustrates the case where there is one path of transport for test trays for the section of the tray transport path extending from the unloader section 8 to the loader section 7, as is the case with the prior art IC tester whereas FIG. 3(b) illustrates the case where there are two paths of transport for test trays for the section of the tray transport path extending from the unloader section 8 to the loader section 7. While in the case of FIG. 3(b) two test trays are both shown as having tested ICs of like categories placed in like positions, this is only an example. It will be obvious to one skilled in the art that the positions allotted to the various categories may often vary from one tray to another.

As is apparent from FIG. 3, in this example most of the tested ICs placed on one test tray 3 belong to the category 1 with a few ICs belong to the categories 2 and 3 (the numerals 1, 2 and 3 marked in the test tray 3 representing the categories).

The movable head of the X-Y transport is provided with four pick-up pads. Except for the number of transporting travels for the tested ICs of the category 1, the transporting travel of the movable head of the X-Y transport is executed two times in total, one for each of the tested ICs of the categories 2 and 3 in the case of FIG. 3(a). Likewise in the case of FIG. 3(b), since two test trays 3 are at a standstill in the first position A, the movable head makes two transporting travels in total, one for each of the tested ICs of the categories 2 and 3.

As noted above, the number of transporting travels of the movable head is equally two for the tested ICs of the categories 2 and 3 both in the case of FIG. 3(a) and in the case of FIG. 3(b). It should be noted that there is only one test tray at a standstill in the case of FIG. 3(a) whereas in the case of FIG. 3(b) there are two test trays at a standstill. Otherwise stated, in the case of FIG. 3(a) since the same transporting motions are repeated for two test trays, the total number of transporting travels of the movable head amounts to four, that is, twice the total number of transporting travels in the case of FIG. 3(b). It will thus be appreciated that the IC tester according to the second embodiment described above improves the transporting efficiency in the unloader section 8 by a factor of two.

If the number of categories of tested ICs is further increased, there may be more categories of tested ICs than the number of universal trays held at the universal tray set position 12 in the unloader section 8. As already explained, such instance necessitates the operation of replacing universal trays in which some of the universal trays located in the universal tray set position 12 are returned to the storage section 11 and in replacement, the universal trays for the corresponding category or categories. This replacement operation, however, takes a considerably long time, leading to the problem of prolonging the testing time.

In order to minimize the required frequency of universal tray replacement, it is preferable that as many tested ICs as possible be disposed in the unloader section 8. For, in the case that there are not many tested ICs placed on the test trays at rest in the unloader section 8, if the operation of replacing universal trays is required to sort and handle tested ICs placed on a first test tray, then there is a high likelihood that the universal tray replacing operation may be necessitated also to sort and handle tested ICs placed on a second test tray.

Incidentally, if the number of tested ICs placed on a test tray 3 is doubled, it is presumed that the required frequency of universal tray replacement may be reduced by half. As indicated hereinbefore, doubling the loading capacity of the test tray 3 by simply doubling the external size of the test tray in the Y-axis dimension while retaining the external size in the X-axis dimension as such would be accompanied with the various problems as mentioned above. However, when as in the second embodiment two paths of transport for test trays are provided for the section of the transport path extending from the unloader section 8 to the loader section 7 so that two test trays may be simultaneously transported, two test trays naturally provide twice the loading capacity of one test tray, and yet none of the aforementioned various problems occur. Besides, additional advantages are provided that the configuration and size of the constant temperature chamber 4 and the exit chamber 5 is not affected in any way and that the conventional test tray may be employed as such.

The operation of the IC tester constructed according to the second embodiment described above will now be briefly explained. ICs to be tested are transferred from universal trays onto two test trays at a standstill in the first transport path (the upper transport path as viewed in the drawing) and the second transport path (the lower transport path as viewed in the drawing), respectively in the loader section 7. When the test tray in the first transport path is filled, it is conveyed into the soak chamber 41 to be placed on the uppermost test tray supporting stage of the vertical transport mechanism in the soak chamber. Once the newly received test tray has been lowered to the next lower test tray supporting stage by the vertical transport mechanism, the next test tray filled with ICs to be tested is conveyed from the second transport path into the soak chamber 41 to be placed on the uppermost test tray supporting stage of the vertical transport mechanism.

When both of the two transport paths in the loader section 7 are depleted of the test trays, two test trays emptied subsequent to completion of the sorting operation of tested ICs are transported from the unloader section 8 to the loader section 7. When the second position B in the unloader section 8 is vacated, two test trays at rest at the first position A are transported through the two respective transport paths from the first positions A to the second position B subsequent to completion of the sorting operation at the first position A. Upon depletion of the test trays from both of the two transport paths in the unloader section 8, test trays loaded with tested ICs relieved of heat/cold are delivered from the uppermost test tray supporting stage of the vertical transport mechanism in the exit chamber 5 to the first position A in the second transport path in the unloader section 8, whereafter test trays loaded with tested ICs as newly raised to the uppermost test tray supporting stage of the vertical transport mechanism in the exit chamber 5 are discharged to the first position A in the first transport path in the unloader section 8.

The operation of the vertical transport mechanism in the soak chamber 41, the testing (measurement) in the testing section 42, the operation of the vertical transport mechanism in the exit chamber 5, etc. are identical to those in the prior art IC tester shown in FIG. 11, and further description is omitted. In this embodiment as well, a position corrector 2 for correcting the orientation or position of an IC called "preciser" is located between the universal tray set position 12 and the stop position for the test tray 3. The function of this IC position corrector 2 has already been described hereinbefore, and further description is omitted.

Further, the sorting operation, the universal tray replacement operations, etc. in the unloader section 8 are also essentially the same as in the prior art IC tester shown in FIG. 11 except that the number of test trays handled is doubled, and will not be described repeatedly. It should only be noted that as an alternative arrangement, separate X-Y transports may be provided for the first and second positions A and B to further enhance the rate of handling tested ICs. In addition, the IC accommodating capacity of the buffer 6 disposed between the stop positions A and B for the test tray and the locations of the universal trays 1a–1d may be increased so as to the number of tested ICs which can be temporarily kept in the buffer section 6.

As in the illustrated prior art IC tester, a tray transport, although not shown in FIG. 2, is disposed above the IC-to-be-tested storage racks and the tested-IC storage racks for movement over the entire extent of those storage racks in the direction of arrangement of the racks (in the X-axis direction). The operation of this tray transport has already been described before, and no further description is repeated here.

In the construction according to the second embodiment described, while there is only one path of transport for the test tray running from the loader section 7 through the soak chamber 41 and the testing section 42 in the constant temperature chamber 4 and the exit chamber 5 to the unloader section 8 as in the illustrated prior art IC tester, two such paths are provided for the transport from the unloader section 8 to the loader section 7. It is thus to be understood that this construction permits four test trays in all, two for each of the first and second stop positions A and B in the unloader section 8 to be halted, despite the fact that the conventional test trays are used as such. Accordingly, the presence of twice as many as tested ICs as in the prior art in the unloader section 8 permits the transporting and handling mechanism including the X-Y transport 81 to tested ICs more efficiently to thereby increase the throughput in number of tested ICs. Further, because of two test trays waiting in the loader section 7, the transporting and handling mechanism including the X-Y transport 71 is enabled to transfer ICs from universal trays onto the test trays in an efficient manner whereby the throughput in number of ICs to be tested maybe enhanced. In this way, this arrangement also provides the advantage of reducing the testing time of the IC tester as a whole and greatly cutting the testing cost per IC.

In addition, in the construction according to the second embodiment described above as well, the overall size of the IC tester need be enlarged only in depth by only about one length of the minor edge of the test tray in order to provide two paths of test tray transport extending from the soak chamber 41 through the testing section 42 to the exit chamber 5. Consequently, the advantage are obtained that the depth dimension of the entire IC tester may be made considerably smaller and that the apparatus may be manufactured less expensively, as compared to the construction which would result if in the prior art IC tester shown in FIG. 11 two of the arrangements comprising the unloader section 8 and the loader section 7 were provided in order to establish two paths of test tray transport extending from the unloader section 8 to the loader section 7.

As discussed above, the provision of two paths of test tray transport for the section of the path running from the soak chamber 41 through the testing section 42 to the exit chamber 5 in the first embodiment and for the section of the path extending from the unloader section 8 to the loader section 7 in the second embodiment, respectively make it possible to increase the simultaneous measurement throughput in number of ICs in the first embodiment and the number of ICs handled per unit time in the unloader section 8 and the loader section 7 in the second embodiment, respectively, even by the use of conventional test trays in both cases. It is noted, however, that the provision of two paths of test tray transport necessitates one independent drive means for each of the transport paths.

Figure 4:
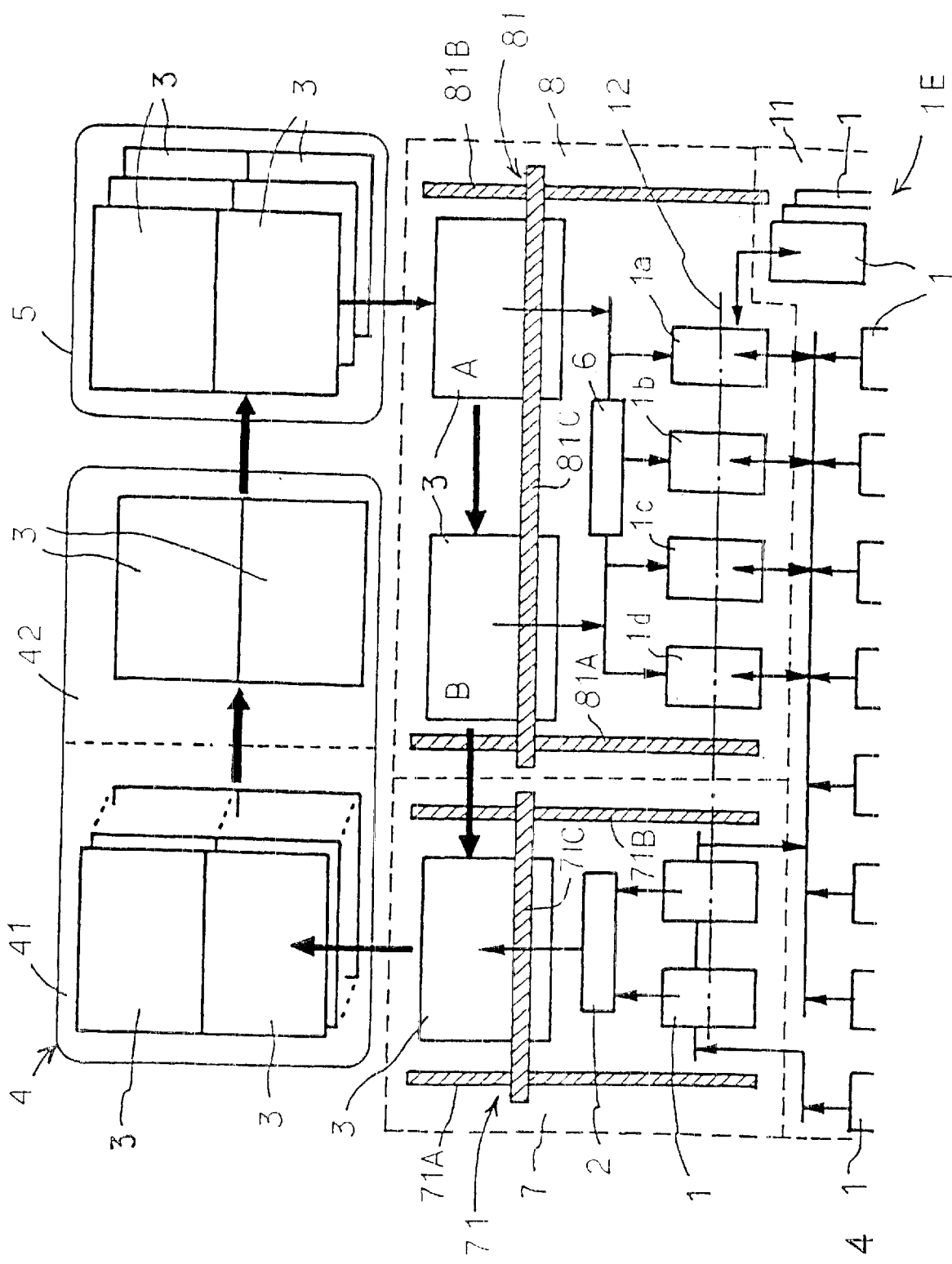
FIG. 4 is a plan view illustrating the general construction of a third embodiment of the semiconductor device testing apparatus according to the present invention.

FIG. 4 illustrates a third embodiment of the present invention in which the depth (length in the Y-axis direction) of the constant temperature chamber 4 and the exit chamber 5 is expanded as compared to the prior art IC tester by a dimension corresponding approximately to one transverse width (length of the minor edge) of the rectangular test tray 3 and in which a single widened path of transport for test trays is provided for the section of path extending from and through the soak chamber 41 and the testing section 42 in the constant temperature chamber 4 to and through the exit chamber 5 so that two test trays in engagement with each other, that is, in a state integrally joined together may be transported along the two paths of transport, whereby the need for providing two independent drive means for the test tray transport path.

In this third embodiment as well, the width (length in the Y-axis direction) of the widened path of transport is approximately equal to the sum of transverse widths of two test trays, so that the widened path increases the depth (length in the Y-axis direction) of the IC tester only by a dimension corresponding approximately to the length of the minor edge of the test tray 3. It is to be noted that in FIG. 4 the like parts and elements corresponding to those of FIG. 11 are designated by the same reference numerals and will not be discussed again in details, unless required.

Like the IC tester shown in FIG. 1, the IC tester illustrated in FIG. 4 is configured such that the constant temperature chamber 4 including the soak chamber 41 and testing section 42, and the exit chamber 5 are arranged in the left to right direction as viewed in the drawing (referred to as X-axis direction herein) in the rear portion of the IC tester while in front of the constant temperature chamber 4 and the exit chamber 5 there are located the loader section 7 and unloader section 8. The loader section 7 is adapted for transferring and reloading ICs under test onto test trays 3 capable of withstanding high/low temperatures while the unloader section 8 is adapted for transferring and reloading tested ICs which have been carried on the test tray 3 out through the exit chamber 5 subsequently to being tested in the testing section 42 of the constant temperature chamber 4 from the test tray 3 to the universal tray. Further, in the forefront of the IC tester there is located a storage section 11 for storing universal trays 1 loaded with ICs to be tested and universal trays 1 loaded with ICs already tested and sorted.

More specifically, the soak chamber 41, the testing section 42, and the exit chamber 5 are arranged in the order named from left to right in the X-axis direction in the drawing, and the loader section 7 and the unloader section 8 are located in front of the soak chamber 41 of the constant temperature chamber 4 and in front of the exit chamber 5, respectively. Accordingly, as in the conventional IC tester, the test tray 3 is delivered into the constant temperature chamber 4 in the direction (Y-axis direction) which is perpendicular to the direction (X-axis direction) in which it has been conveyed from the unloader section 8 to the loader section 7. From the constant temperature chamber 4, the test tray 3 is again delivered out in the direction which is perpendicular to the direction in which it has been introduced from the loader section 7. Likewise, from the exit chamber 5, the test tray 3 is delivered out in the direction which is perpendicular to the direction in which it has been introduced from the constant temperature chamber 4. From the unloader section 8, the test tray 3 is again discharged in the direction which is perpendicular to the direction in which it has been introduced from the exit chamber 5.

The test tray 3 may be of the same size and construction as that used with the conventional IC tester already described with reference to FIG. 11. That is, the test tray 3 has the construction as shown in FIG. 12. The test tray 3 is moved in a circulating manner from and back to the loader section 7 sequentially through the soak chamber 41 and the testing section 42 in the constant temperature chamber 4, the exit chamber 5, and the unloader section 8. In this path of circulating travel, there are disposed a predetermined number of test trays 3 which are successively moved in the directions as indicated by thick cross-hatched arrows in FIG. 1 by a test tray transport.

In this third embodiment of the invention, the depth (length in the Y-axis direction) of the constant temperature chamber 4 and the exit chamber 5 is expanded as compared to the prior art IC tester by a dimension corresponding approximately to one transverse width (length of the minor edge) of the rectangular test tray 3, and the width of the test tray transport path extending from the soak chamber 41 in the constant temperature chamber 4 through the testing section 42 in the constant temperature chamber 4 to the exit chamber 5 is made approximately equal to the sum of transverse widths of two test trays so that two test trays with their opposing major edges in engagement with each other as shown may be simultaneously transported.

The operation of the IC tester constructed as described just above will now be explained.

A test tray 3 having ICs under test loaded thereon from a universal tray 1 in the loader section 7 is conveyed with one of its major edges in the front from the loader section 7 to the constant temperature chamber 4 and is introduced into the soak chamber 41 through an inlet formed in the front side of the constant temperature chamber 4 The soak chamber 41 is equipped therein with a vertical transport mechanism adapted to support a plurality of (say, five) test trays 3 stacked one on another with predetermined spacings therebetween.

In this embodiment, each stage of the vertical transport mechanism for supporting test trays thereon has a depth approximately equal to the sum of transverse widths of two test trays. The first test tray 3 received from the loader section 7 is placed and supported on the uppermost stage of the vertical transport mechanism in the back half section (the upper half section as viewed in the Y-axis direction) of that stage. The vertical transport mechanism is at a standstill until two test trays are transported onto the uppermost stage. Once the second test tray 3 has been transported from the loader section 7 onto the uppermost stage of the vertical transport mechanism and accommodated in the front half section (the lower half section as viewed in the Y-axis direction) of the stage in abutment and engagement with the first test tray, the vertical transport mechanism is actuated to move the test trays on the successive stages downwardly by one stage in the vertical direction (which is referred to Z-axis direction). Alternatively, the arrangement may be such that after the first test tray has been placed into the back half section on the uppermost stage of the vertical transport mechanism, the vertically downward movement of the vertical transport mechanism is stopped until the lapse of a predetermined period of time.

The vertical transport mechanism is configured to support two test trays with their opposing major edges in engagement with each other on each stage, that is, to support two test trays in a state integrally joined together, and is operative to move the two integrally joined test trays on each stage down successively to the next lower stage.

While two test trays on the uppermost stage are moved down through the successive stages to the lowermost stage, and during a waiting time until the testing section 42 is vacated (available for the next testing), the ICs to be tested on the two integrally joined test trays are loaded with a temperature stress of either a predetermined high or low temperature. Once the two test trays have been moved down to the lowermost stage, they, while in the integrally joined state, are simultaneously delivered out along the respective paths of transport through the outlet of the soak chamber 41 into the testing section 42 which on the left-hand side in the X-axis direction, adjoins and communicates with the lower portion of the soak chamber 41. It thus will be appreciated that the two test trays are delivered out of the soak chamber 41 in a direction perpendicular to the direction of introduction thereinto.

The testing section 42 is equipped with a single tester head (not shown) disposed at the corresponding position below the path of transport for two integrally joined test trays. Mounted on the top of this tester head (performance board) are device sockets (not shown) at predetermined positions underlying the corresponding test trays. The two integrally joined test trays almost simultaneously delivered out of the soak chamber 41 are transported to over these device sockets, and then a predetermined number of ICs under test out of those loaded on the test trays are brought into electrical contact with the corresponding device sockets mounted on the tester head while the ICs are placed on the test trays.

Upon completion of testing on all of the ICs on the two integrally joined test trays through the tester head, those two test trays, while in the integrally joined state, are transported to the right in X-axis direction from the testing section 42 to the exit chamber 5 where the tested ICs are relieved of heat or cold.

It is to be noted that two tester heads, one associated with each of the two integrally joined test trays may be provided at predetermined positions underlying the test tray transport path. Those tester heads may have mounted thereon device sockets adapted to contact with the ICs on the two test trays corresponding to the two tester heads.

Like the soak chamber 41, the exit chamber 5 is also equipped with a vertical transport mechanism adapted to support a plurality of (say, five) test trays 3 stacked one on another with predetermined spacings therebetween.

In this embodiment, each stage of the vertical transport mechanism for supporting test trays thereon in the exit chamber 5 has an inlet sized to be approximately equal to the sum of transverse widths of two test trays and approximately equal to one length of the major edge of the test tray (corresponding to the dimension of the inlet of the exit chamber 5 as measured in the Y-axis direction) and a depth approximately equal to one length of the major edge of the test tray (corresponding to the dimension of the outlet of the exit chamber 5 as measured in the X-axis direction). Two test trays in the integrally joined state introduced along the path of transport from the testing section 42 are placed on and supported by the lowermost stage of the vertical transport mechanism.

Once two test trays in the integrally joined state have been transported from the testing section 42 onto the lowermost stage of the vertical transport mechanism, the vertical transport mechanism is actuated to move the test trays on the successive stages upwardly by one stage in the vertical direction. While two integrally joined test trays on the lowermost stage are moved up to the uppermost stage by the upward movement of the successive stages by actuation of the vertical transport mechanism, the tested ICs are relieved of either heat or cold to be restored to the outside temperature (room temperature).

As already noted, since the IC test is conducted on ICs having any desired temperature stress in a wide range of temperatures such as from −55° C. to +125° C. imposed thereon in the soak chamber 41, the exit chamber 5 cools the ICs with forced air down to the room temperature if the ICs have had a high temperature of, say, about 120° C. applied thereto in the soak chamber 41. If ICs have had a low temperature of, say, about −30° C. applied thereto in the soak chamber 41, the exit chamber 5 heats them with heated air or a heater up to a temperature at which no condensation occurs.

After the heat removal or cold removal process, the test tray located on the front half section of the uppermost stage of the vertical transport mechanism is conveyed from the exit chamber 5 to the position A at the unloader section 8 through the outlet of the exit chamber extending in the direction (facing on the front of the exit chamber 5) perpendicular to that in which it has been introduced from the testing section 42 into the exit chamber 5. Disposed closest to the first position A are universal trays 1a and 1b. Assuming that classification categories 1 and 2 are allotted to these universal trays 1a and 1b, respectively, while the test tray 3 is stopped at the first position A, only the tested ICs belonging to the categories 1 and 2 are picked up from the test tray 3 held at the first position A, and transferred onto the corresponding universal trays 1a and 1b, respectively. Once the test tray 3 at rest at the first position A has been depleted of the ICs belonging to the categories 1 and 2, the test tray is moved to the second position B.

Arranged closest to the second position B are universal trays 1c and 1d. Assuming that classification categories 3 and 4 are allotted to these universal trays 1c and 1d, respectively, the tested ICs belonging to the categories 3 and 4 are picked up from the test tray 3 held at the second position B and transferred onto the corresponding universal trays 1c and 1d, respectively.

Next, the other test tray 3 located on the back half section of the uppermost stage of the vertical transport mechanism is conveyed from the exit chamber 5 through the outlet thereof to the position A at the unloader section 8 and is halted at that position. The conveyance of the first test tray to the unloader section 8 takes place either concurrently with or after the conveyance of the preceding test tray from the position A to the position of the unloader section 8.

In this embodiment as well, it is noted that the number of universal trays 1 that can be installed at the universal tray set positions 12 in the unloader section 8 is limited to four by the space available. Hence, the number of categories into which ICs can be sorted in real time operation is limited to four categories 1 to 4 as noted above. While four categories would generally be sufficient to cover three categories for subclassifying "conforming articles" into high, medium and low response speed elements in addition to one category allotted to "non-conforming article," in some instances there may be some among the tested ICs which do not belong to any of these categories. Should there be found any tested ICs which should be classified into a category other than the four categories, a universal tray 1 assigned to the additional category should be taken from the empty tray storage rack 1E (the lower right corner area in FIG. 1) of the IC storage section 11 and be transported into the unloader section 8 to store the ICs of the additional category. When this is to be done, it is also needed to transport any one of the universal trays positioned in the unloader section 8 to the IC storage section 11 for storage therein.

If the replacement of the universal trays is effected in the course of the sorting operation, the latter operation would have to be interrupted during the replacement. For this reason, this embodiment also disposes a buffer section 6 between the stop positions A and B for the test tray 3 and the locations of the universal trays 1a–1d for temporarily keeping the tested ICs belonging to a category of rare occurrence.

The buffer section 6 may have a capacity of accommodating, say about twenty to thirty ICs and be equipped with a memory portion for storing the category and locations of ICs placed in the individual IC pockets of the buffer section 6. With this arrangement, between the sorting operations or upon the buffer section 6 being filled with ICs, a universal tray for the category to which the ICs kept in the buffer section belong is carried from the IC storage section 11 to the universal tray set position 12 at the unloader section 8 to store the ICs in that universal tray. It should be noted that ICs temporarily kept in the buffer section 6 may be scattered over a plurality of categories. In that case, it would be required to transport as many universal trays as the number of categories at a time from the IC storage section 11 to the unloader section 8.

The test tray 3 emptied in the unloader section 8 is delivered back to the loader section 7 where it is again loaded with ICs being tested from the universal tray 1 to repeat the same steps of operation.

The IC transport 71 for transferring ICs from the universal tray 1 to the test tray 3 in the loader section 7 may be of the same construction as that used with the conventional IC tester already described, and may comprise a pair of opposed parallel rails 71A, 71B mounted over the loader section 7 at the ends thereof opposed in the X-axis direction and extending in the Y-axis direction, a movable arm 7IC spanning and mounted at opposite ends on the pair of rails 71A, 71B for movement in the Y-axis direction, and a movable head, not shown (pick-and-place head) carried on the movable arm 7IC for movement therealong longitudinally of the arm, that is, in the X-axis direction.

The movable head has an IC pick-up pad (IC grasping member) vertically movably mounted on its bottom surface. The movement of the movable head in the X-Y-axis directions and the downward movement of the pick-up pad bring the pick-up pad into abutment with the ICs placed on the universal tray 1 at rest at the universal tray set position 12 to attract and grasp them by vacuum suction, for instance for transfer from the universal tray 1 to the test tray 3. The movable head may be provided with a plurality of, say, eight pick-up pads so that eight ICs at a time may be transported from the universal tray 1 to the test tray 3.

The unloader section 8 is also equipped with an X-Y transport 81 which is identical in construction to the X-Y transport 71 provided for the loader section 7. The X-Y transport 81 is mounted spanning the first position A and the second position B and performs to transship the tested ICs from the test tray 3 delivered out to the positions A and B in the unloader section 8 onto the corresponding universal tray.

The X-Y transport 81 comprises a pair of spaced parallel rails 81A, 81B mounted over the unloader section 8 at the ends thereof opposed in the X-axis direction and extending in the Y-axis direction, a movable arm 8IC spanning and mounted at opposite ends on the pair of rails 81A, 81B for movement in the Y-axis direction, and a movable head, not shown (pick-and-place head) carried on the movable arm 7IC for movement therealong longitudinally of the arm, that is, in the X-axis direction.

In this third embodiment as well, a position corrector 2 for correcting the orientation or position of an IC called "preciser" is located between the universal tray set position 12 and the stop position for the test tray 3. The function of this IC position corrector 2 has already been described hereinbefore, and further description is omitted.

As in the illustrated prior art IC tester, a tray transport, although not shown in FIG. 4, is disposed above the IC-to-be-tested storage racks and the tested-IC storage racks for movement over the entire extent of those storage racks in the direction of arrangement of the racks (in the X-axis direction). There have already been described hereinabove the various operations of this tray transport including the operation of holding a universal tray 1 loaded with ICs under test at the universal tray set position in the loader section 7, the operation of holding four empty universal trays 1a–1d at the respective universal tray set positions 12 in the unloader section 8, the operation of storing a fully filled universal tray in the corresponding tray storage position, and the operation of, in the event that there may be found any tested IC which does not belong to any of the categories allotted to the designated universal trays held at the set positions 12, transporting to the set position in the unloader section 8 a universal tray storing such IC of an other category. Therefore, such description is not repeated here.

With the construction described above, while test trays are transported one by one in the section of the test tray transport path running from the exit chamber 5 through the unloader section 8 to the soak chamber 41 as in the illustrated prior art IC tester, two test trays in an integrally joined state are transported along a widened path in the section of the test tray transport path extending from the soak chamber 41 through the testing section 42 to the exit chamber 5. It is thus to be appreciated that this permits ICs under test placed on two test trays to be simultaneously tested in the testing section 42 in spite of the use of the conventionally used test tray as such, resulting in doubling the simultaneous measurement throughput in number of ICs. Consequently, in the case that a relatively long time is required per test in the testing section 42, the doubled simultaneous measurement throughput in number reduces the time required to complete the testing on all of the ICs (testing time of the IC tester) to nearly half, producing the advantage of greatly saving the testing cost per IC.

Besides, the provision of the single widened path of test tray transport in the section running from the soak chamber 41 through the testing section 42 to the exit chamber 5 requires only one independent drive means for transporting test trays, and needs only one set of equipment including sensors and detecting circuit for monitoring the position of the test tray, stop means for positioning the test tray, etc. All of this contributes to saving of the initial cost as well as the advantage of downsizing the entire test tray transporting system.

In addition, in the construction according to the third embodiment described above, the overall size of the IC tester need be enlarged only in depth by only about one length of the minor edge of the test tray. Consequently, the advantages are obtained that the depth dimension of the entire IC tester may be made considerably smaller and that the apparatus may be manufactured less expensively, as compared to the construction which would result if in the prior art IC tester shown in FIG. 11 two of the constructions comprising the soak chamber 41, the testing section 42 and the exit chamber 5 were provided in order to increase the simultaneous measurement throughput in number of ICs in the testing section 42 to the exit chamber 5.

It is noted here that in the case of the first embodiment, two test trays are transported almost simultaneously along two independent generally parallel paths of transport. Each of the test tray transports is rather bulky as it is equipped with its own equipment including sensors and detecting circuit for monitoring the position of the test tray, stop means for positioning the test tray, etc. as stated above. Moreover, a minimal space need be provided between the two paths of transport. In contrast, the third embodiment utilizes two test trays in an integrally joined state, and yet only one path of transport for the test tray, thereby permitting downsizing of the test tray transport and requiring no wasteful space. As a result, the third embodiment enables reducing the depth (length in the Y-axis direction) of the constant temperature chamber 4 and the exit chamber 5 as compared to the first embodiment. It is thus to be appreciated that the construction according to the third embodiment provides for further reducing the depth of the entire IC tester.

In the third embodiment the depth of the constant temperature chamber 4 and the exit chamber 5 is expanded by a dimension corresponding approximately to one transverse width (length of the minor edge) of the rectangular test tray 3, and the width of the test tray transport path extending from the soak chamber 41 through the testing section 42 to the exit chamber 5 is made approximately equal to the sum of transverse widths of two test trays so that two test trays in an integrally joined state may be simultaneously transported. However, in the case that the time required per test in the testing section 42 is relatively short, it is preferable that with the construction of the test tray transport path extending from the loader section 7 through the soak chamber 41 and the testing section 42 of the constant temperature chamber 4 and the exit chamber 5 to the unloader section 8 being retained as in the illustrated prior art IC tester, the depth (length in the Y-axis direction) of the loader section 7 and the unloader section 8 be expanded by a dimension corresponding approximately to one transverse width (length of the minor edge) of the rectangular test tray 3, and the width of the test tray transport path extending from the unloader section 8 to the loader section 7 be increased to be approximately equal to the sum of transverse widths of two test trays so that two test trays in an integrally joined state may be simultaneously transported.

Accordingly, the present invention contemplates a fourth embodiment, although not illustrated, in which in the construction similar to the second embodiment of the invention described before with reference to FIG. 2, the width of the test tray transport path extending from the unloader section 8 to the loader section 7 is expanded to be approximately equal to the sum of transverse widths of two test trays so that two test trays in an integrally joined state may be simultaneously transported as in the third embodiment described above.

In addition to the advantages obtained by the second embodiment, the construction of the fourth embodiment utilizes only one path of transport for the test tray in the section of path extending from the unloader section 8 to the loader section 7 to permit the use of a single drive means to transport test trays, hence requiring only one set of equipment including sensors and detecting circuit for monitoring the position of the test tray, stop means for positioning the test tray, etc., thereby providing the advantages of being economical and downsizing the entire test tray transporting system as well as the advantage of further reducing the depth of the entire IC tester as compared to the second embodiment.

Next, the construction of two test trays engageable with each other so as to be transported in an integrally joined state will be described.

Figure 5:
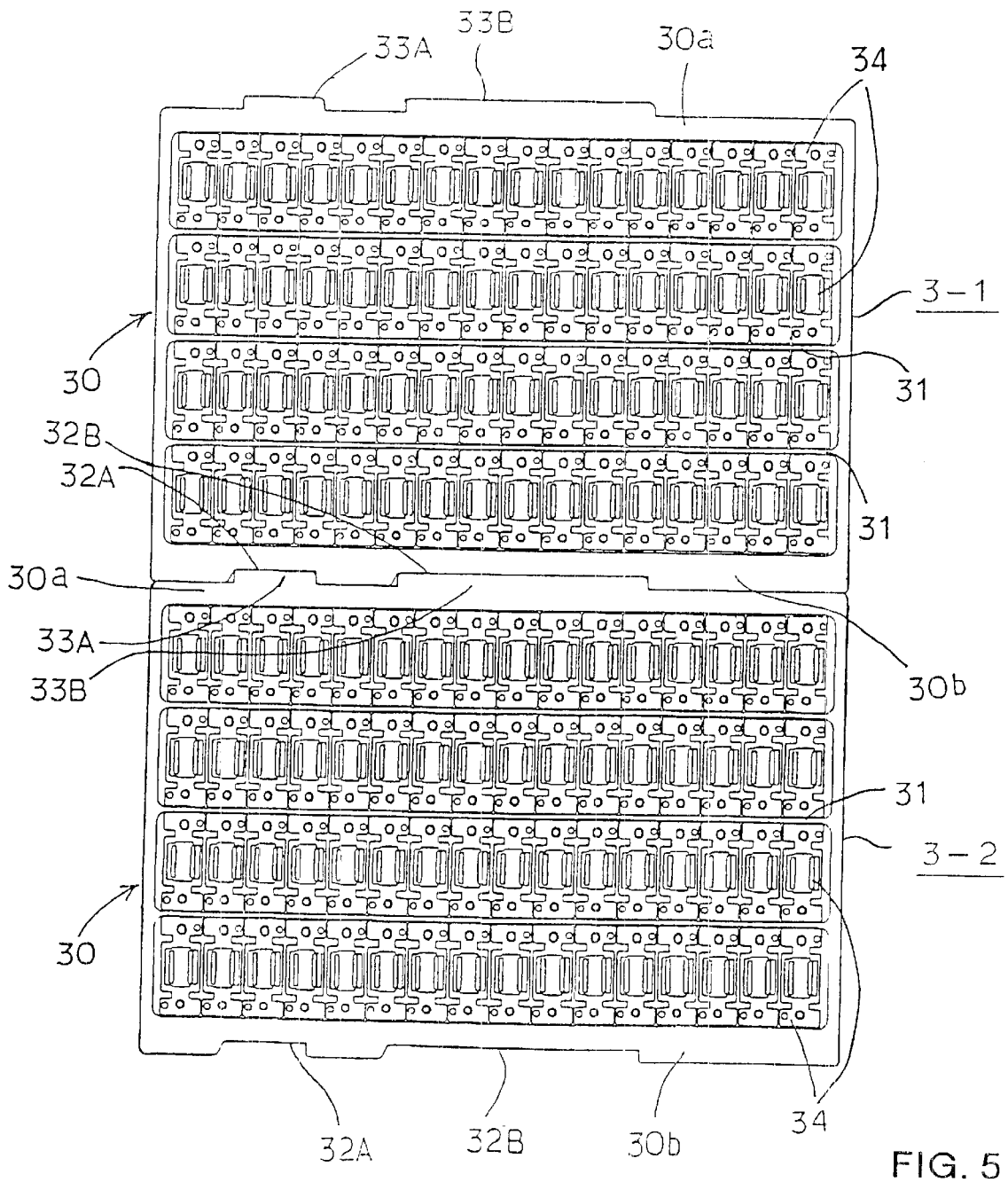
FIG. 5 is a plan view illustrating the engagement means for engaging two test trays with each other to integrally join them together.

FIG. 5 is a plan view illustrating one example of the construction of test trays integrally joinable with each other and showing two test trays 3-1 and 3-2 in engagement with each other. Each of the test trays shown in FIG. 5 is essentially the same as the conventional test tray 3 already described with reference to FIG. 12, and comprises a rectangular frame 30 having three equally spaced apart parallel cleats 31 between the opposed major side frame members 30a and 30b of the frame, and a multiplicity of (sixty-four in this example) IC carriers 34 mounted between each pair of opposed cleats 31 and between each of the side frame members 30a and 30b and the opposed cleats. These members are formed of the material as mentioned above.

Each of the illustrated test trays is different from the conventional test tray 3 in that the opposed major side frame members (which will be referred to simply as "major edge" hereinafter) 30a and 30b of the rectangular frame 30 are formed with two protrusions 33A, 33B and two recesses 32A, 32B, respectively. In this example, one major edge 30a (upper major edge as viewed in the drawing) of the frame 30 is formed with two differently shaped protrusions 33A, 33B at a predetermined spacing while the other major edge 30b (lower major edge as viewed in the drawing) is formed with two differently shaped recesses 32A, 32B mating with the protrusions 33A, 33B, respectively at positions corresponding to the protrusions 33A, 33B (positions generally with respect to the central cleat 31 of the frame 30). Otherwise, the configuration and construction of the test tray is identical to that of the test tray 3 shown in FIG. 12, and the description of the other parts is omitted.

With regard to the two protrusions 33A, 33B, one 33B of them is wider than the other protrusion 33A, and the wider protrusion 33B is formed generally in the middle of the major edge 30a while the narrower protrusion 33A is formed to the left in the drawing. Likewise, with regard to the two recesses 32A, 32B, one 32B of them is wider than the other recess 32A, and the wider recess 32B is formed generally in the middle of the major edge 30b while the narrower recess 32A is formed to the left in the drawing. It will thus be appreciated that two test trays are configured such that the protrusions 33A, 33B of one test tray are engaged (mated) with the recesses 32A, 32B of the other test tray only when the two test trays are arranged in the same orientation in the same horizontal plane.

In addition, the dimensions of the protrusions 33A, 33B are selected to be slightly smaller than those of the recesses 32A, 32B (or the dimensions of the recesses 32A, 32B are selected to be slightly larger than those of the protrusions 33A, 33B) such that there is a loose fit between the protrusions 33A, 33B and the recesses 32A, 32B.

As the test tray is exposed to a wide range of temperatures such as from −55° C. to +125° C. during the use as already noted, the external dimensions of the tray will be somewhat deformed due to thermal expansion/contraction. Without a certain play in the fit between the protrusions 33A, 33B and the recesses 32A, 32B, the test tray would not be able to take up deformations due to thermal expansion/contraction, but would possibly be dislodged out of mating engagement and be susceptible to deleterious influences such as bending and warping. This is the reason for the need of some looseness in the fit between the protrusions 33A, 33B and the recesses 32A, 32B.

As will be readily appreciated from FIG. 5, in the illustrated example each of the recesses 32A, 32B has its right side wall extending generally perpendicularly inwardly but its left side wall extending obliquely at an angle greater than 90° while each of the protrusions 33A, 33B has its left side wall extending generally perpendicularly outwardly but its right side wall terminating in a rounded outer end corner. Consequently, when the protrusions 33A, 33B of one tray 3-1 are fitted in the recesses 32A, 32B of the other tray 3-2, there will be clearances to the left side of the protrusions 33A, 33B as is seen in FIG. 5 while at the right hand top of the protrusions 33A, 33B will there be also small clearances though not clearly seen in FIG. 5. It will thus be understood that such looseness in the fit between the protrusions 33A, 33B and the recesses 32A, 32B adequately accommodates any deformations (thermal expansion/contraction) due to changes in temperature.

Figures 6A, 6B:
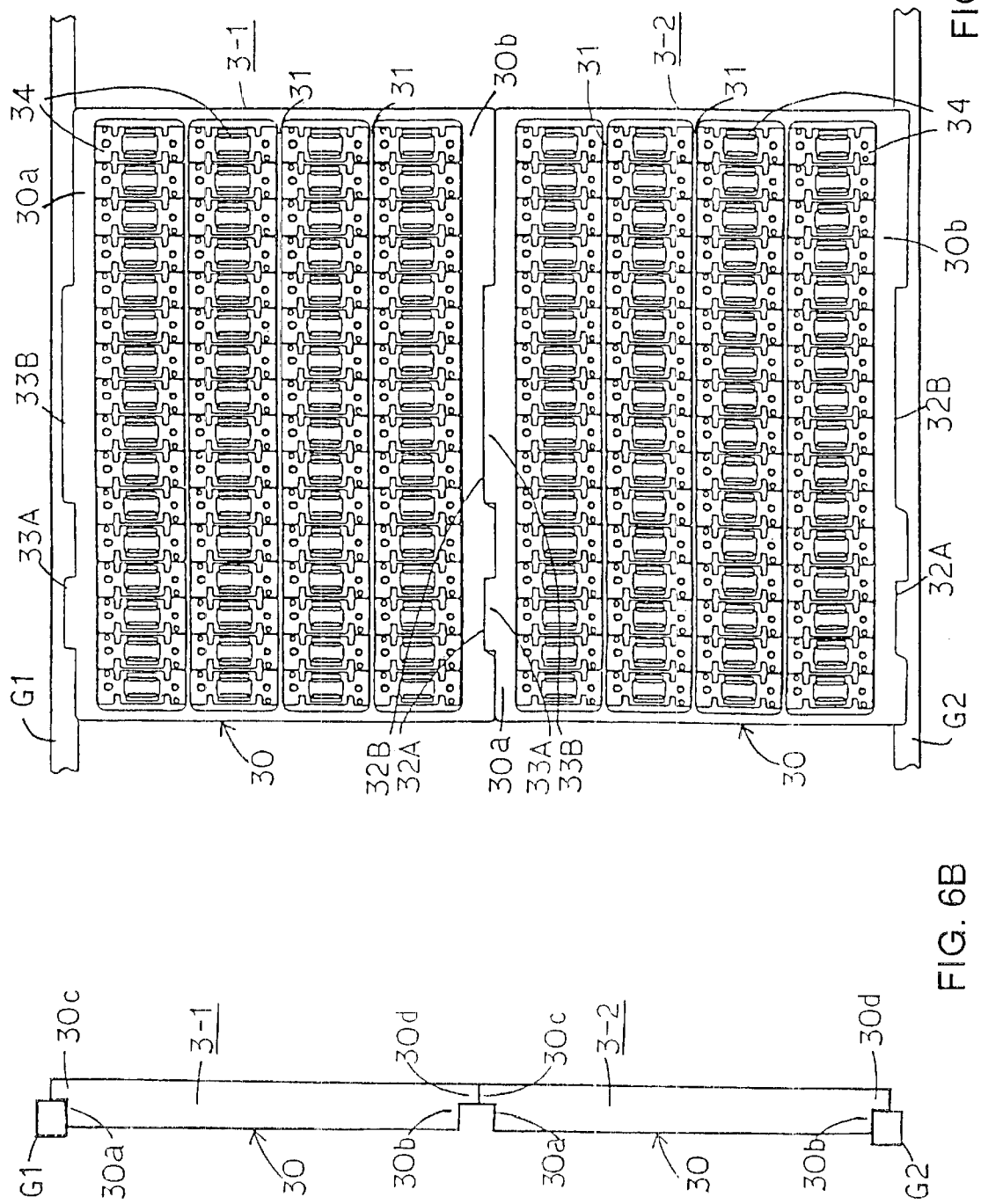
FIG. 6 is a representation illustrating one example of guide members of a transport for transporting two test trays in integrally joined state, FIG. 6A being a plan view and FIG. 6B being a side view as seen from the left side of FIG. 6A.

FIG. 6 is a side view illustrating the guide members of one example of the transport for transporting two test trays 3-1, 3-2 in an integrally joined state. The opposite major edges 30a, 30b of each test tray are formed with thin-walled extensions or flanges 30c, 30d, respectively extending outwardly and flush with the top surface of the frame 30. Two protrusions 33A, 33B are formed on the extension 30c of the major edge 30a while two recesses 32A, 32B are formed in the extension 30d of the major edge 30b. In the illustrated example, two protrusions 33A, 33B only remain as the thin-walled extension 30c of the major edge 30a while the thin-walled extension 30d of the major edge 30b remains except for two recesses 32A, 32B. In other words, the thin-walled extension 30d of the major edge 30b are left as three separated thin-walled extension portions 30d by forming two recesses 32A, 32B.

As shown in FIG. 6, a pair of opposed guide members G1, G2 having a rectangular cross-section are disposed in parallel so as to be in sliding engagement with the side surfaces of the major edges 30a, 30b at the opposite ends of two integrally joined test trays 3-1, 3-2 (major edge 30a of one test tray 3-1 and major edge 30b of the other test tray 3-2) and the undersurfaces of the thin-walled extensions 30c, 30d, respectively along the sections of the test tray transport path extending from the exit of the soak chamber 41 to the inlet of the testing section 42 and from the exit of the testing section 42 to the inlet of the exit chamber 5 in the third embodiment illustrated in FIG. 4, and along the section of the test tray transport path extending from the first position A in the unloader section 8 to the loader section 7 in the fourth embodiment, not illustrated, respectively. Support members, although not shown, are additionally disposed for supporting the undersurfaces of the test trays 3-1, 3-2.

In this way it will be readily appreciated that the pair of guide members G1, G2 disposed in parallel along the test tray transport path facilitates transporting two test trays 3-1, 3-2 while being integrally joined together by a single drive means from the exit of the soak chamber 41 to the inlet of the testing section 42 and then from the exit of the testing section 42 to the inlet of the exit chamber 5, or from the unloader section 8 to the loader section 7.

Although not illustrated, it is also to be appreciated that engagement (fitting) and disengagement of two test trays may be facilitated if the uppermost test tray supporting stage of the vertical transport mechanism in the soak chamber 41 is provided with a pair of guide members in sliding contact with the side surfaces of the opposed minor edges of each test tray as introduced from the loader section 7 and likewise the uppermost test tray supporting stage of the vertical transport mechanism in the exit chamber 5 is provided with a pair of guide members in sliding contact with the side surfaces of the opposed minor edges of each test tray. It is also to be noted that a pair of guide members slidingly engageable with the side surfaces of the opposed minor edges of each test tray may be provided if two test trays are to be engaged (mated) with each other at the position A in the unloader section 8 and likewise if two test trays in an integrally joined state are to be disengaged from each other in the loader section 7. In such instance, in the unloader section 8 the guide member closer to the second position B is arranged to be movable so that it may be moved out of the way not to interfere with two test trays in an integrally joined state as they advance to the second position B. Likewise, in the loader section 7 the guide member closer to the second position B is arranged to be movable so that it may be moved out of the way not to interfere with two test trays in an integrally joined state as they move from the second position B to the loader section 7.

When the test tray of the construction shown in FIG. 5 and the test tray transport described above are used in the third embodiment illustrated in FIG. 4, it will be easily appreciated that the first test tray 3 introduced from the loader section 7 is placed into the back half section of the uppermost test tray supporting stage of the vertical transport mechanism in the soak chamber 41 and is halted thereon until the second test tray 3 is introduced from the loader section 7 and is placed on the uppermost test tray supporting stage of the vertical transport mechanism whereupon the protrusions 33A, 33B of the second test tray come into fitting engagement with the recesses 32A, 32B of the first test tray to join the two test trays integrally together. Then, it will be easily understood that the two integrally joined test trays are conveyed from the lowermost supporting stage of the vertical transport mechanism along the single transport path to the testing section 42, followed by, upon completion of the testing on all of the ICs under test, being delivered, while still in the integrally joined state, from the testing section 42 to the exit chamber 5 whence after the heat removal or cold removal process, the test trays are transported successively one by one to the unloader section 8.

In a like manner, when the test tray of the construction shown in FIG. 5 and the test tray transport described above are used in the fourth embodiment, it will be easily appreciated that two of the test trays delivered successively one by one from the uppermost test tray supporting stage of the vertical transport mechanism in the exit chamber 5 to the first position A in the unloader section 8 united together into one by the protrusions 33A, 33B of the succeeding test tray fitting into the recesses 32A, 32B of the first discharged test tray. Then, upon completion of the sorting operation at the first position A, the two test trays are conveyed, while in the integrally joined state, from the first position A to the second position B where the sorting operation is completed prior to being conveyed, while still in the integrally joined state, from the second position B to the loader section 7.

It will be obvious to those skilled in the art that the configuration and number of the protrusions and recesses formed in each test tray may be arbitrarily varied and that the manner in which two test trays in the integrally joined state are supported by a pair of guide members G1, G2 is not limited to the illustrated embodiment.

Figure 7:
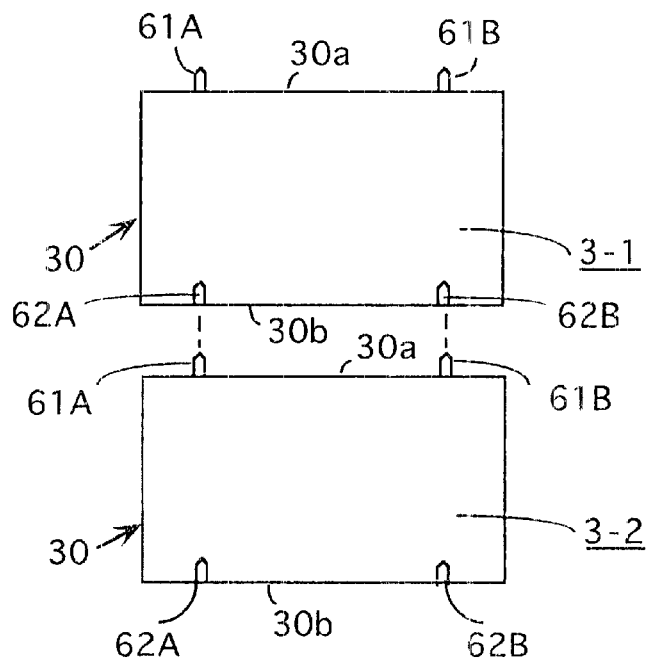
FIG. 7 is a representation illustrating another example of the engagement means for engaging two test trays with each other to integrally join them, FIG. 7A being a plan view, FIGS. 7B, 7C and 7D being perspective views, respectively and FIG. 7E being a cross-sectional view of FIG. 7D taken along the line 7E—7E.
Figure 7:
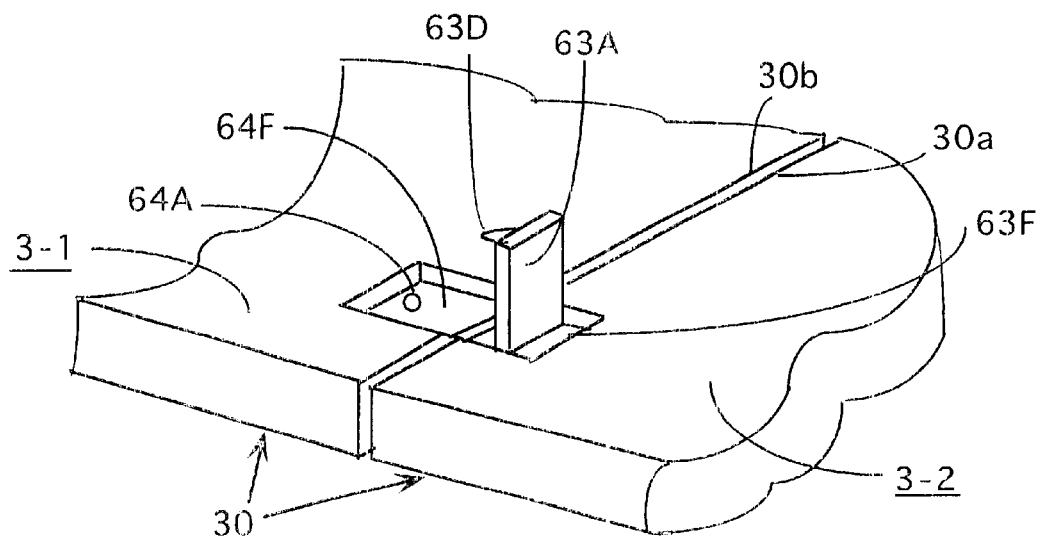
Figure 7:
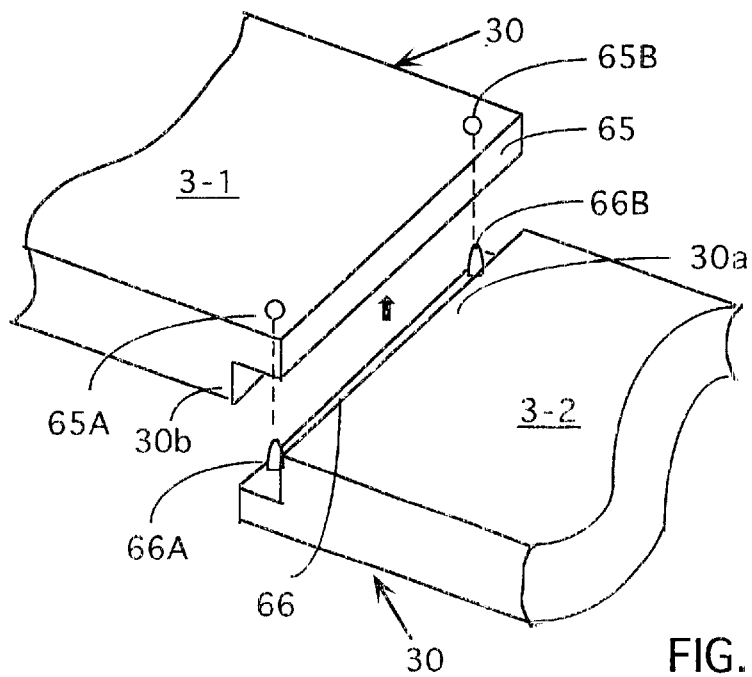
Figure 7:
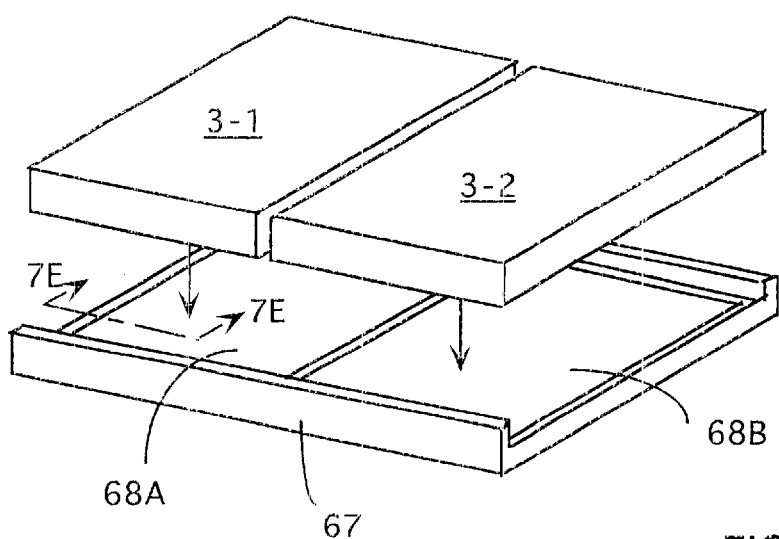
Figure 7:
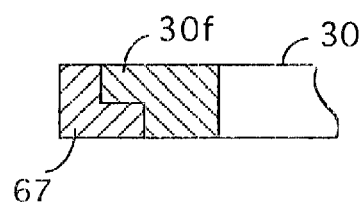

FIGS. 7A–7D are plan view and perspective views illustrating several other modified forms of the construction of integrally joinable test trays. In FIG. 7A, one major edge 30a (upper major edge as viewed in the drawing) of the frame 30 is provided with two outwardly protruding guide pins 61A, 61B at a predetermined spacing while the other major edge 30b (lower major edge as viewed in the drawing) is formed with two holes 62A, 62B mating with the guide pins 61A, 61B, respectively at positions corresponding to the guide pins 61A, 61B (positions generally line symmetrical with respect to the longitudinal central line of the frame 30).

It will be readily appreciated that the construction described just above permits two test trays 3-1 and 3-2 to be integrally joined together simply by bringing one preceding test tray already at a standstill in the soak chamber 41 or the unloader section 8 into abutment against the succeeding test tray. It is also noted that the dimensions of the guide pins 61A, 61B are sized to be slightly smaller than those of the holes 62A, 62B (or the dimensions of the holes 62A, 62B are selected to be slightly larger than those of the guide pins 61A, 61B) such that there is a loose fit between the guide pins 61A, 61B and the holes 62A, 62B.

FIG. 7B illustrates a modified form in which the opposed major edges 30a, 30b of each test tray are provided with dedicated latch means. Specifically, two engagement members 63A (one of which is visible in the drawing) which are swingable through an angle of 90° for example are mounted on the top surface of one major edge 30a (upper major edge as viewed in the drawing) of the frame 30 at a predetermined spacing. Formed in the other major edge 30b (lower major edge as viewed in the drawing) at positions corresponding to pins 63D extending downwardly from the undersurface of the engagement members 63A adjacent their outer ends (positions generally line symmetrical with respect to the longitudinal central line of the frame 30) are two holes 64A mating with the pins 63D, respectively.

Each engagement member 63A is pivotted at its inner end in an associated recess 63F formed in the one major edge 30a for pivotal movement over an angle range of 90° (from the horizontal position to the vertical position) and the outer end portion of the engagement member 63A having the pin 63D projects outwardly beyond the outer margin of the major edge 30a. The holes 64A in the other major edge 30b are provided within respective recesses 64F formed in that major edge 30b. The recesses 63F and 64F in the major edges 30a and 30b have a depth approximately equal to the thickness of the engagement member 63A.

It will be readily understood that the construction described just above permits two test trays 3-1 and 3-2 to be integrally joined together when one preceding test tray already at a standstill in the soak chamber 41 or the unloader section 8 is brought into abutment against the succeeding test tray with its (the succeeding tray's) engagement members 63A in its vertical orientation, followed by pivoting the engagement members 63A to fit their pins 63D into the corresponding holes 64A of the succeeding test tray. It is preferable that the dimensions of the engagement members 63A, the reesses 63F, 64F, the pins 63D and the holes 64A be sized such that there is a loose fit between the engagement members 63A and the reesses 63F, 64F and between the pins 63D and the holes 64A.

FIG. 7C illustrates a modified form in which one major edge 30a (upper major edge as viewed in the drawing) of the frame 30 is formed with a thin-walled extension or flange 65 extending outwardly from and flush with the top surface of the frame 30 with two through-holes 65A, 65B formed through the extension 65 at a predetermined spacing while the other major edge 30b (lower major edge as viewed in the drawing) of the frame 30 is also formed with a thin-walled extension or flange 66 extending outwardly from and flush with the bottom surface of the frame 30 with two protuberances 66A, 66B formed on the extension 66 at positions corresponding to the through-holes 65A, 65B of the one major edge 30a (positions generally line symmetrical with respect to the longitudinal central line of the frame 30) so as to be engageable with those through-holes. In this case, the thickness of the extensions 65, 66 of the major edges 30a, 30b are sized such that the sum of the thickness of the two extensions is just equal to or slightly smaller than the thickness of the test tray.

In the construction shown in FIG. 7C, against one preceding test tray 3-1 already at a standstill in the soak chamber 41 or the unloader section 8 is abutted the succeeding test tray 3-2 from below so that the protuberances 66A, 66B of the succeeding test tray are fitted into the through-holes 65A, 65B of the preceding test tray. It will be readily appreciated that this permits two test trays 3-1 and 3-2 to be engaged with each other into an integrally joined state. In this case as well, it is preferable that the dimensions of the through-holes 65A, 65B and the protuberances 66A, 66B be sized such that there is a loose fit between the through-holes and the protuberances.

FIG. 7D illustrates a further modified form in which there is provided a dedicated coupling frame 67 having a pair of openings or compartments 68A, 68B formed at a predetermined spacing for accommodating two test trays in engagement with each other. The arrangement is such that two test trays 3-1 and 3-2 are accommodated in the openings 68A, 68B of the coupling frame 67 and are transported together with the coupling frame 67. In this example, each of the openings 68A, 68B of the coupling frame 67, as partly shown in FIG. 7E in cross-sectional view, is formed around its peripheral wall with a stepped shoulder on which a flange-like extension 30f of the frame 30 of the test tray rests in interlocking manner such that a test tray is received in each of the openings of the coupling frame 67 with the bottom surfaces of the coupling frame 67 and the test tray substantially flush with each other. This construction facilitates the transportation of two test trays with their positional relation being accurately maintained, insuring that the operations, testing, measuring, etc. in the various sections of the IC tester effected with a high precision. Further, the transportation per se of two test trays may be carried out positively as they are transported in unison with the coupling frame 67.

In the first to fourth embodiments described above, the present invention is applied to the IC tester of the type in which a constant temperature chamber 4 including a soak chamber 41 and a testing section 42, and an exit chamber 5 are arranged in the left to right direction as viewed in the drawing (X-axis direction) in the rear portion of the IC tester while in front of the constant temperature chamber 4 and the exit chamber 5 there are located a loader section 7 and an unloader section 8. However, it will be apparent to those skilled in the art that the present invention is applicable with equal advantages to the IC tester of another construction.

Figure 8:
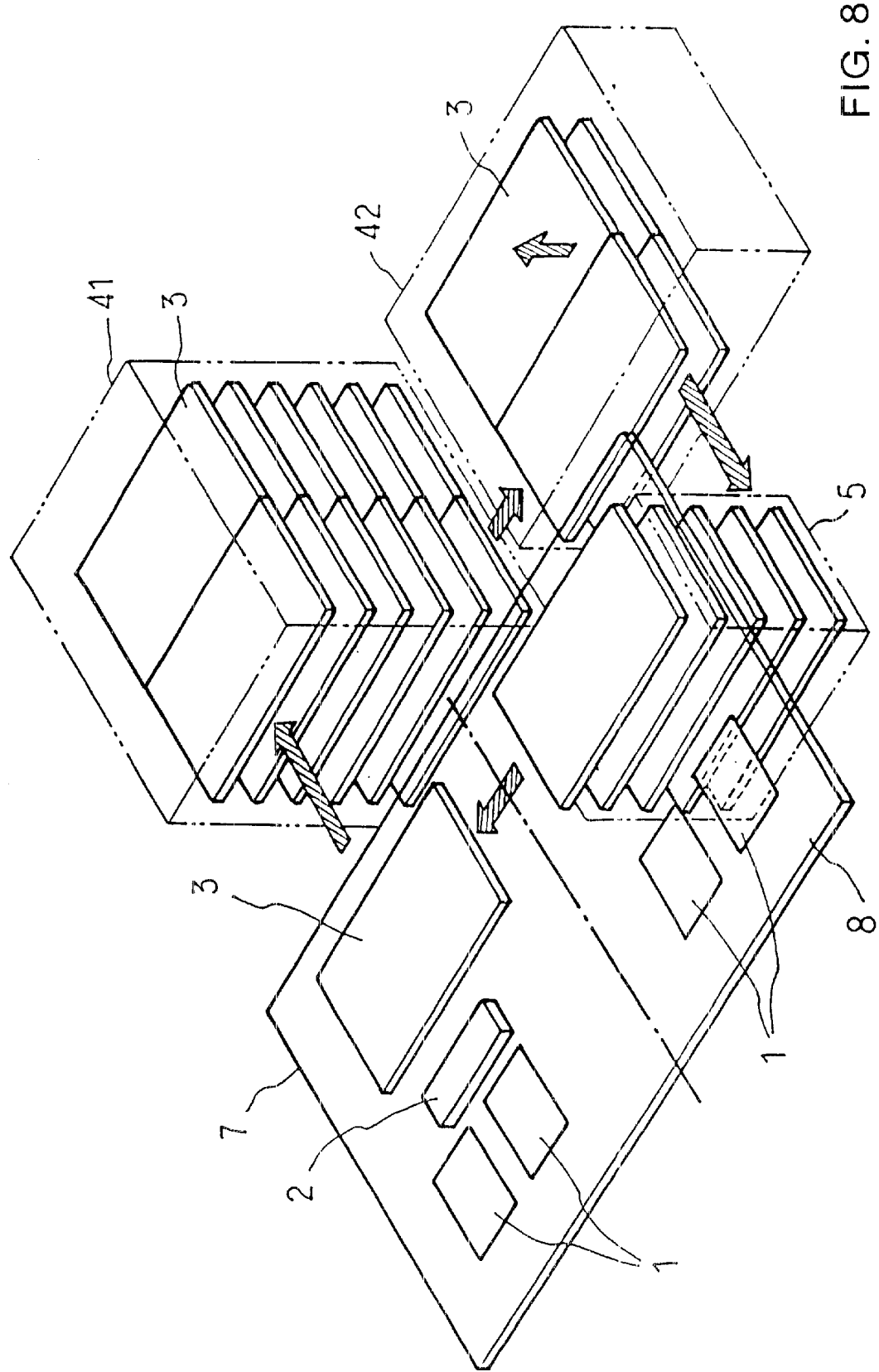
FIG. 8 is a perspective view illustrating the general construction of a fifth embodiment of the semiconductor device testing apparatus according to the present invention.

By way example, the present invention is applicable to the IC tester of the type in which an exit chamber 5 is disposed underneath an unloader section 8 to reduce the transverse width (length in the Y-axis direction) of the IC tester. FIG. 8 is a schematic perspective view illustrating the construction according to the fifth embodiment of the present invention.

The fifth embodiment represents an instance of construction either in which two paths of transport for test trays are provided for the section of path extending from the soak chamber 41 to the testing section 42 so that two test trays may be substantially simultaneously transported along the respective transport paths or in which the width of the test tray transport path for the section extending from the soak chamber 41 to the testing section 42 is broadened to be approximately equal to the sum of transverse widths of two test trays so that two test trays in an integrally joined state may be simultaneously transported. The parts and elements corresponding to those in FIGS. 1, 2, 4 and 11 are designated by the like reference numerals and will not be discussed again in details, unless required.

In the IC tester illustrated, since each of the test tray supporting stages of the vertical transport mechanism in the exit chamber 5 has a space for accommodating only one test tray, after completion of the testing on all of the ICs under test loaded on two test trays in the testing section 42, the two test trays are separated and delivered one by one out of the testing section 42 in the direction perpendicular to that in which they have been delivered in, and are transferred onto the lowermost stage of the vertical transport mechanism in the exit chamber 5. As the test trays are 3 moved up through the successive stages by the vertical transport mechanism in the exit chamber 5 arrives at the uppermost stage, it is introduced into the rwegion of the unloader section 8 where the sorting operation is effected on the tested ICs placed on the test tray.

Further, the IC tester illustrated is configured such that once two test trays have undergone the test in the testing section 42, they are moved to a predetermined position overlying the testing section 42 prior to being delivered one by one onto the lowermost stage of the vertical transport mechanism in the exit chamber 5, so that the next succeeding either two separate or two integrally joined test trays may be introduced into the testing section 42 promptly after completion of the testing on the preceding two test trays.

In this construction, although in the section of the transport path extending from the exit chamber 5 through the unloader section 8 and the loader section 7 to the soak chamber 41, test trays are transported one by one as in the illustrated prior art IC tester, either two juxtaposed or two integrally joined test trays are transported in the section of the transport path extending from the soak chamber 41 to the testing section 42. It is thus to be appreciated that despite the fact that the conventionally used test tray is employed as such, this arrangement permits the simultaneous testing or measuring of ICs under test loaded on two test trays, resulting in doubling the simultaneous measurement throughput in number of ICs. Consequently, in the case that a relatively long time is required per test in the testing section 42, the doubled simultaneous measurement throughput in number reduces the time required to complete the testing on all of the ICs (testing time of the IC tester) to nearly half, producing the advantage of greatly saving the testing cost per IC.

In the fifth embodiment described above, the depth of the constant temperature chamber 4 is expanded by a dimension corresponding approximately to one transverse width (length of the minor edge) of the rectangular test tray 3 and two paths of transport for test trays are provided for the section of path extending from the soak chamber 41 to the testing section 42 so that two test trays may be substantially simultaneously transported along the respective transport paths independently of each other, or alternatively the width of the test tray transport path for the section extending from the soak chamber 41 to the testing section 42 is broadened to be approximately equal to the sum of transverse widths of two test trays so that two test trays in an integrally joined state may be simultaneously transported. However, in the case that the time required per test in the testing section 42 is relatively short, it is preferable that with the construction of the test tray transport path extending from the loader section 7 through the soak chamber 41 and the testing section 42 of the constant temperature chamber 4 to the exit chamber 5 being retained as in the illustrated prior art IC tester, the depth (length in the Y-axis direction) of the loader section 7 and the unloader section 8 be expanded by a dimension corresponding approximately to one transverse width (length of the minor edge) of the rectangular test tray 3, and two test tray transport paths are provided for the section of path extending from the unloader section 8 to the loader section 7 so that two test trays may be substantially simultaneously transported along the respective transport paths independently of each other.

Figure 9:
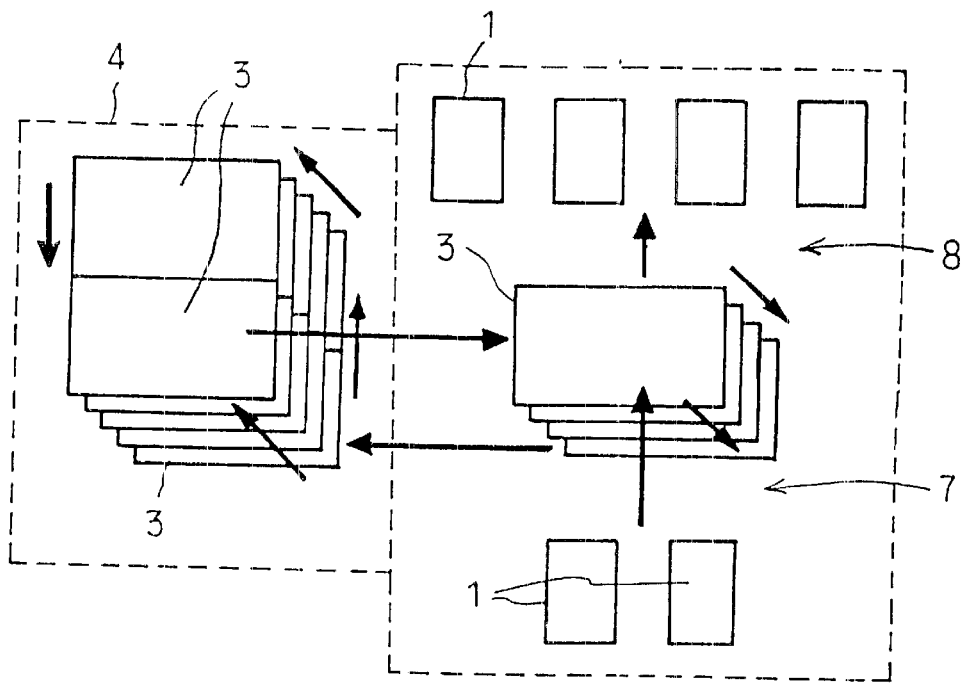
FIG. 9 is a plan view, partly in a perspective view, illustrating the general construction of a sixth embodiment of the semiconductor device testing apparatus according to the present invention.
Figure 10:
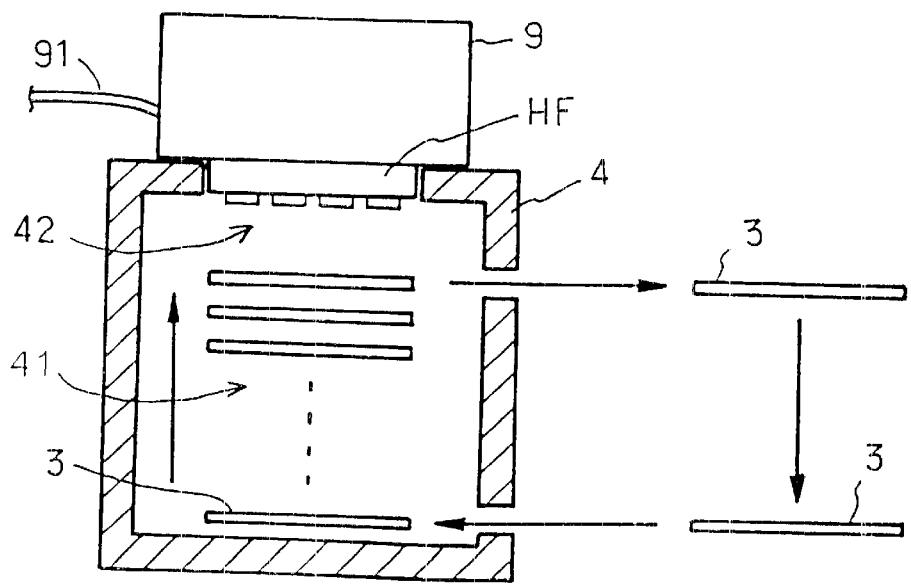
FIG. 10 is a front view of the semiconductor device testing apparatus of the sixth embodiment shown in FIG. 9 with the constant temperature chamber section shown in a cross-sectional view.

FIGS. 9 and 10 are a schematic perspective view and a side view, with the constant temperature chamber in cross-section, respectively illustrating the construction according to the sixth embodiment of the present invention.

The IC tester of this sixth embodiment is configured such that a constant temperature chamber 4 is equipped with a vertical transport mechanism in the interior thereof which constitutes a soak chamber 41, the top of the constant temperature chamber 4 (at the elevation of the uppermost stage of the vertical transport mechanism) comprising a testing section 42 with a tester head 9 being mounted facedown in the top wall of the constant temperature chamber 4 while a loader section 7 and an unloader section 8 are integrated together and equipped with a common vertical transport mechanism.

In this embodiment, each stage of the vertical transport mechanism for supporting test trays thereon in the constant temperature chamber 4 has a lateral width approximately equal to the length of the major edge of one test tray (the X-axis dimension direction) and a depth sized to be approximately equal to the sum of transverse widths of two test trays (length as measured in the Y-axis direction). The first test tray 3 introduced from the loader section 7 is placed on the front approximately half section (the lower half section as viewed in the Y-axis direction) of the lowermost stage of the vertical transport mechanism. Then, the first test tray 3 is moved from the front half section to the back approximately half section (the upper half section in the Y-axis direction) of the lowermost stage in the direction perpendicular to that in which it has been introduced. Next, the second test tray 3 introduced from the loader section 7 is placed on the now vacated front approximately half section of the lowermost stage of the vertical transport mechanism. When this is done, the second test tray is accommodated in the front half section of the lowermost stage either at a small spacing from or in abutment with the first test tray.

The vertical transport mechanism is configured to support two test trays on each stage and is operative to move the two test trays on each stage up successively to the next upper stage.

While two test trays on the lowermost stage are moved up through the successive stages to the uppermost stage, the ICs to be tested on the two test trays are loaded with a temperature stress of either a predetermined high or low temperature.

A predetermined number of ICs out of the ICs under test loaded on the two test tray are brought into electrical contact with the IC sockets mounted on the tester head 9 while the ICs are placed on the test trays. As noted before, the tester head 9 is electrically connected with the tester proper via cable 91.

Upon completion of testing, the test tray located on the front half section of the uppermost stage of the vertical transport mechanism is first conveyed from the testing section 42 via the outlet of the constant temperature chamber 4 onto the uppermost stage of the vertical transport mechanism in the loader section 7/unloader section 8. Once the test tray located on the front half section of the uppermost stage has been delivered out, the test tray located on the back half section is moved to the now vacated front half section.

It is to be noted that since each of the test tray supporting stages of the vertical transport mechanism in the loader section 7/unloader section 8 has a space for accommodating only one test tray, the IC tester illustrated is not able to deliver the test tray loaded with tested ICs out of the constant temperature chamber 4 until the test tray introduced onto the uppermost stage of the vertical transport mechanism in the loader section 7/unloader section 8 is moved down to the next succeeding stage by that vertical transport mechanism.

Once the test tray introduced onto the uppermost stage of the vertical transport mechanism in the loader section 7/unloader section 8 has been lowered to the next succeeding stage, the test tray as moved onto the front half section of the uppermost stage of the vertical transport mechanism the constant temperature chamber 4 is conveyed via the outlet of the constant temperature chamber 4 onto the uppermost stage of the vertical transport mechanism in the loader section 7/unloader section 8.

Once the test tray has been lowered to the lowermost stage by the vertical transport mechanism in the loader section 7/unloader section 8, this test tray is reloaded with ICs to be tested from a universal tray 1. Subsequently, the same steps will be repeated.

In this sixth embodiment, when the test trays carrying thereon ICs having undergone the test in the testing section 42 are delivered out via the outlet of the constant temperature chamber 4, as noted above the two test trays simultaneously subjected to the testing (measuring) are discharged one by one in two separate operations. Accordingly, it is preferable that a buffer section (not shown) be disposed between the constant temperature chamber 4 and the loader section 7/unloader section 8 so that two test trays may be discharged simultaneously at one time to the exterior buffer section for temporarily keeping the tested ICs therein, prior to sorting out the ICs based on the test results and transferring them onto the corresponding universal trays, thereby reducing the overall testing (measurement) time.

Alternatively, each stage of the vertical transport mechanism in the loader section 7/unloader section 8 may have a space large enough to accommodate two test trays so that the stages of the vertical transport mechanism may be moved successively vertically with each stage carrying two test trays thereon. It will be appreciated that this arrangement may further reduce the testing time and/or the handling time for tested ICs.

While two test trays on the lowermost stage are moved up through the successive stages to the uppermost stage, the ICs to be tested on the two test trays are loaded with a temperature stress of either a predetermined high or low temperature.

In the first to five embodiments described above, when two rectangular test trays are transported in juxtaposition (parallel state) in the section of transport path extending from the soak chamber 41 of the constant temperature chamber 4 to the exit chamber 5 or in the section of transport path extending from the soak chamber 41 of the constant temperature chamber 4 to the testing section 42 or in the section of transport path extending from the unloader section 8 to the loader section 7, the two rectangular test trays are illustrated as being transported in a sideways long orientation (with the minor edges leading), but it will be obvious to those skilled in the art that the functional advantages comparable to any of the embodiments described above may be obtained if the arrangement is adopted in which two rectangular test trays are transported in a longitudinally long orientation (with the major edges leading) and in tandem with two serially succeeding.

In that case, in the sixth embodiment each test tray supporting stage of the vertical transport mechanism may be sized so as to accommodate two test trays in a longitudinally long orientation.

In the first to five embodiments as well, each test tray supporting stage of the vertical transport mechanism in the soak chamber 41 and the exit chamber 5 may have a space large enough to accommodate two test trays in a longitudinally long orientation.

In addition, in case the IC test is conducted in the test section 42 on ICs loaded on a test tray in the normal or room temperature, the test tray 3 need not be formed of a material capable of withstanding high/low temperatures. Also, there are no need that the soak chamber 41 and the exit chamber 5 as well as the constant temperature chamber 4 are provided in the IC tester. As a result, in such IC tester, the test tray 3 is transported from the loader section 7 to the test section 42, and after completion of the test on all ICs loaded on the test tray, the test tray 3 is transported from the test section 42 to the unloader section 8. Thus, the invention described above is applied to the section of test tray transport path extending from the loader section 7 to the test section 42 or the section of test tray transport path extending from the loader section 7 to the unloader section 8 through the test section 42.

As is apparent from the foregoing disclosure, despite the fact that a relatively limited increase is required of the external dimensions of the IC, the present invention provides for increasing the simultaneous measurement throughput in number of ICs under test by a factor of about two, or significantly increasing the simultaneous throughput in number of tested ICs in the unloader section 8, and also significantly reducing the time required to transport and handle in the loader section 7 whereby the time required to complete the testing on all of the ICs up to nearly half, thus producing the advantage of greatly saving the testing cost per IC.

What is claimed is:

1. A semiconductor device testing apparatus comprising:
   a loader section that loads semiconductor devices onto test trays;
   a testing section that tests the semiconductor devices loaded on the test trays;
   an unloader section that unloads tested semiconductor devices loaded on the test trays transported from said testing section; and
   transport mechanisms that transport the test trays in a circular manner from said loader section through said testing section and unloader section back to said loader section, wherein the transport mechanisms provide a plurality of test tray transport paths to transport substantially simultaneously a plurality of test trays in a generally parallel manner from said loader section through said testing section to said unloader section.

2. A semiconductor device testing apparatus comprising:
   a loader section that loads semiconductor devices onto test trays;
   a temperature stress applying means for applying a temperature stress of a predetermined temperature to the semiconductor devices loaded on the test trays transported from said loader section;
   a testing section that tests the semiconductor devices loaded on the test trays transported from said temperature stress applying means;
   a heat removing/cold removing means for removing heat or cold from tested semiconductor devices loaded on test trays transported from said testing section;
   an unloader section that unloads tested semiconductor devices loaded on the test trays transported from said heat removing/cold removing means; and
   transport mechanisms that transport the test trays in a circular manner from said loader section through said temperature stress applying means, said testing section, said heat removing/cold removing means and said unloader section back to said loader section, wherein the transport mechanisms provide a plurality of test tray transport paths to transport substantially simultaneously a plurality of test trays in a generally parallel manner from said temperature stress applying means through said testing section to said heat removing/cold removing means.

3. The semiconductor device testing apparatus according to claim 2, wherein said temperature stress applying means and said testing section are located in the back portion of said semiconductor device testing apparatus while said loader section and said unloader section are located in front of said temperature stress applying means and said testing section, said heat removing/cold removing means being located in front of said testing section and underneath said unloader section.

4. The semiconductor device testing apparatus according to claim 2, wherein said temperature stress applying means, said testing section, and said heat removing/cold removing means are located in the back portion of said semiconductor device testing apparatus while said loader section and said unloader section are located in front of said temperature stress applying means, said testing section, and said heat removing/cold removing means.

5. The semiconductor device testing apparatus according to any one of claim 1, 3, 2, or 4, wherein there are two of said transport paths for transporting test trays.

6. The semiconductor device testing apparatus according to any one of claim 3, 2 or 4, wherein said temperature stress applying means is provided with a vertical transport mechanism configured to support a plurality of test trays in the form of a stack with a predetermined spacing between stacked two test trays, each stage of said vertical transport mechanism for supporting test trays having a space for accommodating a plurality of test trays such that a plurality of test trays introduced successively from said loader section are placed on either the uppermost or the lowermost test tray supporting stage of said vertical transport mechanism successively from the back side toward the front side of said stage with successive trays either arranged at predetermined small spacings between adjacent trays or in abutment with each other.

7. The semiconductor device testing apparatus according to any one of claim 3, 2 or 4, wherein there are two said transport paths for transporting test trays, and said temperature stress applying means is provided with a vertical transport mechanism configured to support a plurality of test trays in the form of a stack with a predetermined spacing between stacked two test trays, each stage of said vertical transport mechanism for supporting test trays having a space for accommodating two test trays such that a first test tray introduced from said loader section is placed on either the uppermost or the lowermost test tray supporting stage of said vertical transport mechanism in the back section of said stage and a second succeeding test tray introduced from said loader section is placed on either the uppermost or the lowermost test tray supporting stage in the front section of said stage at a predetermined small spacing from or in abutment with said first test tray.

8. The semiconductor device testing apparatus according to any one of claim 3, 2 or 4, wherein said heat removing/cold removing means is provided with a vertical transport mechanism configured to support a plurality of test trays in the form of a stack with a predetermined spacing between stacked two test trays, each stage of said vertical transport mechanism for supporting test trays having a space for accommodating a plurality of test trays such that a plurality of test trays introduced from said testing section are placed as such on either the uppermost or the lowermost test tray supporting stage of said vertical transport mechanism.

9. The semiconductor device testing apparatus according to any one of claim 3, 2 or 4, wherein there are two said transport paths for transporting test trays, and said heat removing/cold removing means is provided with a vertical transport mechanism configured to support a plurality of test trays in the form of a stack with a predetermined spacing between stacked two test trays, each stage of said vertical transport mechanism for supporting test trays having a space for accommodating two test trays such that two test trays introduced from said loader section are placed as such on either the uppermost or the lowermost test tray supporting stage of said vertical transport mechanism.

10. The semiconductor device testing apparatus according to any one of claim 1 or 2, wherein said unloader section sorts the tested semiconductor devices according to test results.

11. The semiconductor device testing apparatus according to claim 2, wherein said transport mechanisms further provide a plurality of test tray transport paths to transport substantially simultaneously a plurality of test trays in a generally parallel manner from said loader section to said temperature stress applying means.

12. The semiconductor device testing apparatus according to claim 2 or 11, wherein said transport mechanisms further provide a plurality of test tray transport paths to transport substantially simultaneously a plurality of test trays in a generally parallel manner from said heat removing/cold removing means to said unloader section.

13. A semiconductor device testing apparatus comprising:
a loader section that loads semiconductor devices onto test trays;
a testing section that tests the semiconductor devices loaded on the test trays;
an unloader section that unloads tested semiconductor devices loaded on the test trays transported from said testing section; and
transport mechanisms that transport the test trays in a circular manner from said loader section through said testing section and unloader section back to said loader section, wherein the transport mechanisms provide a test tray transport path to transport simultaneously a plurality of test trays, juxtaposed in a direction transverse to said test tray transport path, from said loader section through said testing section to said unloader section.

14. A semiconductor device testing apparatus comprising:
a loader section that loads semiconductor devices onto test trays;
a temperature stress applying means for applying a temperature stress of a predetermined temperature to the semiconductor devices loaded on the test trays transported from said loader section;
a testing section that tests the semiconductor devices loaded on the test trays transported from said temperature stress applying means;
a heat removing/cold removing means for removing heat or cold from tested semiconductor devices loaded on test trays transported from said testing section;
an unloader section that unloads tested semiconductor devices loaded on the test trays transported from said heat removing/cold removing means; and
transport mechanisms that transport the test trays in a circular manner from said loader section through said temperature stress applying means, said testing section, said heat removing/cold removing means and said unloader section back to said loader section, wherein the transport mechanisms provide a test tray transport path to transport simultaneously a plurality of test trays, juxtaposed in a direction transverse to said test tray transport path, from said temperature stress applying means through said testing section to said heat removing/cold removing means.

15. The semiconductor device testing apparatus according to claim 14, wherein said temperature stress applying means and said testing section are located in the back portion of said semiconductor device testing apparatus while said loader section and said unloader section are located in front of said temperature stress applying means and said testing section, said heat removing/cold removing means being located in front of said testing section and underneath said unloader section.

16. The semiconductor device testing apparatus according to claim 14, wherein said temperature stress applying means, said testing section, and said heat removing/cold removing means are located in the back portion of said semiconductor device testing apparatus while said loader section and said unloader section are located in front of said temperature stress applying means, said testing section, and said heat removing/cold removing means.

17. The semiconductor device testing apparatus according to any one of claim 13, 15, 14, or 16, wherein said plurality of test trays juxtaposed in a direction transverse to said test tray transport path are in engagement with each other.

18. The semiconductor device testing apparatus according to any one of claim 13, 15, 14, or 16, wherein said plurality of test trays juxtaposed in a direction transverse to said test tray transport path are two and in engagement with each other.

19. The semiconductor device testing apparatus according to any one of claim 15, 14 or 16, wherein said temperature stress applying means is provided with a vertical transport mechanism configured to support a plurality of test trays in the form of a stack with a predetermined spacing between stacked two test trays, each stage of said vertical transport mechanism for supporting test trays having a space for accommodating a plurality of test trays such that a plurality of test trays introduced successively from said loader section are placed on either the uppermost or the lowermost test tray supporting stage of said vertical transport mechanism successively from the back side toward the front side of said stage with successive trays integrally engaged with each other.

20. The semiconductor device testing apparatus according to any one of claim 15, 14 or 16, wherein said plurality of test trays juxtaposed in a direction transverse to said test tray transport path are two and in engagement with each other; and said temperature stress applying means is provided with a vertical transport mechanism configured to support a plurality of test trays in the form of a stack with a predetermined spacing between stacked two test trays, each stage of said vertical transport mechanism for supporting test trays having a space for accommodating two test trays such that a first test tray introduced from said loader section is placed on either the uppermost or the lowermost test tray supporting stage of said vertical transport mechanism in the back section of said stage and a second succeeding test tray introduced from said loader section is placed on either the uppermost or the lowermost test tray supporting stage in the front section of said stage in engagement with said first tray.

21. The semiconductor device testing apparatus according to any one of claim 15, 14 or 16, wherein said heat removing/cold removing means is provided with a vertical transport mechanism configured to support a plurality of test trays in the form of a stack with a predetermined spacing between stacked two test trays, each stage of said vertical transport mechanism for supporting test trays having a space for accommodating a plurality of test trays such that a plurality of test trays in juxtaposition in a direction transverse to said test tray transport path introduced from said loader section are placed as such on either the uppermost or the lowermost test tray supporting stage of said vertical transport mechanism.

22. The semiconductor device testing apparatus according to any one of claim 15, 14 or 16, wherein said plurality of test trays juxtaposed in a direction transverse to said test tray transport path are two and in engagement with each other; and said heat removing/cold removing means is provided with a vertical transport mechanism configured to support a plurality of test trays in the form of a stack with a predetermined spacing between stacked two test trays, each stage of said vertical transport mechanism for supporting test trays having a space for accommodating two test trays such that two test trays in juxtaposition in a direction transverse to said test tray transport path introduced from said loader section are placed as such on either the uppermost or the lowermost test tray supporting stage of said vertical transport mechanism.

23. The semiconductor device testing apparatus according to claim 14, wherein said transport mechanisms further provide a test tray transport path to transport simultaneously a plurality of test trays, juxtaposed in a direction transverse to said test tray transport path, from said loader section to said temperature stress applying means.

24. The semiconductor device testing apparatus according to claim 14 or 23, wherein said transport mechanisms further provide a test tray transport path to transport simultaneously a plurality of test trays, juxtaposed in a direction transverse to said test tray transport path, from said heat removing/cold removing means to said unloader section.

25. A method of operating a semiconductor device testing apparatus comprising a loader section, a testing section and an unloader section, wherein said method comprises:

in said loader section, loading semiconductor devices onto test trays;

in said testing section, testing the semiconductor devices loaded on the test trays;

in said unloader section, unloading tested semiconductor devices loaded on the test trays transported from said testing section; and transporting the test trays in a circular manner from said loader section through said testing section and unloader section back to said loader section, wherein the transporting transports substantially simultaneously a plurality of test trays in a generally parallel manner from said loader section through said testing section to said unloader section.

26. A method of operating a semiconductor device testing apparatus comprising a loader section, a temperature stress applying means, a testing section, a heat removing/cold removing means, and an unloader section, wherein the method comprises:

in said loader section, loading semiconductor devices onto test trays;

in said temperature stress applying means, applying a temperature stress of a predetermined temperature to semiconductor devices loaded on said test trays;

in said testing section, testing the semiconductor devices loaded on the test trays;

in said heat removing/cold removing means, removing heat or cold from semiconductor devices having undergone a test in said testing section;

in said unloader section, unloading tested semiconductor devices loaded on the test trays transported from said testing section; and transporting the test trays in a circular manner from said loader section through said temperature stress applying means, said testing section, said heat removing/cold removing means and said unloader section back to said loader section, wherein the transporting transports substantially simultaneously a plurality of test trays in a generally parallel manner from said loader section through said testing section to said unloader section.

27. The method according to claim 26, wherein said temperature stress applying means and said testing section are located in the back portion of said semiconductor device testing apparatus and said loader section and said unloader section are located in front of said temperature stress applying means and said testing section, said heat removing/cold removing means being located in front of said testing section and underneath said unloader section.

28. The method according to claim 26, wherein said temperature stress applying means, said testing section, and said heat removing/cold removing means are located in the back portion of said semiconductor device testing apparatus and said loader section and said unloader section are located in front of said temperature stress applying means, said testing section, and said heat removing/cold removing means.

29. The method according to any one of claim 25, 27, 26, or 28, wherein there are two of said transport paths for transporting test trays.

30. The method according to any one of claim 27, 26 or 28, wherein said temperature stress applying means is provided with a vertical transport mechanism configured to support a plurality of test trays in the form of a stack, each stage of said vertical transport mechanism for supporting test trays having a space for accommodating a plurality of test trays, wherein the method comprises placing a plurality of test trays introduced successively from said loader section on either the uppermost or the lowermost test tray supporting stage of said vertical transport mechanism successively from the back side toward the front side of said stage with successive trays either arranged at predetermined small spacings between adjacent trays or in abutment with each other.

31. The method according to any one of claim 27, 26 or 28, wherein there are two said transport paths for transporting test trays, and said temperature stress applying means is provided with a vertical transport mechanism configured to support a plurality of test trays in the form of a stack, each stage of said vertical transport mechanism for supporting test trays having a space for accommodating two test trays, wherein the method comprises placing a first test tray introduced from said loader section on either the uppermost or the lowermost test tray supporting stage of said vertical transport mechanism in the back section of said stage and placing a second succeeding test tray introduced from said loader section on either the uppermost or the lowermost test tray supporting stage in the front section of said stage at a predetermined small spacing from or in abutment with said first test tray.

32. The method according to any one of claim 27, 26 or 28, wherein said heat removing/cold removing means is provided with a vertical transport mechanism configured to support a plurality of test trays in the form of a stack, each stage of said vertical transport mechanism for supporting test trays having a space for accommodating a plurality of test trays, wherein the method comprises placing a plurality of test trays introduced from said testing section as such on either the uppermost or the lowermost test tray supporting stage of said vertical transport mechanism.

33. The method according to any one of claim 27, 26 or 28, wherein there are two said transport paths for transporting test trays, and said heat removing/cold removing means is provided with a vertical transport mechanism configured to support a plurality of test trays in the form of a stack, each stage of said vertical transport mechanism for supporting test trays having a space for accommodating two test trays, wherein the method comprises placing two test trays introduced from said loader section as such on either the uppermost or the lowermost test tray supporting stage of said vertical transport mechanism.

34. The method according to claim 26, wherein said transporting further transports substantially simultaneously a plurality of test trays in a generally parallel manner from said loader section to said temperature stress applying means.

35. The method according to claim 26 or 34, wherein said transporting further transports substantially simultaneously a plurality of test trays in a generally parallel manner from said heat removing/cold removing means to said unloader section.

36. A method of operating a semiconductor device testing apparatus comprising a loader section, a testing section and an unloader section, wherein said method comprises:
    in said loader section, loading semiconductor devices onto test trays;
    in said testing section, testing the semiconductor devices loaded on the test trays;
    in said unloader section, unloading tested semiconductor devices loaded on the test trays transported from said testing section; and
    transporting the test trays in a circular manner from said loader section through said testing section and unloader section back to said loader section, wherein the transporting transports simultaneously a plurality of test trays, juxtaposed in a direction transverse to said test tray transport path, from said loader section through said testing section to said unloader section.

37. A method of operating a semiconductor device testing apparatus comprising a loader section, a temperature stress applying means, a testing section, a heat removing/cold removing means and a loader section, wherein the method comprises:
    in said loader section, loading semiconductor devices onto test trays;
    in said temperature stress applying means, applying a temperature stress of a predetermined temperature to semiconductor devices loaded on said test trays;
    in said testing section, testing the semiconductor devices loaded on the test trays;
    in said heat removing/cold removing means, removing heat or cold from semiconductor devices having undergone a test in said testing section;
    in said unloader section, unloading tested semiconductor devices loaded on the test trays transported from said testing section; and
    transporting the test trays in a circular manner from said loader section through said temperature stress applying means, said testing section, said heat removing/cold removing means and said unloader section back to said loader section, wherein the transporting transports the test trays along a test tray transport path, further wherein the transporting transports simultaneously a plurality of test trays, juxtaposed in a direction transverse to said test tray transport path, from said temperature stress applying means through said testing section to said heat removing/cold removing means.

38. The method according to claim 37, wherein said temperature stress applying means and said testing section are located in the back portion of said semiconductor device testing apparatus and said loader section and said unloader section are located in front of said temperature stress applying means and said testing section, said heat removing/cold removing means being located in front of said testing section and underneath said unloader section.

39. The method according to claim 37, wherein said temperature stress applying means, said testing section, and said heat removing/cold removing means are located in the back portion of said semiconductor device testing apparatus and said loader section and said unloader section are located in front of said temperature stress applying means, said testing section, and said heat removing/cold removing means.

40. The method according to any one of claim 36, 38, 37, or 39, wherein said plurality of test trays juxtaposed in a direction transverse to said test tray transport path are in engagement with each other.

41. The method according to any one of claim 36, 38, 37, or 39, wherein said plurality of test trays juxtaposed in a direction transverse to said test tray transport path are two and in engagement with each other.

42. The method according to any one of claim 38, 37 or 39, wherein said temperature stress applying means is provided with a vertical transport mechanism configured to support a plurality of test trays in the form of a stack, each stage of said vertical transport mechanism for supporting test trays having a space for accommodating a plurality of test trays, wherein the method comprises placing a plurality of test trays introduced successively from said loader section on either the uppermost or the lowermost test tray supporting stage of said vertical transport mechanism successively from the back side toward the front side of said stage with successive trays integrally engaged with each other.

43. The method according to any one of claim 38, 37 or 39, wherein said plurality of test trays juxtaposed in a direction transverse to said test tray transport path are two and in engagement with each other; and
 said temperature stress applying means is provided with a vertical transport mechanism configured to support a plurality of test trays in the form of a stack, each stage of said vertical transport mechanism for supporting test trays having a space for accommodating two test trays, wherein the method comprises placing a first test tray introduced from said loader section on either the uppermost or the lowermost test tray supporting stage of said vertical transport mechanism in the back section of said stage and placing a second succeeding test tray introduced from said loader section on either the uppermost or the lowermost test tray supporting stage in the front section of said stage in engagement with said first tray.

44. The method according to any one of claim 38, 37 or 39, wherein said heat removing/cold removing means is provided with a vertical transport mechanism configured to support a plurality of test trays in the form of a stack, each stage of said vertical transport mechanism for supporting test trays having a space for accommodating a plurality of test trays, wherein the method comprises placing a plurality of test trays in juxtaposition in a direction transverse to said test tray transport path introduced from said loader section as such on either the uppermost or the lowermost test tray supporting stage of said vertical transport mechanism.

45. The method according to any one of claim 38, 37 or 39, wherein said plurality of test trays juxtaposed in a direction transverse to said test tray transport path are two and in engagement with each other; and
 said heat removing/cold removing means is provided with a vertical transport mechanism configured to support a plurality of test trays in the form of a stack, each stage of said vertical transport mechanism for supporting test trays having a space for accommodating two test trays, wherein the method comprises placing two test trays in juxtaposition in a direction transverse to said test tray transport path introduced from said loader section as such on either the uppermost or the lowermost test tray supporting stage of said vertical transport mechanism.

46. The method according to any one of claim 25, 26, 36 or 37, wherein said unloading comprises sorting the tested semiconductor devices according to test results.

47. The method according to claim 37, wherein said transporting further transports simultaneously a plurality of test trays, juxtaposed in a direction transverse to said test tray transport path, from said loader section to said temperature stress applying means.

48. The method according to claim 37 or 47, wherein said transporting further transports simultaneously a plurality of test trays, juxtaposed in a direction transverse to said test tray transport path, from said heat removing/cold removing means to said unloader section.

49. A semiconductor device testing apparatus comprising:
 a loader section that loads semiconductor devices onto test trays;
 a soak chamber, wherein a temperature stress is applied to the semiconductor devices loaded on the test trays transported from said loader section;
 a testing section that tests the semiconductor devices loaded on the test trays transported from said soak chamber;
 a heat/cold removal chamber, wherein heat or cold is removed from tested semiconductor devices loaded on test trays transported from said testing section;
 an unloader section that unloads tested semiconductor devices loaded on the test trays transported from said heat/cold removal chamber; and
 transport mechanisms that transport the test trays from said loader section through said soak chamber, said testing section, said heat/cold removal chamber and said unloader section back to said loader section, wherein the transport mechanisms provide a plurality of test tray transport paths to transport substantially simultaneously a plurality of test trays in a generally parallel manner along said test tray transport paths in said testing section.

50. The semiconductor device testing apparatus of claim 49, wherein said soak chamber, said testing section, and said heat/cold removal chamber are located in the back portion of said semiconductor device testing apparatus while said loader section and said unloader section are located in front of said soak chamber, said testing section, and said heat/cold removal chamber.

51. The semiconductor device testing apparatus of claim 49, wherein there are two of said test tray transport paths for transporting test trays.

52. The semiconductor device testing apparatus of claim 49, wherein a plurality of test trays may be arranged in said soak chamber with some spacing between each pair of adjacent test trays, further wherein a plurality of test trays may be arranged in said heat/cold removal chamber with some spacing between each pair of adjacent test trays.

53. A semiconductor device testing apparatus comprising:
 a loader section that loads semiconductor devices onto test trays;
 a soak chamber, wherein a temperature stress is applied to the semiconductor devices loaded on the test trays transported from said loader section, said soak chamber comprising a soak chamber exit;
 a testing section that tests the semiconductor devices loaded on the test trays transported from said soak chamber;
 a heat/cold removal chamber, wherein heat or cold is removed from tested semiconductor devices loaded on test trays transported from said testing section, said heat/cold removal chamber comprising a heat/cold removal chamber entrance;
 an unloader section that unloads tested semiconductor devices loaded on the test trays transported from said heat/cold removal chamber; and transport mechanisms that transport the test trays from said loader section through said soak chamber, said testing section, said heat/cold removal chamber and said unloader section back to said loader section, wherein the transport mechanisms provide a plurality of test tray transport paths to transport substantially simultaneously a plurality of test trays in a generally parallel manner along said test tray transport paths from a point after said soak chamber exit to a point before said heat/cold removal chamber entrance.

54. The semiconductor device testing apparatus of claim 53, wherein said soak chamber, said testing section, and said heat/cold removal chamber are located in the back portion of said semiconductor device testing apparatus while said loader section and said unloader section are located in front of said soak chamber, said testing section, and said heat/cold removal chamber.

55. The semiconductor device testing apparatus of claim 53, wherein there are two of said test tray transport paths for transporting test trays.

56. The semiconductor device testing apparatus of claim 53, wherein a plurality of test trays may be arranged in said soak chamber with some spacing between each pair of adjacent test trays, further wherein a plurality of test trays may be arranged in said heat/cold removal chamber with some spacing between each pair of adjacent test trays.

57. A semiconductor device testing apparatus comprising:
a loader section that loads semiconductor devices onto test trays;
a soak chamber, wherein a temperature stress is applied to the semiconductor devices loaded on the test trays transported from said loader section;
a testing section that tests the semiconductor devices loaded on the test trays transported from said soak chamber;
a heat/cold removal chamber, wherein heat or cold is removed from tested semiconductor devices loaded on test trays transported from said testing section;
an unloader section that unloads tested semiconductor devices loaded on the test trays transported from said heat/cold removal chamber; and
transport mechanisms that transport the test trays from said loader section through said soak chamber, said testing section, said heat/cold removal chamber and said unloader section back to said loader section, wherein the transport mechanisms provide a test tray transport path to transport simultaneously a plurality of test trays, juxtaposed in a direction transverse to said test tray transport path, in said testing section.

58. The semiconductor device testing apparatus of claim 57, wherein said soak chamber, said testing section, and said heat/cold removal chamber are located in the back portion of said semiconductor device testing apparatus while said loader section and said unloader section are located in front of said soak chamber, said testing section, and said heat/cold removal chamber.

59. The semiconductor device testing apparatus of claim 57, wherein a plurality of test trays may be arranged in said soak chamber with some spacing between each pair of adjacent test trays, further wherein a plurality of test trays may be arranged in said heat/cold removal chamber with some spacing between each pair of adjacent test trays.

60. The semiconductor device testing apparatus of claim 57, wherein said plurality of test trays juxtaposed in a direction transverse to said test tray transport path are in engagement with each other.

61. The semiconductor device testing apparatus of claim 57, wherein said plurality of test trays juxtaposed in a direction transverse to said test tray transport path are two and in engagement with each other.

62. A semiconductor device testing apparatus comprising:
a loader section that loads semiconductor devices onto test trays;
a soak chamber, wherein a temperature stress is applied to the semiconductor devices loaded on the test trays transported from said loader section, said soak chamber comprising a soak chamber exit;
a testing section that tests the semiconductor devices loaded on the test trays transported from said soak chamber;
a heat/cold removal chamber, wherein heat or cold is removed from tested semiconductor devices loaded on test trays transported from said testing section, said heat/cold removal chamber comprising a heat/cold removal chamber entrance;
an unloader section that unloads tested semiconductor devices loaded on the test trays transported from said heat/cold removal chamber; and
transport mechanisms that transport the test trays from said loader section through said soak chamber, said testing section, said heat/cold removal chamber and said unloader section back to said loader section, wherein the transport mechanisms provide a test tray transport path to transport simultaneously a plurality of test trays, juxtaposed in a direction transverse to said test tray transport path, from a point after said soak chamber exit to a point before said heat/cold removal chamber entrance.

63. The semiconductor device testing apparatus of claim 62, wherein said soak chamber, said testing section, and said heat/cold removal chamber are located in the back portion of said semiconductor device testing apparatus while said loader section and said unloader section are located in front of said soak chamber, said testing section, and said heat/cold removal chamber.

64. The semiconductor device testing apparatus of claim 62, wherein a plurality of test trays may be arranged in said soak chamber with some spacing between each pair of adjacent test trays, further wherein a plurality of test trays may be arranged in said heat/cold removal chamber with some spacing between each pair of adjacent test trays.

65. The semiconductor device testing apparatus of claim 62, wherein said plurality of test trays juxtaposed in a direction transverse to said test tray transport path are in engagement with each other.

66. The semiconductor device testing apparatus of claim 62, wherein said plurality of test trays juxtaposed in a direction transverse to said test tray transport path are two and in engagement with each other.

67. A method of operating a semiconductor device testing apparatus comprising a loader section, a soak chamber, a testing section, a heat/cold removal chamber, and an unloader section, wherein the method comprises:
in said loader section, loading semiconductor devices onto test trays;
in said soak chamber, applying a temperature stress of a predetermined temperature to semiconductor devices loaded on said test trays;
in said testing section, testing the semiconductor devices loaded on the test trays;
in said heat/cold removal chamber, removing heat or cold from semiconductor devices having undergone a test in said testing section;

in said unloader section, unloading tested semiconductor devices loaded on the test trays transported from said testing section; and transporting the test trays from said loader section through said soak chamber, said testing section, said heat/cold removal chamber and said unloader section back to said loader section, wherein the transporting transports substantially simultaneously a plurality of test trays in a generally parallel manner along said test tray transport paths in said testing section.

68. The method of claim 67, wherein said soak chamber, said testing section, and said heat/cold removal chamber are located in the back portion of said semiconductor device testing apparatus while said loader section and said unloader section are located in front of said soak chamber, said testing section, and said heat/cold removal chamber.

69. The method of claim 67, wherein there are two of said test tray transport paths for transporting test trays.

70. The method of claim 67, wherein a plurality of test trays may be arranged in said soak chamber with some spacing between each pair of adjacent test trays, further wherein a plurality of test trays may be arranged in said heat/cold removal chamber with some spacing between each pair of adjacent test trays.

71. A method of operating a semiconductor device testing apparatus comprising a loader section, a soak chamber, a testing section, a heat/cold removal chamber, and an unloader section, wherein the method comprises:

in said loader section, loading semiconductor devices onto test trays;

in said soak chamber comprising a soak chamber exit, applying a temperature stress of a predetermined temperature to semiconductor devices loaded on said test trays;

in said testing section, testing the semiconductor devices loaded on the test trays;

in said heat/cold removal chamber comprising a heat/cold removal chamber entrance, removing heat or cold from semiconductor devices having undergone a test in said testing section;

in said unloader section, unloading tested semiconductor devices loaded on the test trays transported from said testing section; and transporting the test trays from said loader section through said soak chamber, said testing section, said heat/cold removal chamber and said unloader section back to said loader section, wherein the transporting transports substantially simultaneously a plurality of test trays in a generally parallel manner along said test tray transport paths from a point after said soak chamber exit to a point before said heat/cold removal chamber entrance.

72. The method of claim 71, wherein said soak chamber, said testing section, and said heat/cold removal chamber are located in the back portion of said semiconductor device testing apparatus while said loader section and said unloader section are located in front of said soak chamber, said testing section, and said heat/cold removal chamber.

73. The method of claim 71, wherein there are two of said test tray transport paths for transporting test trays.

74. The method of claim 71, wherein a plurality of test trays may be arranged in said soak chamber with some spacing between each pair of adjacent test trays, further wherein a plurality of test trays may be arranged in said heat/cold removal chamber with some spacing between each pair of adjacent test trays.

75. A method of operating a semiconductor device testing apparatus comprising a loader section, a soak chamber, a testing section, a heat/cold removal chamber, and an unloader section, wherein the method comprises:

in said loader section, loading semiconductor devices onto test trays;

in said soak chamber, applying a temperature stress of a predetermined temperature to semiconductor devices loaded on said test trays;

in said testing section, testing the semiconductor devices loaded on the test trays;

in said heat/cold removal chamber, removing heat or cold from semiconductor devices having undergone a test in said testing section;

in said unloader section, unloading tested semiconductor devices loaded on the test trays transported from said testing section; and transporting the test trays from said loader section through said soak chamber, said testing section, said heat/cold removal chamber and said unloader section back to said loader section, wherein the transporting transports simultaneously a plurality of test trays, juxtaposed in a direction transverse to said test tray transport path, in said testing section.

76. The method of claim 75, wherein said soak chamber, said testing section, and said heat/cold removal chamber are located in the back portion of said semiconductor device testing apparatus while said loader section and said unloader section are located in front of said soak chamber, said testing section, and said heat/cold removal chamber.

77. The method of claim 75, wherein a plurality of test trays may be arranged in said soak chamber with some spacing between each pair of adjacent test trays, further wherein a plurality of test trays may be arranged in said heat/cold removal chamber with some spacing between each pair of adjacent test trays.

78. The method of claim 75, wherein said plurality of test trays juxtaposed in a direction transverse to said test tray transport path are in engagement with each other.

79. The method of claim 75, wherein said plurality of test trays juxtaposed in a direction transverse to said test tray transport path are two and in engagement with each other.

80. A method of operating a semiconductor device testing apparatus comprising a loader section, a soak chamber, a testing section, a heat/cold removal chamber, and an unloader section, wherein the method comprises:

in said loader section, loading semiconductor devices onto test trays;

in said soak chamber comprising a soak chamber exit, applying a temperature stress of a predetermined temperature to semiconductor devices loaded on said test trays;

in said testing section, testing the semiconductor devices loaded on the test trays;

in said heat/cold removal chamber comprising a heat/cold removal chamber entrance, removing heat or cold from semiconductor devices having undergone a test in said testing section;

in said unloader section, unloading tested semiconductor devices loaded on the test trays transported from said testing section; and transporting the test trays from said loader section through said soak chamber, said testing section, said heat/cold chamber and said unloader section back to said loader section, wherein the transporting transports simultaneously a plurality of test trays, juxtaposed in a direction transverse to said test tray transport path, from a point after said soak chamber exit to a point before said heat/cold removal chamber entrance.

81. The method of claim 80, wherein said soak chamber, said testing section, and said heat/cold removal chamber are located in the back portion of said semiconductor device testing apparatus while said loader section and said unloader section are located in front of said soak chamber, said testing section, and said heat/cold removal chamber.

82. The method of claim 80, wherein a plurality of test trays may be arranged in said soak chamber with some spacing between each pair of adjacent test trays, further wherein a plurality of test trays may be arranged in said heat/cold removal chamber with some spacing between each pair of adjacent test trays.

83. The method of claim 80, wherein said plurality of test trays juxtaposed in a direction transverse to said test tray transport path are in engagement with each other.

84. The method of claim 80, wherein said plurality of test trays juxtaposed in a direction transverse to said test tray transport path are two and in engagement with each other.

85. A semiconductor device testing apparatus comprising:
a loader section that loads semiconductor devices onto test trays;
a soak chamber, wherein a temperature stress is applied to the semiconductor devices loaded on the test trays transported from said loader section, said soak chamber comprising a soak chamber exit;
a testing section that tests the semiconductor devices loaded on the test trays transported from said soak chamber, said testing section comprising test positions, said test positions comprising test position entrances;
a heat/cold removal chamber, wherein heat or cold is removed from tested semiconductor devices loaded on test trays transported from said testing section;
an unloader section that unloads tested semiconductor devices loaded on the test trays transported from said heat/cold removal chamber; and
transport mechanisms that transport the test trays from said loader section through said soak chamber, said testing section, said heat/cold removal chamber and said unloader section back to said loader section, wherein the transport mechanisms provide test tray transport paths to transport substantially simultaneously a plurality of test trays in a generally parallel manner from a point after said soak chamber exit to a point before said test position entrances.

86. A semiconductor device testing apparatus comprising:
a loader section that loads semiconductor devices onto test trays;
a soak chamber, wherein a temperature stress is applied to the semiconductor devices loaded on the test trays transported from said loader section;
a testing section that tests the semiconductor devices loaded on the test trays transported from said soak chamber, said testing section comprising test positions, said test positions comprising test position exits;
a heat/cold removal chamber, wherein heat or cold is removed from tested semiconductor devices loaded on test trays transported from said testing section, said heat/cold removal chamber comprising a heat/cold removal chamber entrance;
an unloader section that unloads tested semiconductor devices loaded on the test trays transported from said heat/cold removal chamber; and
transport mechanisms that transport the test trays from said loader section through said soak chamber, said testing section, said heat/cold removal chamber and said unloader section back to said loader section, wherein the transport mechanisms provide test tray transport paths to transport substantially simultaneously a plurality of test trays in a generally parallel manner from a point after said test position exits to a point before said heat/cold removal chamber entrance.

* * * * *